(12) United States Patent
Heikman et al.

(10) Patent No.: US 12,374,854 B2
(45) Date of Patent: Jul. 29, 2025

(54) LASER-BASED INTEGRATED LIGHT SOURCE

(71) Applicant: KYOCERA SLD Laser, Inc., Goleta, CA (US)

(72) Inventors: Sten Heikman, Goleta, CA (US); Terry Towe, Goleta, CA (US); Sudeep Khanal, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 115 days.

(21) Appl. No.: 18/129,615

(22) Filed: Mar. 31, 2023

(65) Prior Publication Data

US 2023/0238767 A1 Jul. 27, 2023

Related U.S. Application Data

(63) Continuation-in-part of application No. 17/445,938, filed on Aug. 25, 2021, which is a
(Continued)

(51) Int. Cl.
*H01S 5/00* (2006.01)
*H01S 5/02224* (2021.01)
(Continued)

(52) U.S. Cl.
CPC ........ *H01S 5/0087* (2021.01); *H01S 5/02224* (2013.01); *H01S 5/02257* (2021.01);
(Continued)

(58) Field of Classification Search
CPC .............. H01S 5/0087; H01S 5/02224; H01S 5/02257; H01S 5/02325; H01S 5/02469;
(Continued)

(56) References Cited

U.S. PATENT DOCUMENTS

| | | | |
|---|---|---|---|
| 6,791,103 B2 | 9/2004 | Nakamura et al. | |
| 7,667,238 B2 | 2/2010 | Erchak et al. | |

(Continued)

FOREIGN PATENT DOCUMENTS

| | | |
|---|---|---|
| CN | 108139054 | 6/2018 |
| CN | 217178318 U | 8/2022 |

(Continued)

OTHER PUBLICATIONS

U.S. Appl. No. 17/103,587 Non-Final Office Action mailed Aug. 14, 2023, 23 pages.
(Continued)

*Primary Examiner* — Eric T Eide
(74) *Attorney, Agent, or Firm* — Kilpatrick Townsend & Stockton LLP

(57) ABSTRACT

A laser-based light source includes a material arranged on a package base adjacent to a laser diode chip and an optical element coupled to the material. The optical element is aligned to receive electromagnetic radiation from the laser diode chip. The optical element includes a wavelength conversion material and is configured to receive at least a portion of the electromagnetic radiation emitted by the laser diode chip. A reflective material surrounds sides of the optical element.

24 Claims, 78 Drawing Sheets

Related U.S. Application Data continuation-in-part of application No. 17/163,903, filed on Feb. 1, 2021, now abandoned, which is a continuation of application No. 14/829,927, filed on Aug. 19, 2015, now Pat. No. 10,938,182.

(51) Int. Cl.

| | |
|---|---|
| *H01S 5/02257* | (2021.01) |
| *H01S 5/02325* | (2021.01) |
| *H01S 5/024* | (2006.01) |
| *H01S 5/22* | (2006.01) |
| *H01S 5/32* | (2006.01) |
| *H01S 5/343* | (2006.01) |
| *F21V 29/70* | (2015.01) |
| *F21Y 115/30* | (2016.01) |
| *H01S 5/02* | (2006.01) |
| *H01S 5/0222* | (2021.01) |

(52) U.S. Cl.
CPC ...... *H01S 5/02325* (2021.01); *H01S 5/02469* (2013.01); *H01S 5/02476* (2013.01); *H01S 5/2201* (2013.01); *H01S 5/32* (2013.01); *H01S 5/3203* (2013.01); *H01S 5/34333* (2013.01); *F21V 29/70* (2015.01); *F21Y 2115/30* (2016.08); *H01S 5/0216* (2013.01); *H01S 5/0217* (2013.01); *H01S 5/0222* (2013.01)

(58) Field of Classification Search
CPC ...... H01S 5/02476; H01S 5/2201; H01S 5/32; H01S 5/3203; H01S 5/34333; H01S 5/0216; H01S 5/0217; H01S 5/0222; H01S 5/02438; H01S 5/02326; H01S 5/0202; H01S 5/02253; H01S 5/02315; H01S 5/02345; H01S 5/320275; H01S 5/4056; H01S 5/02208; H01S 5/02255; F21V 29/70; F21Y 2115/30

See application file for complete search history.

(56) References Cited

U.S. PATENT DOCUMENTS

| | | | | |
|---|---|---|---|---|
| 8,106,414 | B2* | 1/2012 | Sugiyama | H01L 33/483 |
| | | | | 257/E33.07 |
| 9,025,635 | B2 | 5/2015 | Goutain et al. | |
| 9,318,875 | B1 | 4/2016 | Goutain | |
| 9,595,813 | B2 | 3/2017 | Raring et al. | |
| 10,079,470 | B2 | 9/2018 | Kozuru et al. | |
| 10,879,673 | B2 | 12/2020 | Raring et al. | |
| 10,938,182 | B2 | 3/2021 | Raring et al. | |
| 11,437,774 | B2 | 9/2022 | Rudy et al. | |
| 11,437,775 | B2 | 9/2022 | Raring et al. | |
| 2003/0107316 | A1* | 6/2003 | Murakami | H01L 33/62 |
| | | | | 257/E33.072 |
| 2004/0105481 | A1 | 6/2004 | Ishida et al. | |
| 2004/0263074 | A1 | 12/2004 | Baroky et al. | |
| 2006/0018351 | A1 | 1/2006 | Matsubara et al. | |
| 2006/0139926 | A1 | 6/2006 | Morioka et al. | |
| 2006/0221021 | A1 | 10/2006 | Hajjar et al. | |
| 2007/0012940 | A1 | 1/2007 | Suh et al. | |
| 2007/0029571 | A1 | 2/2007 | Hanaoka et al. | |
| 2008/0054280 | A1 | 3/2008 | Reginelli et al. | |
| 2008/0089089 | A1 | 4/2008 | Hama et al. | |
| 2009/0003400 | A1 | 1/2009 | Nagahama et al. | |
| 2009/0103581 | A1 | 4/2009 | Bessho | |
| 2010/0246159 | A1 | 9/2010 | Wada | |
| 2010/0295438 | A1 | 11/2010 | Ott et al. | |
| 2012/0039072 | A1 | 2/2012 | Lell et al. | |
| 2012/0051377 | A1 | 3/2012 | Liang et al. | |
| 2013/0001627 | A1 | 1/2013 | Kinoshita et al. | |
| 2013/0176705 | A1 | 7/2013 | Ohta | |
| 2013/0207148 | A1 | 8/2013 | Kräuter et al. | |
| 2013/0208442 | A1 | 8/2013 | Reiherzer | |
| 2014/0168942 | A1 | 6/2014 | Kishimoto et al. | |
| 2014/0340918 | A1 | 11/2014 | Suckling et al. | |
| 2016/0268770 | A1 | 9/2016 | Tazawa et al. | |
| 2016/0290584 | A1 | 10/2016 | Nomura et al. | |
| 2017/0040768 | A1* | 2/2017 | Waclawik | H01S 5/4012 |
| 2017/0051883 | A1 | 2/2017 | Raring et al. | |
| 2017/0051884 | A1 | 2/2017 | Raring et al. | |
| 2018/0284334 | A1 | 10/2018 | Keating et al. | |
| 2021/0151956 | A1* | 5/2021 | Raring | H01S 5/3203 |
| 2021/0226410 | A1 | 7/2021 | Raring et al. | |
| 2022/0115839 | A1* | 4/2022 | Singer | H01S 5/423 |
| 2022/0231479 | A1 | 7/2022 | Raring et al. | |
| 2022/0320819 | A1 | 10/2022 | Rudy et al. | |
| 2022/0376462 | A1 | 11/2022 | Heikman | |

FOREIGN PATENT DOCUMENTS

| | | | | |
|---|---|---|---|---|
| CN | 218300556 | U | 1/2023 | |
| DE | 112005003083 | T5* | 10/2007 | H01L 33/486 |
| EP | 1 571 715 | A1 | 9/2005 | |
| EP | 2 672 178 | A2 | 12/2013 | |
| EP | 3 338 023 | | 6/2018 | |
| EP | 3 987 220 | A1 | 4/2022 | |
| JP | 2015-022954 | A | 2/2015 | |
| JP | 3237794 | | 5/2022 | |
| JP | 7082043 | | 5/2022 | |
| KR | 10-2521474 | B1 | 4/2023 | |
| WO | 2017/031446 | A1 | 2/2017 | |

OTHER PUBLICATIONS

U.S. Appl. No. 14/829,927 Notice of Allowance mailed Oct. 28, 2020, 16 pages.
U.S. Appl. No. 14/829,927 Non-Final Office Action mailed Sep. 26, 2017, 44 pages.
U.S. Appl. No. 14/829,927 Non-Final Office Action mailed May 12, 2020, 28 pages.
U.S. Appl. No. 14/829,927 Non-Final Office Action mailed Mar. 21, 2019, 26 pages.
U.S. Appl. No. 14/829,927 Final Office Action mailed Jul. 26, 2018, 39 pages.
U.S. Appl. No. 17/163,903 Non-Final Office Action mailed Sep. 27, 2023, 27 pages.
U.S. Appl. No. 17/163,903 Final Office Action mailed Apr. 23, 2024, 28 pages.
U.S. Appl. No. 17/163,903 Advisory Action mailed Jul. 23, 2024, 4 pages.
U.S. Appl. No. 17/698,976 Non-Final Office Action mailed Jun. 27, 2024, 21 pages.
U.S. Appl. No. 17/445,938 Non-Final Office Action mailed Jun. 27, 2024, 21 pages.
U.S. Appl. No. 17/445,938 Notice of Allowance mailed Dec. 20, 2024, 12 pages.
U.S. Appl. No. 18/737,845, Non-Final Office Action, Mailed On Apr. 29, 2025, 13 pages.

* cited by examiner

Figure 1: Schematic diagram of semipolar laser diode with the cavity aligned in the projection of c-direction with cleaved or etched mirrors Schematic diagram of ridge type laser diode fabricated on a semipolar substrate showing cavity architecture and mirrors.

Figure 2: Schematic diagram of c-plane laser diode with the cavity aligned in the projection of c-direction with cleaved or etched mirrors Schematic diagram of ridge type laser diode fabricated on a polar substrate showing cavity architecture and mirrors.

Figure 3: Schematic cross-section of conventional ridge laser diode

Schematic cross-section diagram of ridge type laser diode showing various features associated with the device.

Figure 4: Conventional chip on submount laser diode configuration

Figure 5: Epitaxy preparation process flow for epi transfer to carrier

Figure 6: Bond then etch process flow for epi layer transfer to carrier

Figure 7: Side view of die expansion with selective area bonding

Figure 8: Example of LD epitaxial structure according to the epitaxial transfer embodiment Figure 9: Example of LD device structure formed on carrier wafer from epitaxial structure in Figure 8

Figure 10: Laser device on integrated submount fabricated via wafer-level laser diode processing after transfer of gallium and nitrogen containing epitaxial layers

Figure 11: Laser

Figure 12: Laser

Figure 14: Integrated lens

Figure 15: Tilted Phosphor

Figure 16: Tilted Phosphor

Figure 17: Point source

Figure 18: Off Axis Reflective

Figure 19: Off Axis Reflective with Lens

Figure 20: Reflective in surface mount

Figure 21: Reflective in surface mount sealed

Figure 23: Heat sinking

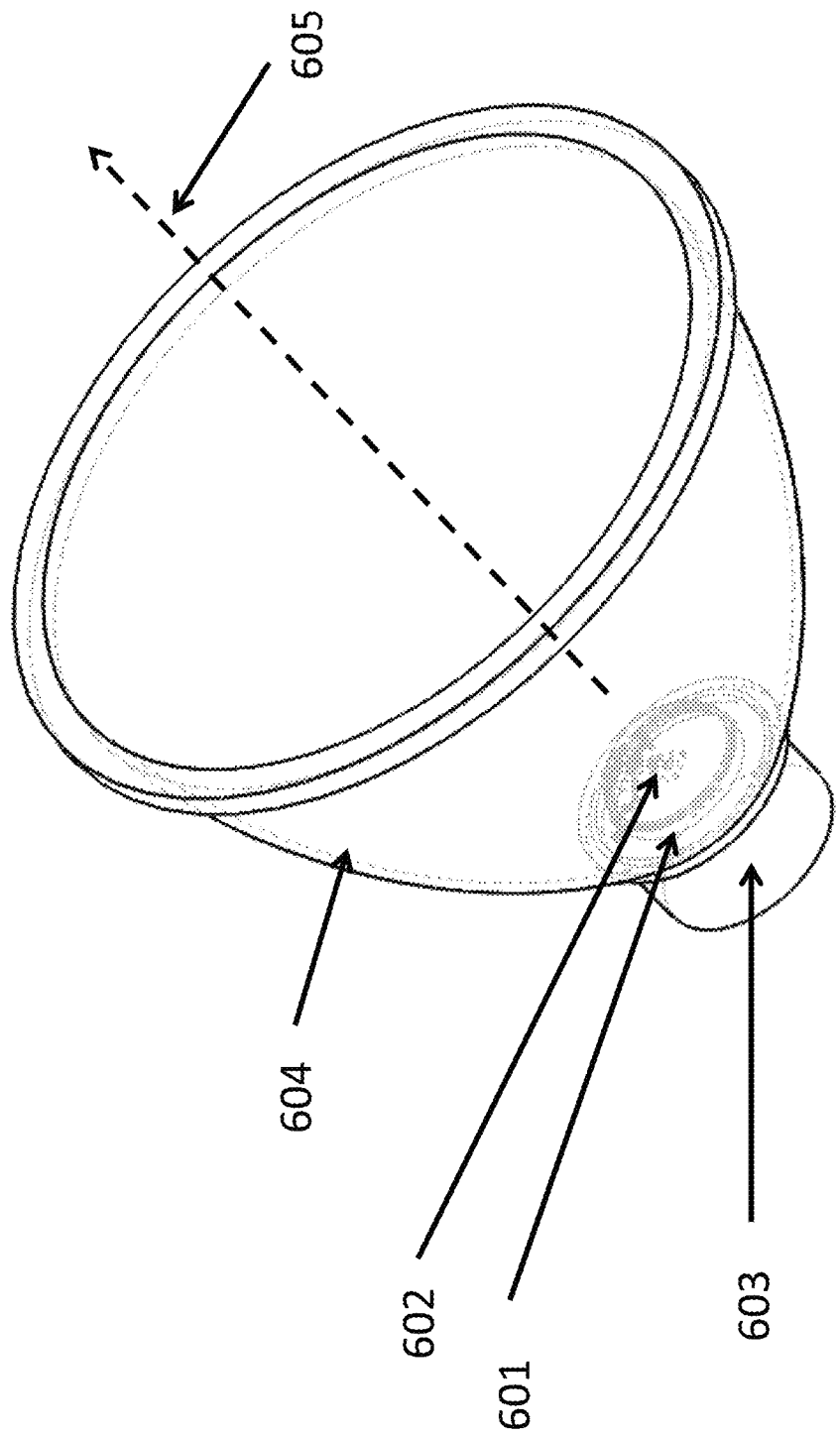
Figure 27: Sealed SMD + reflector

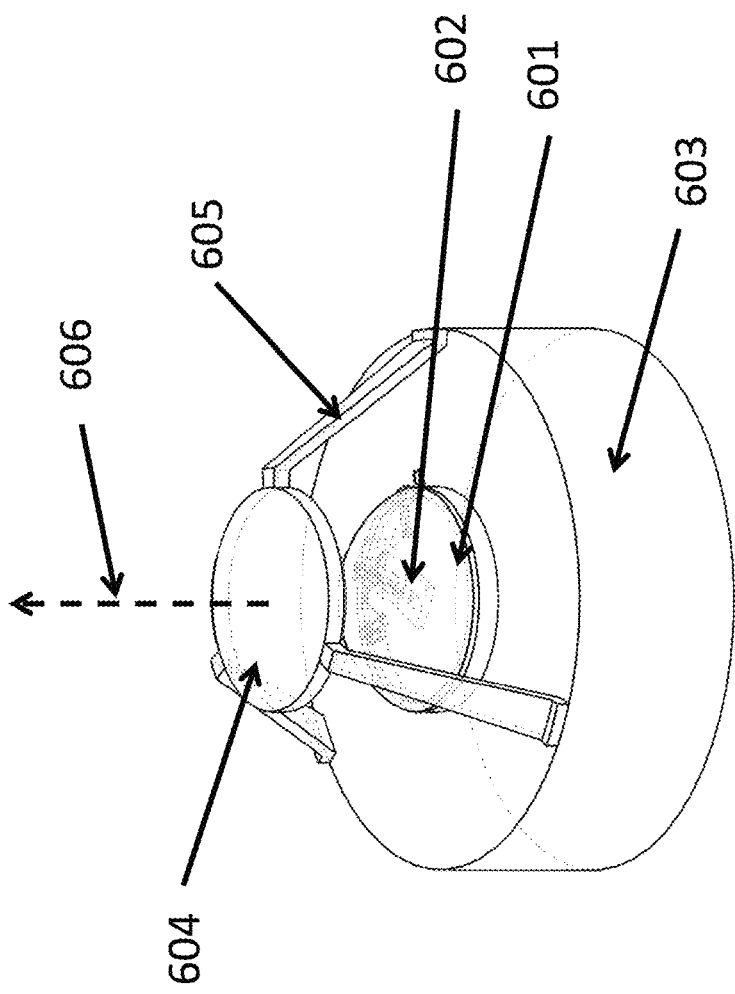
Figure 28: Sealed SMD + lens and reflector

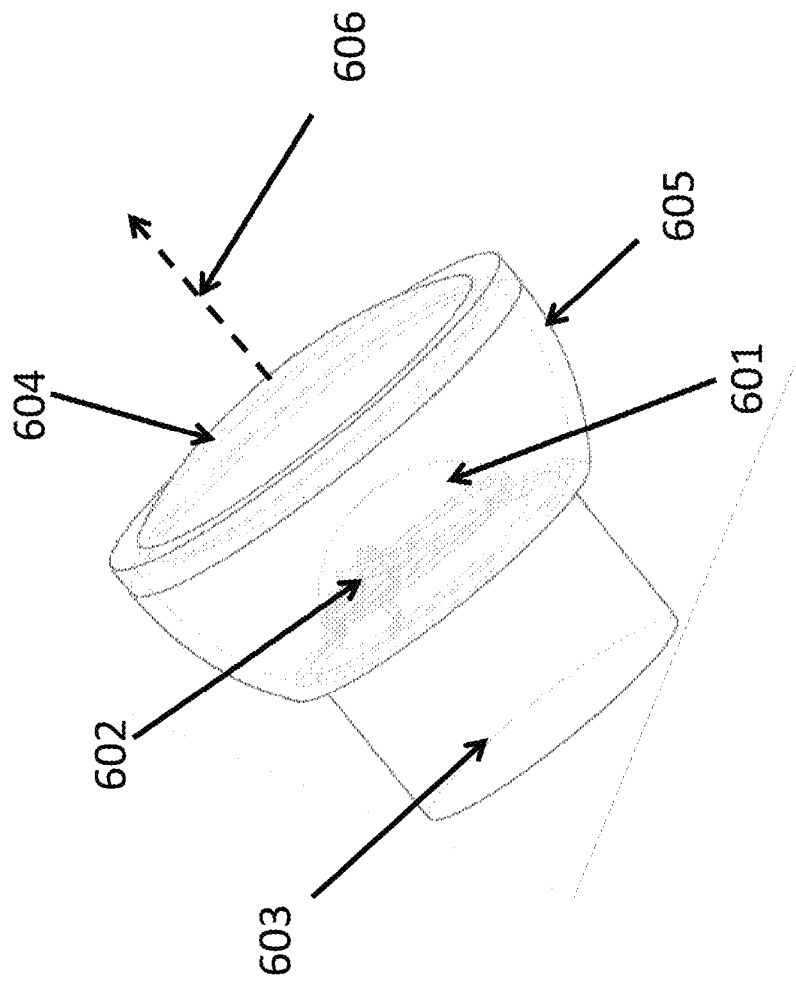
Figure 29: Sealed SMD + lens and reflector

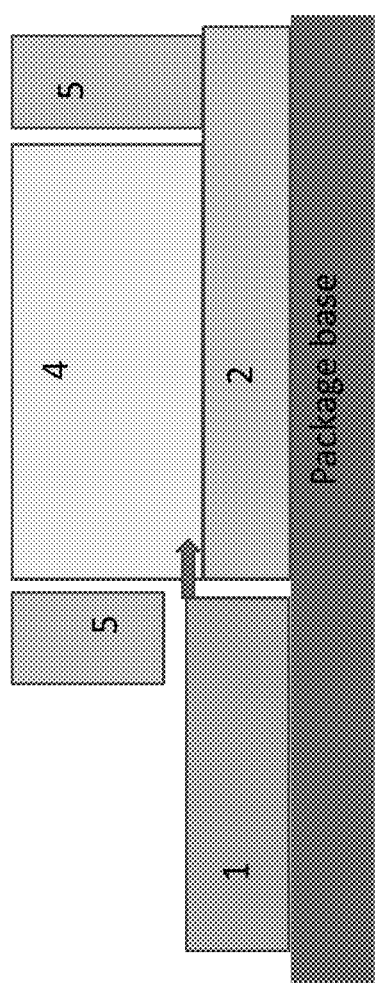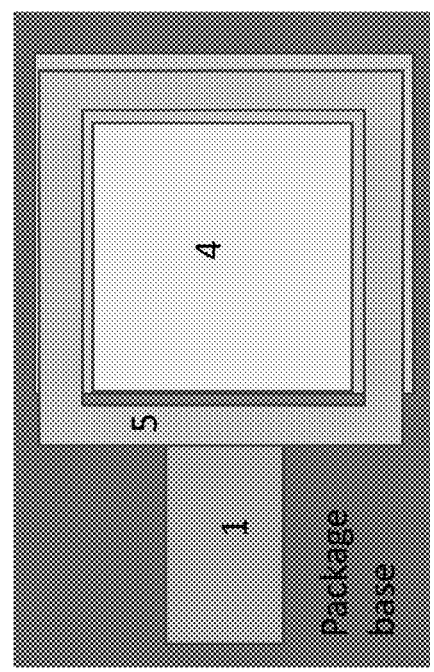

LASER-BASED INTEGRATED LIGHT SOURCE

CROSS-REFERENCE TO RELATED APPLICATIONS

The present application is a continuation-in-part of U.S. application Ser. No. 17/445,938, filed Aug. 25, 2021, which is a continuation-in-part of U.S. application Ser. No. 17/163,903, filed Feb. 1, 2021, which is a continuation of U.S. application Ser. No. 14/829,927, filed Aug. 19, 2015, the entire contents of which are incorporated herein by reference for all purposes.

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 uW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 uW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength-converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. Light-emitting diodes are now used in applications as diverse as aviation lighting, automotive headlamps, advertising, general lighting, traffic signals, and camera flashes. LEDs have allowed new text, video displays, and sensors to be developed, while their high switching rates are also useful in advanced communications technology.

Although useful, LEDs still have limitations that are desirable to overcome in accordance with the inventions described in the following disclosure.

SUMMARY

The present invention provides a device and method for an integrated white colored electromagnetic radiation source using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials, such as yellow phosphors, to form a compact, high-brightness, and highly-efficient, white light source. In an example, the source can be provided for specialized applications, among general applications, and the like.

In accordance with an embodiment, a phosphor integrated laser-based light source includes a package base; a laser diode chip coupled to the package base, the laser diode chip comprising a gallium and nitrogen containing material and configured to output a laser beam of electromagnetic radiation from an output facet; the laser diode chip configured to emit the electromagnetic radiation at a first wavelength; a thermally conductive material coupled to the package base and arranged on the package base adjacent to the laser diode chip, the thermally conductive material having a top surface with a reflective coating; an optically transparent material coupled to the top surface of the thermally conductive material, wherein a groove extends between a portion of the thermally conductive material and a portion of the optically transport material, the groove aligned with the laser diode chip to receive the electromagnetic radiation from the laser diode chip; a wavelength conversion material coupled to the optically transparent material and configured to receive at least a portion of the electromagnetic radiation emitted into the groove and transmitted through the optically transparent material, the wavelength conversion material configured to convert at least a fraction of the electromagnetic radiation in the laser beam with a first wavelength to a second wavelength that is longer than the first wavelength; and a reflective material surrounding sides of the optically transparent material and the wavelength conversion material, the reflective material configured to reflect portions of the electromagnetic radiation incident on the sides of the optically transparent material and the wavelength conversion material, wherein the wavelength conversion material is configured to emit a light from a top surface that includes a first portion having the first wavelength and a second portion having the second wavelength.

In an embodiment, the groove includes a portion having a polygon shape.

In another embodiment, the groove is formed in the top surface of the thermally conductive material and extends from a side surface of the thermally conductive material, the groove reflecting a least a portion of the electromagnetic radiation in an upward direction toward the optically transparent material.

In another embodiment, the thermally conductive material is silicon (Si) or silicon carbide (SiC).

In another embodiment, the groove is formed in a bottom surface of the optically transparent material and extends from a side surface of the optically transparent material.

In another embodiment, the optically transparent material is single crystalline silicon carbide, sapphire, diamond, or transparent crystals from a garnet or spinel group.

In another embodiment, the electromagnetic radiation is at a first wavelength ranging from between 400 nm to 485 nm.

In another embodiment, sides of the groove are covered with a reflective coating.

In another embodiment, the reflective material completely covers the sides of the optically transparent material and the wavelength conversion material.

In another embodiment, the light that is emitted from the top surface of the wavelength conversion material is a white light.

In another embodiment, the laser diode chip comprises a plurality of laser diode chips each coupled to the package base and aligned with a portion of the groove.

In yet another embodiment, a surface mount device (SMD) comprising the phosphor integrated laser-based light source.

In accordance with another embodiment, a phosphor integrated laser-based light source includes a package base; a laser diode chip coupled to the package base, the laser diode chip comprising a gallium and nitrogen containing material and configured to output a laser beam of electromagnetic radiation from an output facet; the laser diode chip configured to emit the electromagnetic radiation at a first wavelength; a thermally conductive material coupled to the package base and arranged on the package base adjacent to the laser diode chip, the thermally conductive material having a reflective top surface; an optically transparent material coupled to the top surface of the thermally conductive material, wherein a groove extends along a bottom of the optically transparent material; a light guide aligned with the output facet of the laser diode chip on one end and aligned with the groove on another end; the light guide configured and arranged to guide the electromagnetic radiation from the laser diode chip to the groove in the optically transparent material; a wavelength conversion material coupled to the optically transparent material and configured to receive at least a portion of the electromagnetic radiation emitted into the groove and transmitted through the optically transparent material, the wavelength conversion material being configured to convert at least a fraction of the electromagnetic radiation in the laser beam with a first wavelength to a second wavelength that is longer than the first wavelength; and a reflective material surrounding sides of the optically transparent material and the wavelength conversion material, the reflective material configured to reflect portions of the electromagnetic radiation incident on the sides of the optically transparent material and the wavelength conversion material, wherein the wavelength conversion material is configured to emit a light from a top surface that includes a first portion having the first wavelength and a second portion having the second wavelength.

In an embodiment, the phosphor integrated laser-based light source also includes a second laser diode chip and a second light guide, wherein the light guide is aligned with a first end of the groove, and the second light guide is aligned with a second end of the groove, the second light guide configured and arranged to guide second electromagnetic radiation from the second laser diode chip to the groove in the optically transparent material.

In another embodiment, the light that is emitted from the top surface of the wavelength conversion material is a white light.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source.

In various embodiments, the laser device and phosphor device are mounted on a common support member with or without intermediate submounts and the phosphor materials are operated in a transmissive mode or a reflective mode to result in a white emitting laser-based light source. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, transformations, transportations, leveling, curing and other chemical treatments, heating, cutting and/or ablating, pumping other optical devices, other optoelectronic devices and related applications, and source lighting and the like.

In accordance with an embodiment, a laser-based light source includes a package base; a laser diode chip coupled to the package base, the laser diode chip configured to output a laser beam of electromagnetic radiation from an output facet; the laser diode chip configured to emit the electromagnetic radiation at a first wavelength; a material coupled to the package base and arranged on the package base adjacent to the laser diode chip, the material having a reflective surface; an optical element coupled directly to a top surface of the material, wherein a groove extends between a portion of the material and a portion of the optical element, the groove aligned with the laser diode chip to receive the electromagnetic radiation from the laser diode chip and the material configured to direct at least a portion of the electromagnetic radiation in the groove into the optical element, the optical element including a wavelength conversion material configured to convert at least a fraction of the electromagnetic radiation in the laser beam with a first wavelength to a second wavelength that is longer than the first wavelength; and a reflective material surrounding sides of the optical element, the reflective material configured to reflect portions of the electromagnetic radiation incident on the sides of the optical element, wherein the optical element is configured to emit a light from a top surface, the light including a first portion having the first wavelength and a second portion having the second wavelength.

In an embodiment, the laser-based light source also includes one or more additional laser diode chips and one or more additional grooves, each of the one or more additional laser diode chips aligned with one of the additional grooves, wherein the one or more additional laser diode chips are configured to emit electromagnetic radiation at the first wavelength.

In another embodiment, the laser-based light source also includes one or more additional laser diode chips and one or more additional grooves, each of the one or more additional laser diode chips aligned with one of the additional grooves, wherein at least one of the one or more additional laser diode chips is configured to emit electromagnetic radiation at a second wavelength different from the first wavelength.

In another embodiment, the groove is formed in a top of the material and extends from a side surface of the material, the groove reflecting a least a portion of the electromagnetic radiation in an upward direction toward the optical element.

In another embodiment, the material is thermally conductive and includes silicon (Si), silicon carbide (SiC), germanium (Ge), gallium arsenide (GaAs), sapphire, ceramic aluminum nitride (AlN), ceramic aluminum oxide ($Al_2O_3$), ceramic boron nitride (BN), aluminum (Al), or copper (Cu), and the reflective surface includes a reflective coating on the material.

In another embodiment, the wavelength conversion material is dispersed throughout the optical element.

In another embodiment, an upper portion of the optical element includes an optical homogenizer configured to improve color uniformity of the light emitted from the top surface of the optical element.

In another embodiment, at least one of sides, a top, or a bottom of the groove are covered with a reflective coating.

In another embodiment, a gap extends between at least some sides of the optical element and the reflective material.

In another embodiment, the laser-based light source also includes a scattering material in the groove, the scattering material in the groove configured to scatter at least a portion of the electromagnetic radiation from the laser diode chip into the optical element.

In another embodiment, the groove includes sidewalls having flat planes or sidewalls having curved sections.

In another embodiment, the reflective material includes a reflective coating on inside walls of the reflective material.

In yet another embodiment, the optical element includes at least one of scattering features, diffractive features, or photonic crystal structures configured to provide color uniformity of the light emitted from the top surface of the optical element.

In accordance with another embodiment, a surface mount device (SMD) comprising a laser-based light source as described herein.

In accordance with yet another embodiment, a laser-based light source includes a package base; a laser diode chip coupled to the package base, the laser diode chip configured to output a laser beam of electromagnetic radiation from an output facet; the laser diode chip configured to emit the electromagnetic radiation at a first wavelength; a material coupled to the package base and arranged on the package base adjacent to the laser diode chip, the material having a reflective surface; an optical element coupled directly to a top surface of the material; a light guide aligned with the output facet of the laser diode chip on one end and aligned with the optical element on another end, the light guide configured and arranged to guide at least a portion of the electromagnetic radiation from the laser diode chip to the optical element, wherein the optical element includes a wavelength conversion material and is configured to receive at least a portion of the electromagnetic radiation emitted into the optical element, the wavelength conversion material being configured to convert at least a fraction of the electromagnetic radiation in the laser beam with a first wavelength to a second wavelength that is longer than the first wavelength; and a reflective material surrounding sides of the optical element, the reflective material configured to reflect portions of the electromagnetic radiation incident on the sides of the optical element, wherein the optical element is configured to emit a light from a top surface, the light including a first portion having the first wavelength and a second portion having the second wavelength.

In an embodiment, the laser-based light source also includes a groove extending between a portion of the material and a portion of the optical element, a second laser diode chip and a second light guide, wherein the light guide is aligned with a first end of the groove, and the second light guide is aligned with a second end of the groove, the second light guide configured and arranged to guide second electromagnetic radiation from the second laser diode chip to the groove in the optically transparent material.

In another embodiment, the laser-based light source also includes a groove extending between a portion of the material and a portion of the optical element and a scattering material in the groove, the scattering material in the groove configured scatter the electromagnetic radiation from the laser diode chip into the optical element.

A further understanding of the nature and advantages of the present invention may be realized by reference to the latter portions of the specification and attached drawings.

BRIEF DESCRIPTION OF THE DRAWINGS

FIG. 27 is a simplified diagram illustrating a reflective mode phosphor integrated laser-based white light source mounted in a surface mount type package mounted on a heat sink with a collimating reflector according to an embodiment of the present invention.

FIG. 28 is a simplified diagram illustrating a reflective mode phosphor integrated laser-based white light source mounted in a surface mount type package mounted on a heat sink with a collimating lens according to an embodiment of the present invention.

FIG. 29 is a simplified diagram illustrating a reflective mode phosphor integrated laser-based white light source mounted in a surface mount type package mounted on a heat sink with a collimating lens and reflector member according to an embodiment of the present invention.

FIGS. 57A-57B are simplified cross-sectional and plan views of a laser-based light source according to some embodiments of the present invention.

DETAILED DESCRIPTION

Figure 1:
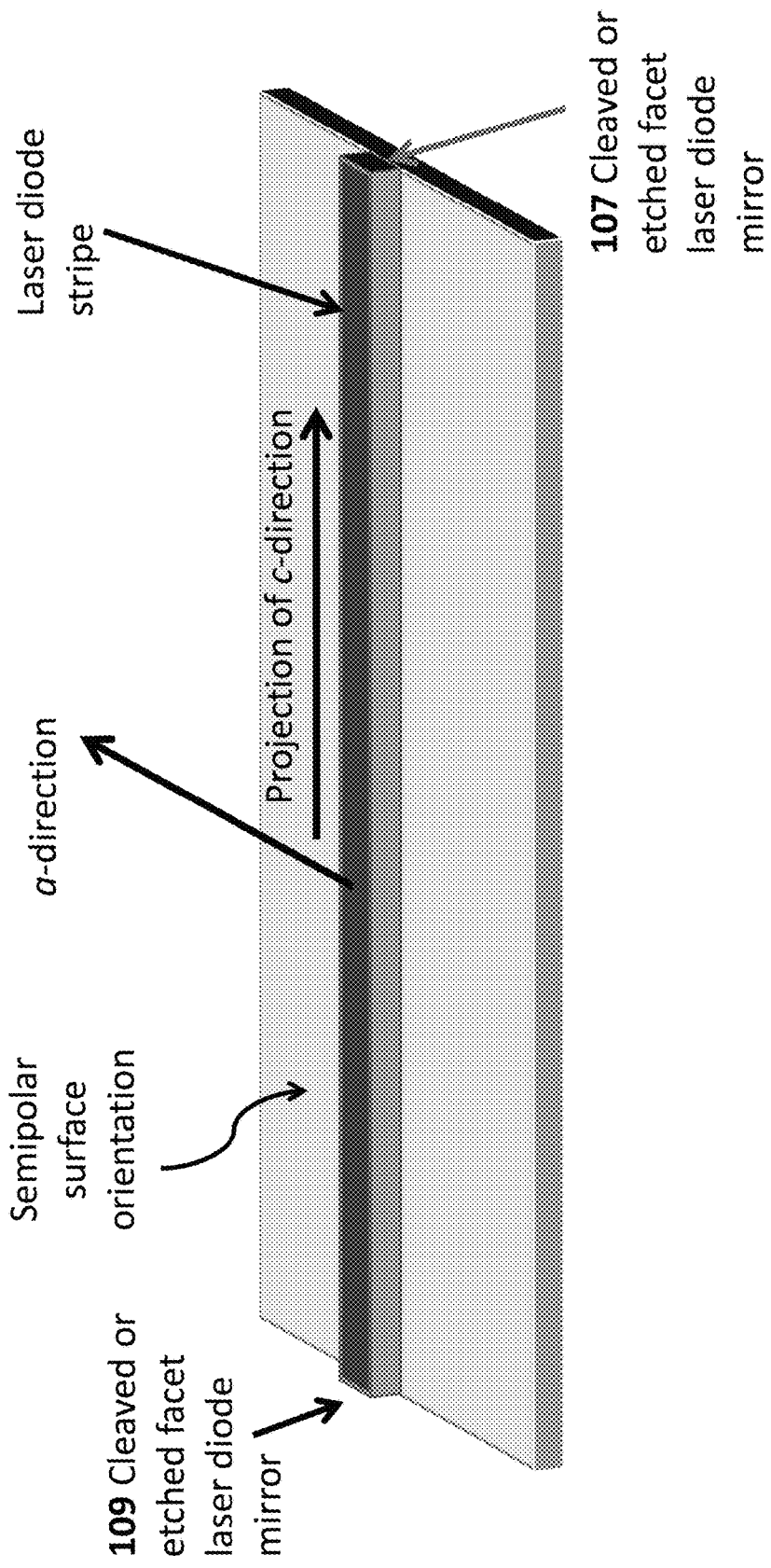
FIG. 1 is a simplified diagram illustrating a laser diode device configured on a semipolar substrate according to the present invention.

The present invention provides a method and device for emitting white colored electromagnetic radiation using a combination of laser diode excitation sources based on gallium and nitrogen containing materials and light emitting source based on phosphor materials. In this invention a violet, blue, or other wavelength laser diode source based on gallium and nitrogen materials is closely integrated with phosphor materials to form a compact, high-brightness, and highly-efficient, white light source.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source.

In various embodiments, the laser device and phosphor device are mounted on a common support member with or without intermediate submounts and the phosphor materials are operated in a transmissive mode or a reflective mode to result in a white emitting laser-based light source. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 microns in diameter, less than 100 microns in diameter, or even less than 50 microns in diameter, power densities of over 1 W/mm$^2$, 100 W/mm$^2$, or even over 2,500 W/mm$^2$ can be achieved. When this very small and powerful beam of laser excitation light is incident on a phosphor material a the ultimate point source of white light can be achieved. Assuming a phosphor conversion ratio of 200 lumens of emitted white light per optical watt of excitation light, a 5 W excitation power could generate 1000 lumens in a beam diameter of 100 microns, or 50 microns, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In one embodiment, the present invention provides a CPoS laser-based white light source comprising a form factor characterized by a length, a width, and a height. In an example, the height is characterized by a dimension of less than 25 mm, and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations. The apparatus has a support member and at least one gallium and nitrogen containing laser diode devices and phosphor material overlying the support member. The laser device is capable of an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k 1) plane wherein h=k=0, and 1 is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

The laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane.

FIG. 1 is a simplified schematic diagram of an example of a polar c-plane laser diode formed on a gallium and nitrogen containing substrate with the cavity aligned in the m-direction with cleaved or etched mirrors. The laser stripe region is characterized by a cavity orientation substantially in an m-direction, which is substantially normal to an a-direction, but can be others such as cavity alignment substantially in the a-direction. The laser strip region has a first end 107 and a second end 109 and is formed on an m-direction on a {0001} gallium and nitrogen containing substrate having a pair of cleaved or etched mirror structures, which face each other. For example, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface.

Figure 2:
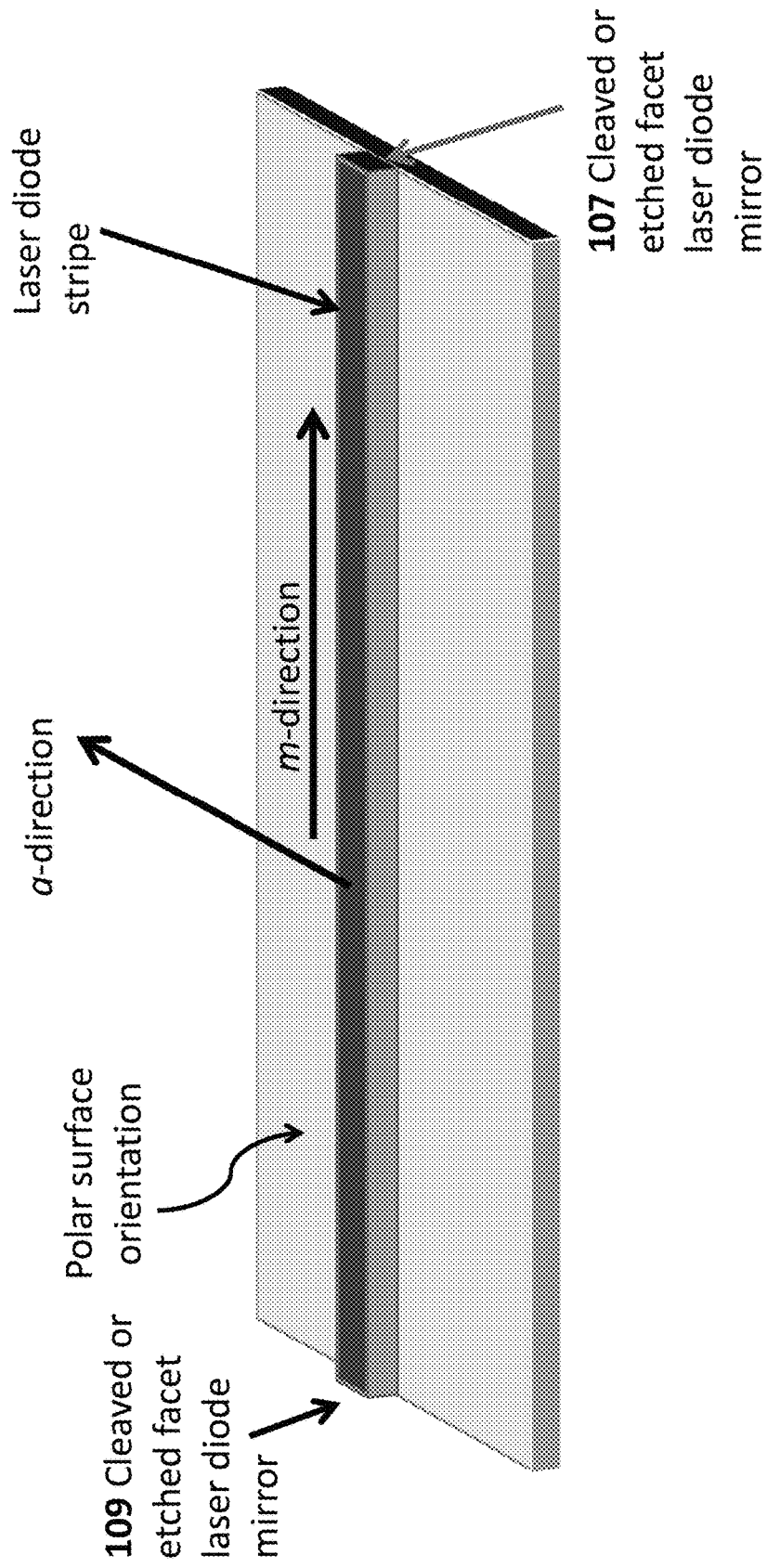
FIG. 2 is a simplified diagram illustrating a laser diode device configured on a polar c-plane substrate according to the present invention.

FIG. 2 is a simplified schematic diagram of an example of a semipolar plane laser diode formed on a gallium and nitrogen containing substrate with the cavity aligned in a projection of a c-direction with cleaved or etched mirrors. The laser stripe region is characterized by a cavity orientation substantially in a projection of a c-direction, which is substantially normal to an a-direction, but can be others such as cavity alignment substantially in the a-direction. The laser strip region has a first end 107 and a second end 109 and is formed on an semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. For example, the gallium and nitrogen containing substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface.

The example laser diode devices in FIGS. 1 and 2 have a pair of cleaved or etched mirror structures, which face each other. The first cleaved or etched facet comprises a reflective coating and the second cleaved or etched facet comprises no coating, an antireflective coating, or exposes gallium and nitrogen containing material. The first cleaved or etched facet is substantially parallel with the second cleaved or etched facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 50 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 50 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

In certain embodiments, GaN surface orientation is substantially in the c-plane, m-plane, {40-41}, {30-31}, {20-21}, {40-4-1}, {30-3-1}, {20-2-1} {20-21} orientation, and the device has a laser stripe region formed overlying a portion of the off-cut crystalline orientation surface region. For example, the laser stripe region is characterized by a cavity orientation substantially in a projection of a c-direction, which is substantially normal to an a-direction. In a specific embodiment, the laser strip region has a first end 107 and a second end 109. In a preferred embodiment wherein the laser is formed on a semipolar orientation, the device is formed on a projection of a c-direction on a gallium and nitrogen containing substrate having a pair of cleaved mirror structures, which face each other.

In a preferred embodiment, the device has a first cleaved facet provided on the first end of the laser stripe region and a second cleaved facet provided on the second end of the laser stripe region. In one or more embodiments, the first cleaved is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. The first mirror surface can also have an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface has an anti-reflective coating.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with one or more of the following epitaxially grown elements:

an n-GaN or n-AlGaN cladding layer with a thickness from 100 nm to 3000 nm with Si doping level of 5E17 $cm^{-3}$ to 3E18 $cm^{-3}$;

an n-side SCH layer comprised of InGaN with molar fraction of indium of between 2% and 10% and thickness from 20 nm to 250 nm;

multiple quantum well active region layers comprised of at least two 2.0 nm to 8.5 nm InGaN quantum wells separated by 1.5 nm and greater, and optionally up to about 12 nm, GaN or InGaN barriers;

a p-side SCH layer comprised of InGaN with molar a fraction of indium of between 1% and 10% and a thickness from 15 nm to 250 nm or an upper GaN-guide layer;

an electron blocking layer comprised of AlGaN with molar fraction of aluminum of between 0% and 22% and thickness from 5 nm to 20 nm and doped with Mg;

a p-GaN or p-AlGaN cladding layer with a thickness from 400 nm to 1500 nm with Mg doping level of 2E17 $cm^{-3}$ to 2E19 cm–3; and a p++-GaN contact layer with a thickness from 20 nm to 40 nm with Mg doping level of 1E19 $cm^{-3}$ to 1E21 $cm^{-3}$.

Figure 3:
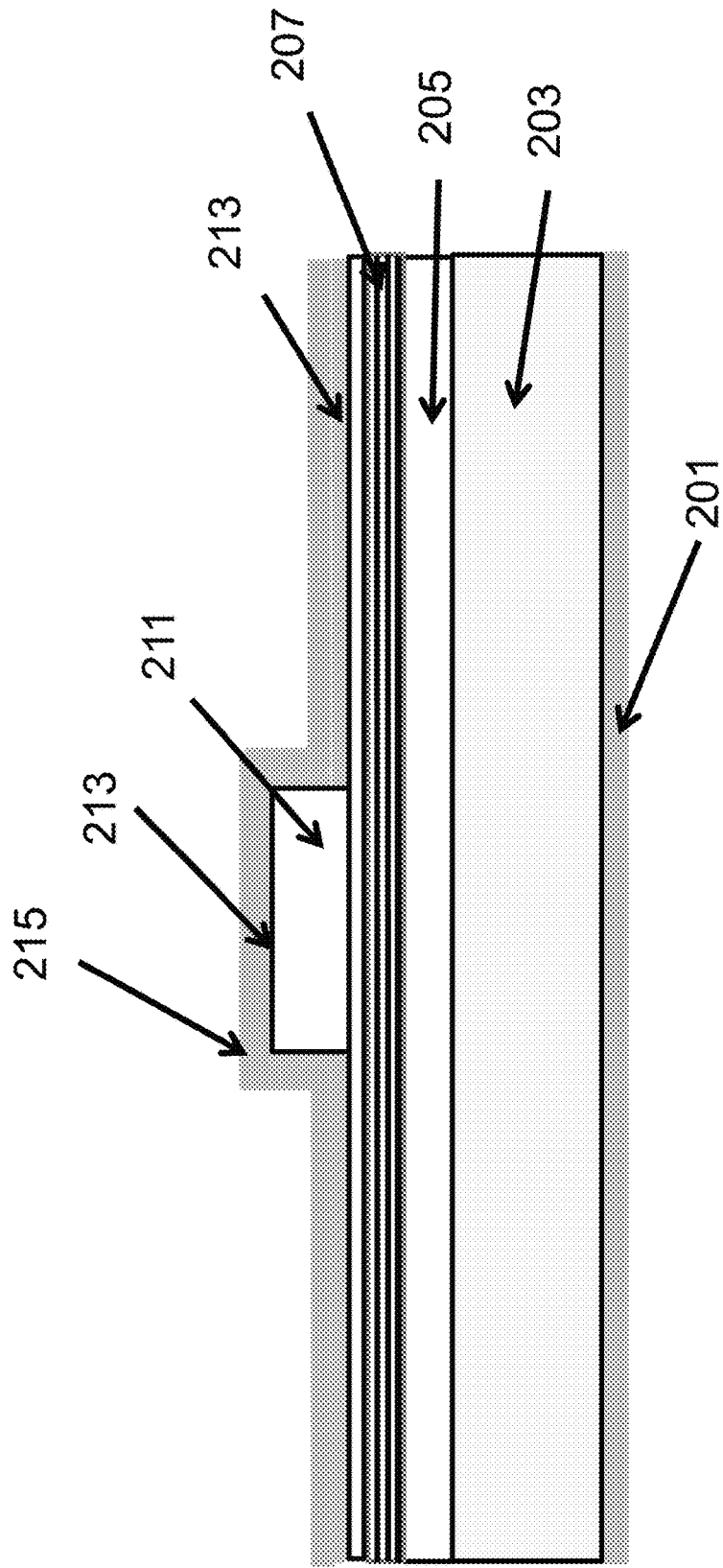
FIG. 3 is a simplified schematic cross-section of conventional ridge laser diode-plane substrate according to the present invention.

FIG. 3 is a cross-sectional view of a laser device 200. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

An n-type $Al_u In_v Ga_{1-u-v}N$ layer, where 0≤u, v, u+v≤1, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes 213 contact region. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof.

Active region 207 preferably includes one to ten quantum well regions or a double heterostructure region for light emission. Following deposition of the n-type $Al_u In_v Ga_{1-u-v}N$ layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_w In_x Ga_{1-w-x}N$ and $Al_y In_z Ga_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_s In_t Ga_{1-s-t}N$, where 0≤s, t, s+t≤1, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes 213 contact region.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIGS. 1 and 2 and described above are typically suitable for relative low-power applications.

In various embodiments, the present invention realizes high output power from a diode laser is by widening one or more portions of the laser cavity member from the single lateral mode regime of 1.0-3.0 μm to the multi-lateral mode range 5.0-20 μm. In some cases, laser diodes having cavities at a width of 50 μm or greater are employed.

The laser stripe length, or cavity length ranges from 100 to 3000 μm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

FIG. 3 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 um to about 3 microns or to about 5 microns and may be doped with an n-type carriers such as Si or O to concentrations between 1E16 cm3 to 1E19 cm3. Overlying the n-type layers is the active region and waveguide layers 207. This region could contain an n-side waveguide layer or separate confinement hetereostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double hetereostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 um to about 2 microns and is doped with Mg to a concentration of between 1E16 cm3 to 1E19 cm3. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing one or more of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing one or more of Au, Al, Pd, Pt, Ni, Ti, or Ag and may be deposited with electron beam deposition, sputter deposition, or thermal evaporation.

After the laser diode chip fabrication as described above, the laser diode can be mounted to a submount. In some examples the submount is comprised of AlN, SiC, BeO, diamond, or other materials such as metals, ceramics, or composites. The submount can be the common support member wherein the phosphor member of the CPoS would also be attached. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 um to about 2 mm. In the example wherein the submount is an intermediate submount between the laser diode chip and the common support member it could be characterized by width and length ranging in dimension from about 0.5 mm to about 5 mm and the thickness may range from about 50 um to about 500 um. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 4:
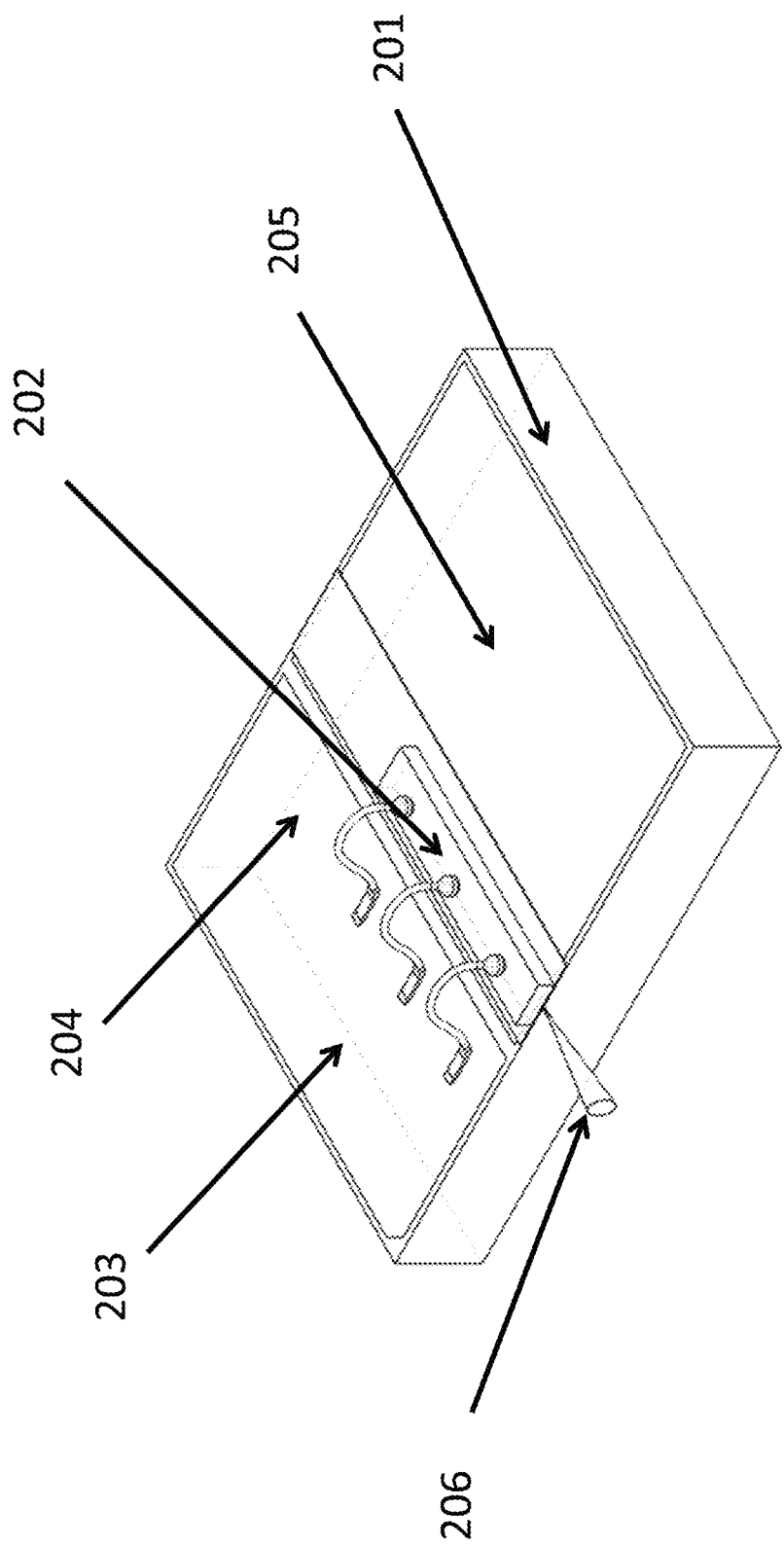
FIG. 4 is a simplified diagram illustrating a conventional laser diode chip on submount (CoS) according to the present invention.

A schematic diagram illustrating a CoS based on a conventional laser diode formed on gallium and nitrogen containing substrate technology according to this present invention is shown in FIG. 4. The CoS is comprised of submount material 201 configured to act as an intermediate material between a laser diode chip 202 and a final mounting surface. The submount is configured with electrodes 203 and 205 that may be formed with deposited metal layers such as Au. In one example, Ti/Pt/Au is used for the electrodes. Wirebonds 204 are configured to couple the electrical power from the electrodes 203 and 205 on the submount to the laser diode chip to generate a laser beam output 206 from the laser diode. The electrodes 203 and 205 are configured for an electrical connection to an external power source such as a laser driver, a current source, or a voltage source. Wirebonds can be formed on the electrodes to couple electrical power to the laser diode device and activate the laser.

In another embodiment, the gallium and nitrogen containing laser diode fabrication includes an epitaxial release step to lift off the epitaxially grown gallium and nitrogen layers and prepare them for transfer to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In yet another preferred variation of this CPoS white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, but can be other techniques such as SAC solders, lead containing solders, indium solders, or other attachment methods such as thermal adhesives. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In this embodiment, gallium and nitrogen containing epitaxial layers are grown on a bulk gallium and nitrogen containing substrate. The epitaxial layer stack comprises at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the one or more sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the one or more sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and HNO3 have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Figure 5:
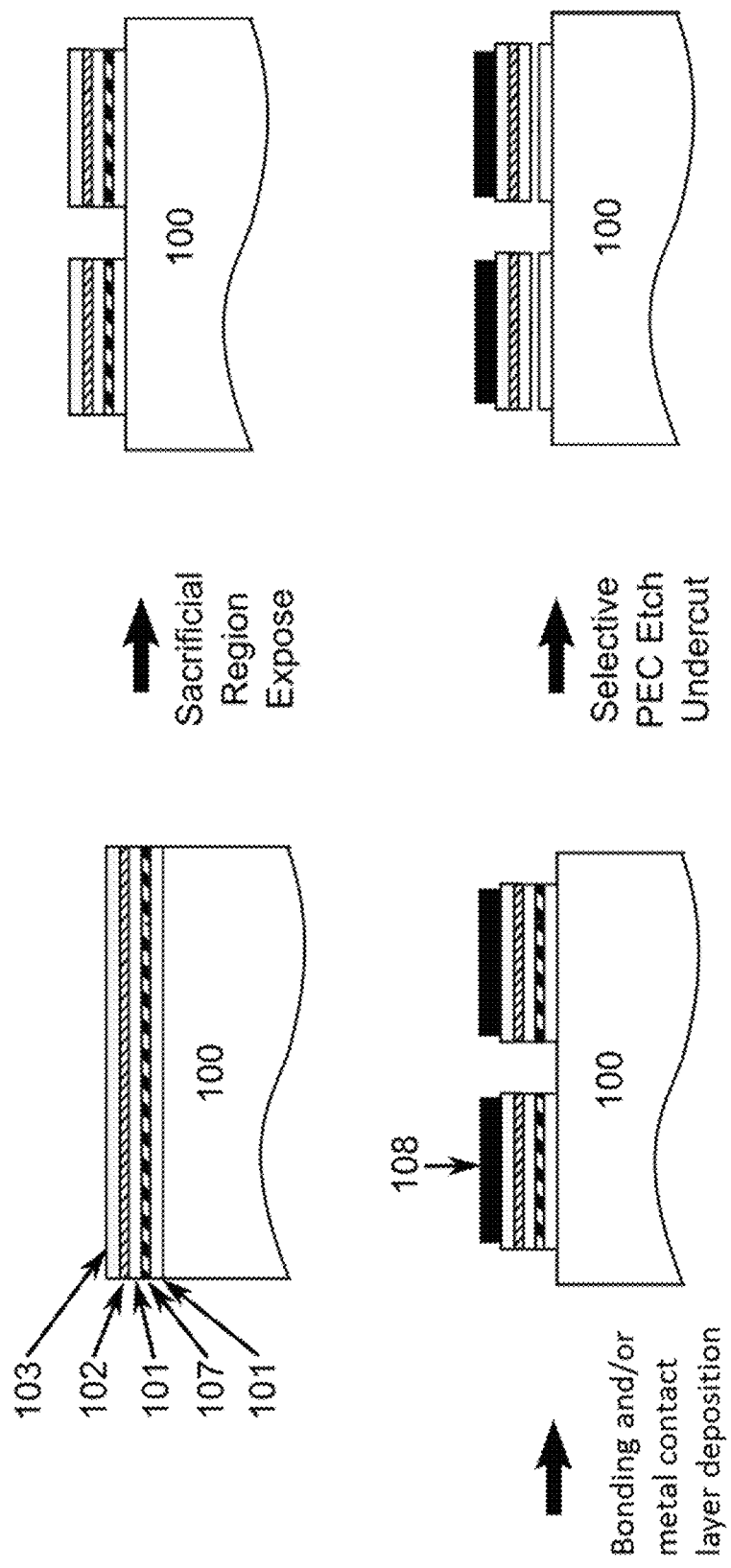
FIG. 5 is a simplified diagram illustrating epitaxy preparation process flow for epi transfer to a carrier wafer according to the present invention.

The preparation of the epitaxy wafer is shown in FIG. 5. A substrate 100 is overlaid by a buffer layer 101, a selectively removable sacrificial layer 107, an buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 5 is a top down etch to expose the sacrificial layers, followed by a bonding metal deposition as shown in FIG. 5. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall. The device layers are exposed using an etch and an etch resistant protect layer is deposited overlaying the edges of the device layers such that they are not exposed to the etch chemicals. The sacrificial layer is then exposed by an etch of vias. A bonding layer is deposited and a selective etch process is used to remove the sacrificial layers. In some embodiments the bonding layer is deposited after the selective etch. This work flow is advantageous when the device layers are susceptible to damage from the etch process used to remove the sacrificial layer. With the sacrificial region exposed a bandgap selective PEC etch is used to undercut the mesas. At this point, the selective area bonding process is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In some embodiments PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with one or more of acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, copper tungsten, gold, silver, aluminum, stainless steel, or steel.

In another embodiment, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

Figure 6:
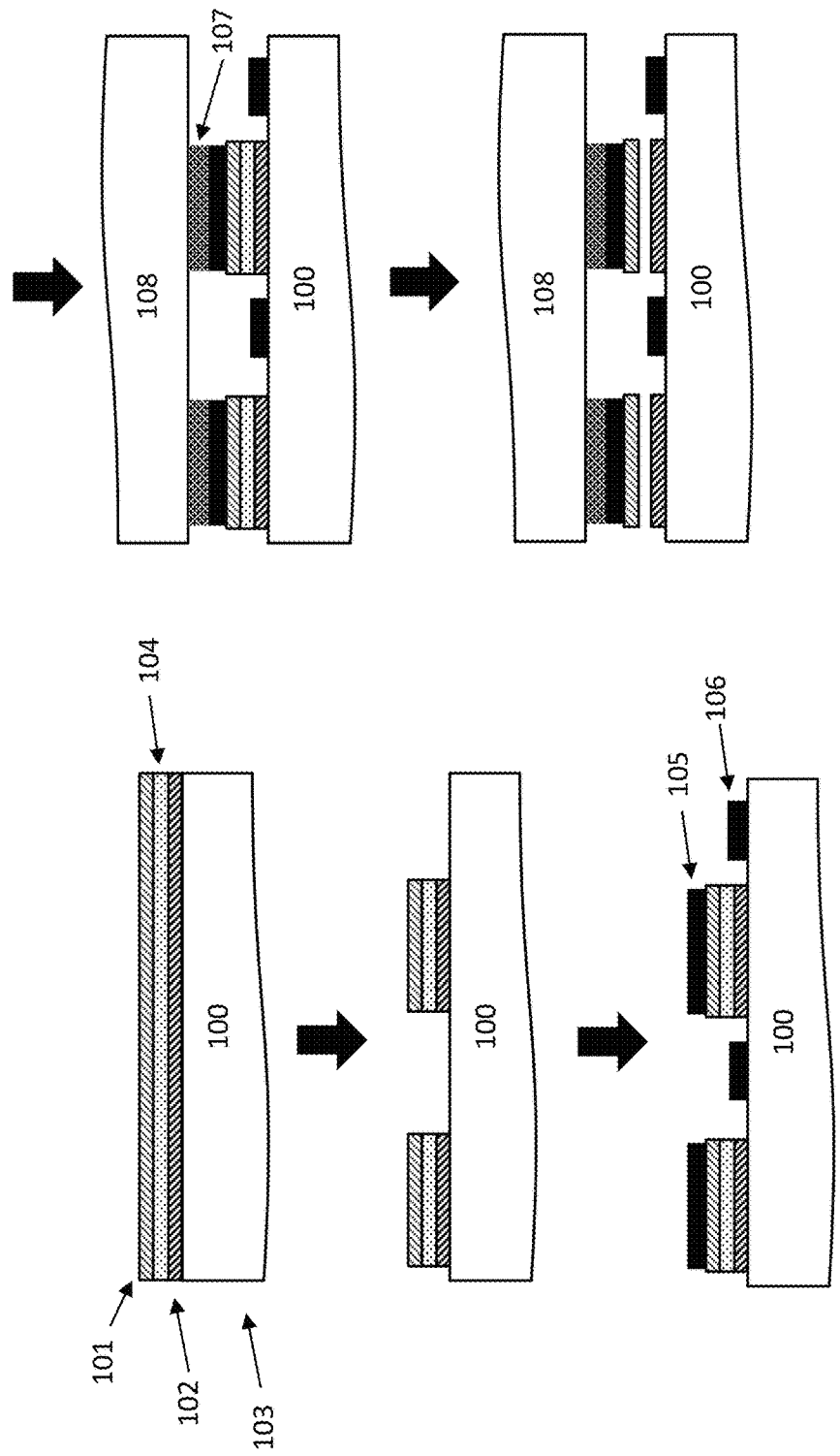
FIG. 6 is a simplified diagram illustrating a bond then etch process flow for epi layer transfer to a carrier wafer according to the present invention.

In one embodiment of this invention, the bonding of the semiconductor device epitaxial material to the carrier wafer process can be performed prior to the selective etching of the sacrificial region and subsequent release of the gallium and nitrogen containing substrate. FIG. 6 is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 6 substrate wafer 101 is overlaid by a buffer layer 102, a selectively etchable sacrificial layer 104 and a collection of device layers 101. The bond layer 105 is deposited along with a cathode metal 106 that will be used to facilitate the photoelectrochemical etch process for selectively removing the sacrificial layer.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In one example, the "etch then bond" process flow can be deployed where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The bond layer 105 is deposited along with a cathode metal 106 that will be used to facilitate the photoelectrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing substrate prior to the bonding step wherein they are releases from the gallium and nitrogen containing substrate and transferred to the carrier wafer.

Anchor regions are special features that can be designed into the photo masks which attach the undercut device layers to the gallium and nitrogen containing substrate, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. In one example the mesas are retained on the substrate by deposition of an etch resistant material acting as an anchor by connecting the mesas to the substrate. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. A layer of etch resistant material, which may be composed of metal, ceramic, polymer or a glass, is deposited such that it connects to both the mesa and the substrate. The selective etch process is carried out such that the sacrificial layer is fully removed and only the etch-resistant layer connects the mesa to the substrate In another example of anchor techniques, the mesas are retained on the substrate by use of an anchor composed of epitaxial material. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. The anchor is shaped such that during the etch, a small portion of the sacrificial layer remains unetched and creates a connection between the undercut mesa and the substrate wafer.

In one embodiment the anchors are positioned either at the ends or sides of the undercut die such that they are connected by a narrow undercut region of material. In this example the narrow connecting material is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

The mesa regions can be formed by dry or wet chemical etching, and in one example would include at least a p++ GaN contact layer, a p-type cladding layer comprised of GaN, AlGaN, or InAlGaN, light emitting layers such as quantum wells separated by barriers, waveguiding layers such as InGaN layers, and the one or more n-type cladding layers comprised of GaN, AlGaN, or InAlGaN, the sacrificial layer, and a portion of the n-type GaN epitaxial layer beneath the sacrificial layer. A p-contact metal is first deposited on the p++ GaN contact layer in order to form a high quality electrical contact with the p-type cladding. A second metal stack is then patterned and deposited on the mesa, overlaying the p-contact metal. The second metal stack consists of an n-contact metal, forming a good electrical contact with the n-type GaN layer beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

The use of metal anchors have several advantages over the use of anchors made from the epitaxial device material. The first is density of the transferrable mesas on the donor wafer containing the epitaxial semiconductor device layers and the gallium and nitrogen containing bulk substrate. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 7:
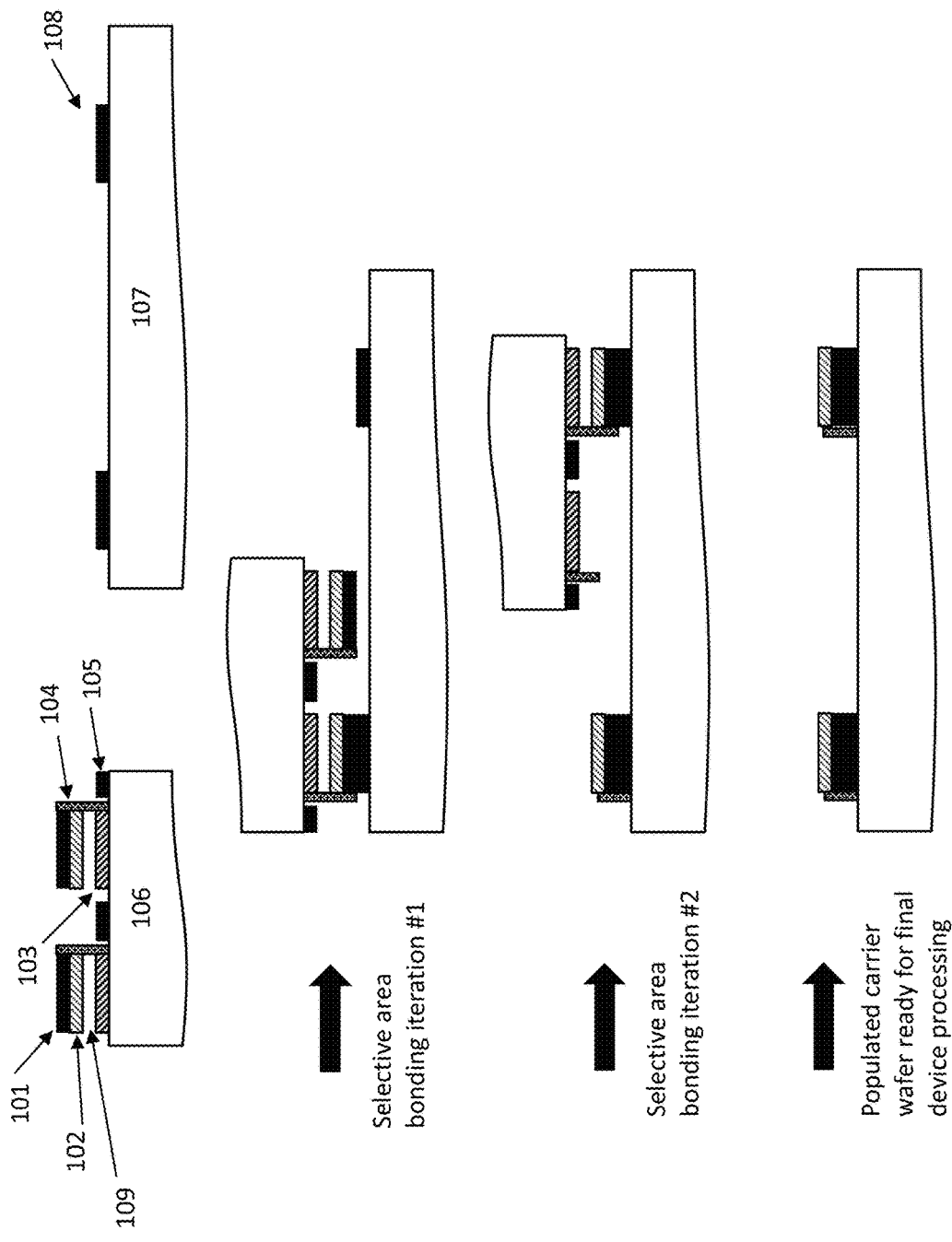
FIG. 7 is a simplified diagram illustrating a side view of die expansion with selective area bonding according to the present invention.

FIG. 7 is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 7, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 7. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 micron and about 500 microns wide or between about 500 micron and about 3000 microns wide and between about 100 and about 3000 µm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

Figure 8:
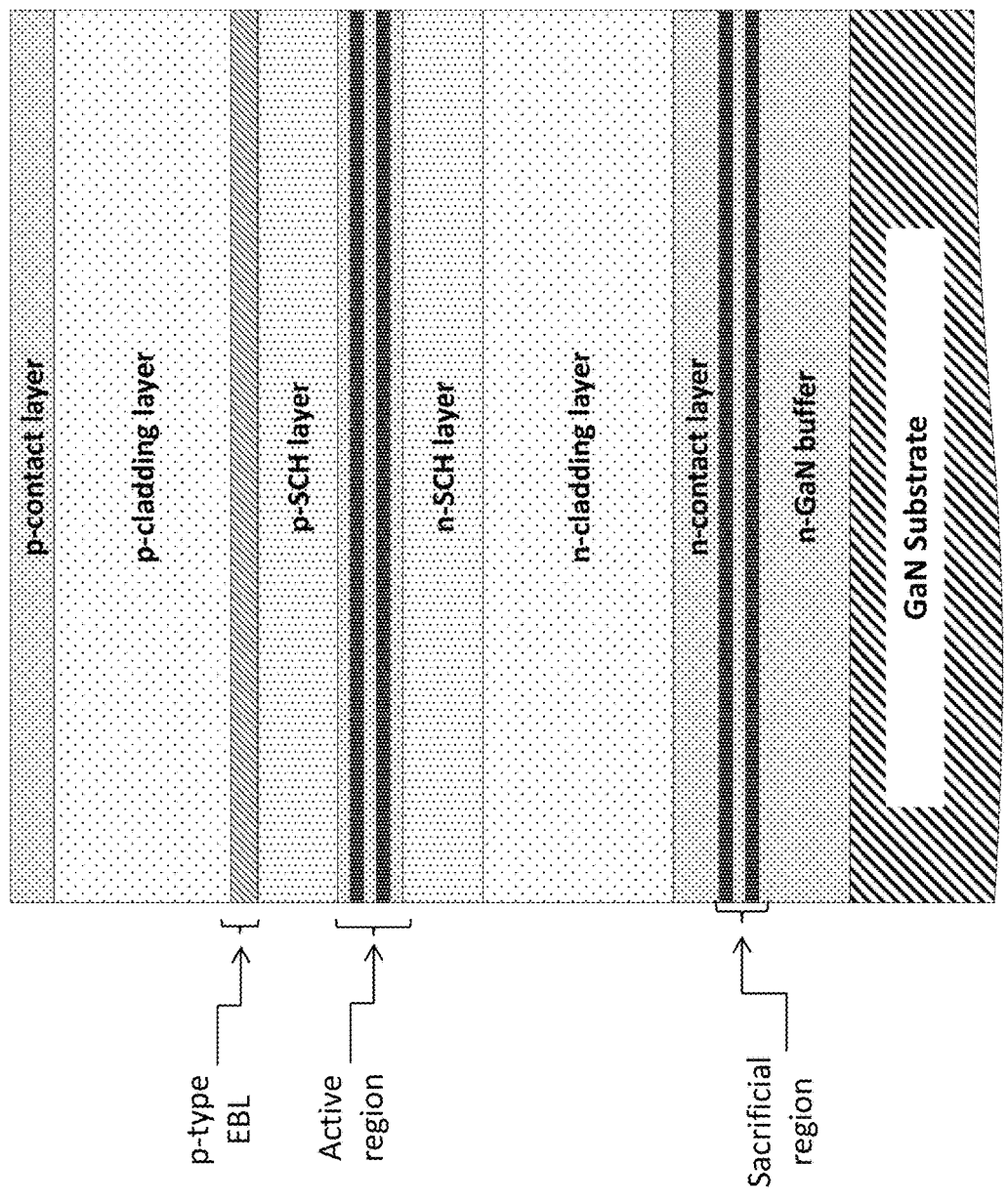
FIG. 8 is a simplified diagram illustrating an example of an LD epitaxial structure according to the epitaxial transfer embodiment according to the present invention.

An example of an epitaxial structure for a laser diode device according to this invention is shown in FIG. 8. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the substrate is comprised of a semipolar or nonpolar orientation. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm−3, but can be other doping levels in the range between 5E17 and 1E19 cm−3. Overlaying the contact layer is an n-type cladding layer comprised of GaN or AlGaN layer with a thickness of 1 micron with an average composition of 4% AlN, though in other embodiments the thickness may range from 0.25 to 2 microns with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an optional AlGaN electron blocking layer [EBL] with a composition of 10% AlN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 to 2 microns with an average composition of 0-8% AlN. The p-cladding is terminated at the free surface of the crystal with a highly doped p++ or p-contact layer that enables a high quality electrical p-type contact to the device.

Once the laser diode epitaxial structure has been transferred to the carrier wafer as described in this invention, wafer level processing can be used to fabricate the die into laser diode devices. The wafer process steps may be similar to those described in this specification for more conventional laser diodes. For example, in many embodiments the bonding media and die will have a total thickness of less than about 7 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device may have laser stripe region formed in the transferred gallium and nitrogen containing epitaxial layers. In the case where the laser is formed on a polar c-plane, the laser diode cavity can be aligned in the m-direction with cleaved or etched mirrors. Alternatively, in the case where the laser is formed on a semipolar plane, the laser diode cavity can be aligned in a projection of a c-direction. The laser strip region has a first end and a second end and is formed on a gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. Typical gases used in the etching process may include Cl and/or BCl3. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets facet each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 35 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Figure 9:
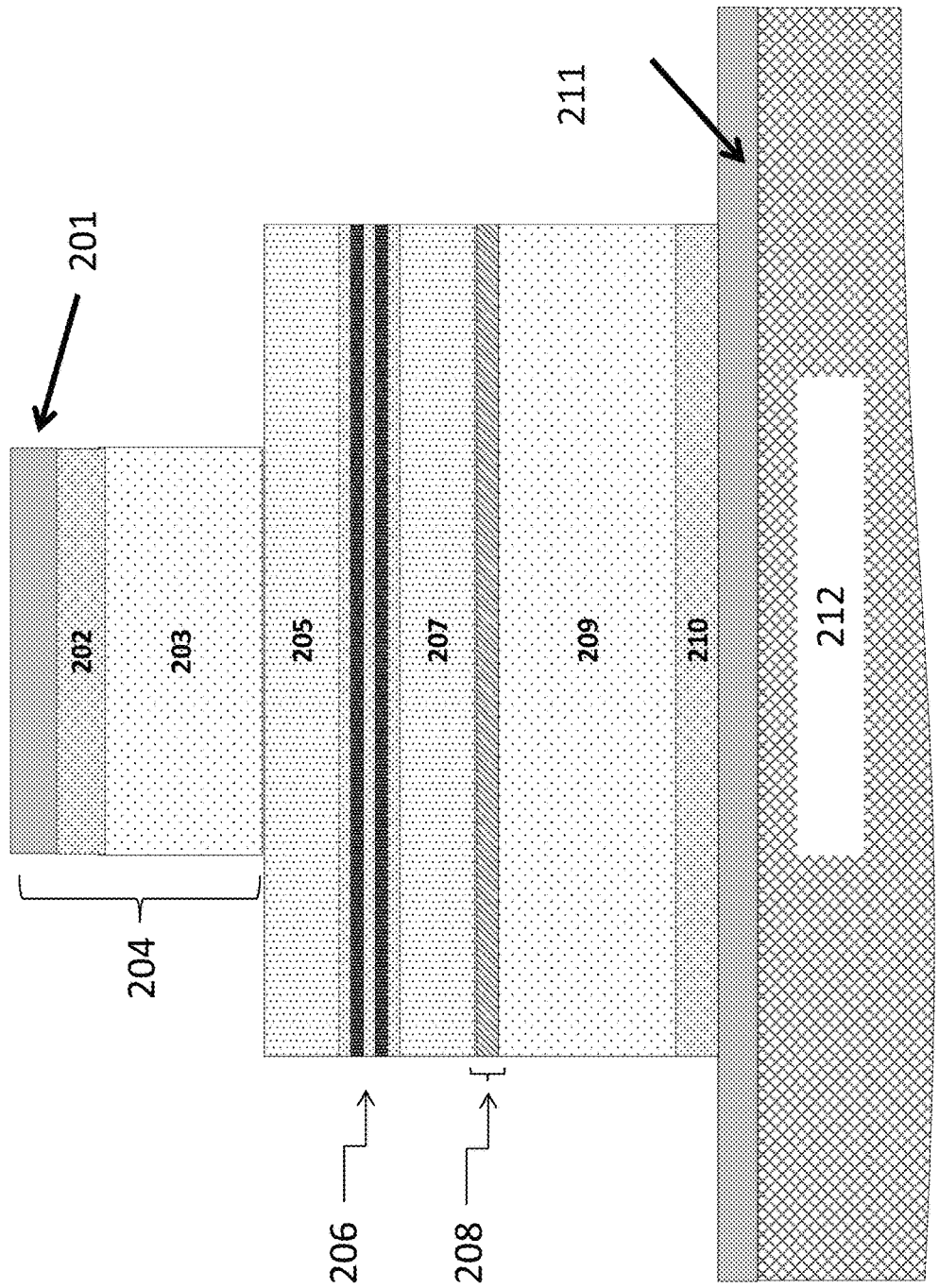
FIG. 9 is a simplified diagram illustrating an example of an LD device structure formed on carrier wafer from epitaxial structure in FIG. 8 according to the present invention.

An example of a processed laser diode cross-section according to one embodiment of the present invention is shown in FIG. 9. In this example an n-contact 201 is formed on top of n-type gallium and nitrogen contact layer 202 and n-type cladding layer 203 that have been etched to form a ridge waveguide 204. The n-type cladding layer 203 overlies an n-side waveguide layer or separate confinement hetereostructure (SCH) layer 205 and the n-side SCH overlies an active region 206 that contains light emitting layers such as quantum wells. The active region overlies an optional p-side SCH layer 207 and an electron blocking layer (EBL) 208. The optional p-side SCH layer overlies the p-type cladding 209 and a p-contact layer 210. Underlying the p-contact layer 210 is a metal stack 211 that contains the p-type contact and bond metal used to attach the transferred gallium and nitrogen containing epitaxial layers to the carrier wafer 212.

Once the lasers have been fully processed within the gallium and nitrogen containing layers that have been transferred to the carrier wafer, the carrier wafer must be diced. Several techniques can be used to dice the carrier wafer and the optimal process will depend on the material selection for the carrier wafer. As an example, for Si, InP, or GaAs carrier wafers that cleave very easily, a cleaving process can be used wherein a scribing and breaking process using conventional diamond scribe techniques may be most suitable. For harder materials such as GaN, AlN, SiC, sapphire, or others where cleaving becomes more difficult a laser scribing and breaking technique may be most suitable. In other embodiments a sawing process may be the most optimal way to dice the carrier wafer into individual laser chips. In a sawing process a rapidly rotating blade with hard cutting surfaces like diamond are used, typically in conjunction with spraying water to cool and lubricate the blade. Example saw tools used to commonly dice wafers include Disco saws and Accretech saws.

By choosing a carrier wafer material such as AlN, BeO, diamond, or SiC that is suitable as a submount between the laser chip and the mounting surface, the diced laser chip on the carrier wafer is in itself a chip on submount (CoS). This wafer level packaging features is a strong benefit of the lifted-off and transferred gallium and nitrogen containing epitaxial layer embodiment of this invention. The submount can be the common support member wherein the phosphor member of the CPoS would also be attached. Alternatively, the submount can be an intermediate submount intended to be mounted to the common support member wherein the phosphor material is attached. The submount member is characterized by a width, length, and thickness. In one example wherein the submount is the common support member for the phosphor and the laser diode, the submount would likely have a length ranging in dimension from about 0.5 mm to about 3 mm or about 5 mm, a width ranging from about 0.3 mm to about 1 mm or from about 1 mm to 3 mm, and a thickness from about 200 μm to about 1 mm. In tan example wherein the submount is an intermediate submount between the laser diode and the common support member it may be characterized by length ranging in dimension from about 0.5 mm to about 2 mm, a width ranging from about 150 um to about 1 mm, and the thickness may ranging from about 50 um to about 500 um.

Figure 10:
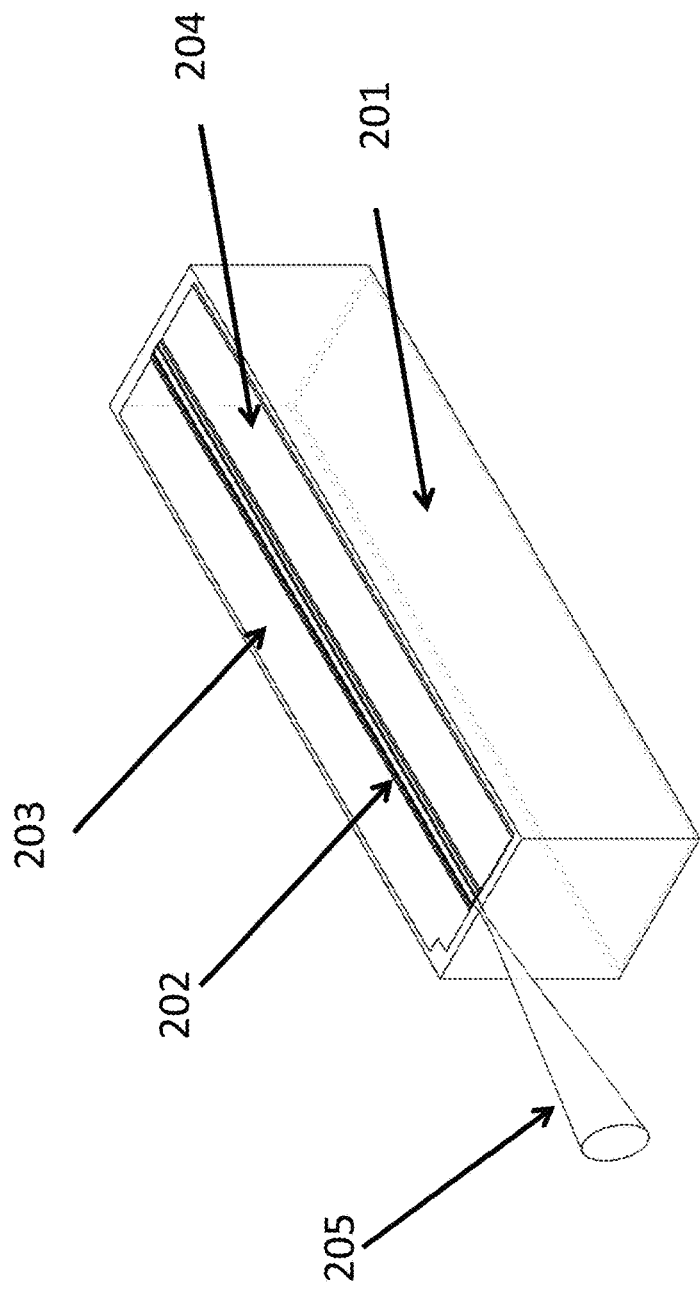
FIG. 10 is a simplified diagram illustrating a chip on submount (CoS) fabricated via wafer-level laser processing after transfer of gallium and nitrogen containing epitaxial layers according to an embodiment of the present invention.

A schematic diagram illustrating a CoS based on lifted off and transferred epitaxial gallium and nitrogen containing layers according to this present invention is shown in FIG. 10. The CoS is comprised of submount material 201 configured from the carrier wafer with the transferred epitaxial material with a laser diode configured within the epitaxy 202. Electrodes 203 and 204 are electrically coupled to the n-side and the p-side of the laser diode device and configured to transmit power from an external source to the laser diode to generate a laser beam output 205 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration such as size, cost, and performance due to the low thermal impedance.

Further process and device description for this embodiment describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

In this embodiment, the carrier wafer can be selected to provide an ideal submount material for the integrated CPoS white light source. That is, the carrier wafer serving as the laser diode submount would also serve as the common support member for the laser diode and the phosphor to enable an ultra-compact CPoS integrated white light source. In one example, the carrier wafer is formed from silicon carbide (SiC). SiC is an ideal candidate due to its high thermal conductivity, low electrical conductivity, high hardness and robustness, and wide availability. In other examples AlN, diamond, GaN, InP, GaAs, or other materials can be used as the carrier wafer and resulting submount for the CPoS. In one example, the laser chip is diced out such that there is an area in front of the front laser facet intended for the phosphor. The phosphor material would then be bonded to the carrier wafer and configured for laser excitation according to this embodiment.

After fabrication of the laser diode on a submount member, in one or more embodiments of this invention the construction of the integrated white source would proceed to integration of the phosphor with the laser diode and common support member. Phosphor selection is a key consideration within the laser based integrated white light source. The phosphor must be able to withstand the extreme optical intensity and associated heating induced by the laser excitation spot without severe degradation. Important characteristics to consider for phosphor selection include;

- A high conversion efficiency of optical excitation power to white light lumens. In the example of a blue laser diode exciting a yellow phosphor, a conversion efficiency of over 150 lumens per optical watt, or over 200 lumens per optical watt, or over 300 lumens per optical watt is desired.
- A high optical damage threshold capable of withstanding 1-20 W of laser power in a spot comprising a diameter of 1 mm, 500 um, 200 um, 100 um, or even 50 um.
- High thermal damage threshold capable of withstanding temperatures of over 150° C., over 200° C., or over 300° C. without decomposition.
- A low thermal quenching characteristic such that the phosphor remains efficient as it reaches temperatures of over 150° C., 200° C., or 250° C.
- A high thermal conductivity to dissipate the heat and regulate the temperature. Thermal conductivities of greater than 3 W/mK, greater than 5 W/mK, greater than 10 W/mKm, and even greater than 15 W/mK are desirable.
- A proper phosphor emission color for the application
- A suitable porosity characteristic that leads to the desired scattering of the coherent excitation without unacceptable reduction in thermal conductivity or optical efficiency.
- A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.
- A surface condition optimized for the application. In an example, one or more of the phosphor surfaces can be intentionally roughened for improved light extraction.

In a preferred embodiment, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the one or more laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase outcoupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, a ceramic yttrium aluminum garnets (YAG) doped with Ce3+ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:CE can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt. Additionally, the ceramic YAG:Ce phosphors is characterized by a temperature quenching characteristics above 150° C., above 200° C., or above 250° C. and a high thermal conductivity of 5-10 W/mK to effectively dissipate heat to a heat sink member and keep the phosphor at an operable temperature.

In another preferred embodiment according to this invention, the white light source is configured with a single crystal phosphor (SCP) such as YAG:Ce. In one example the Ce:Y3Al5O12 SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt. Additionally, the single crystal YAG:Ce phosphors is characterized by a temperature quenching characteristics above 150° C., above 200° C., or above 300° C. and a high thermal conductivity of 8-20 W/mK to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:CE can be configured to emit a yellow emission. In alternative or the same embodiments a YAG:CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one embodiment of the present invention the phosphor material contains a yttrium aluminum garnet host material and a rare earth doping element, and others. In an example, the wavelength conversion element is a phosphor which contains a rare earth doping element, selected from one or more of Ce, Nd, Er, Yb, Ho, Tm, Dy and Sm, combinations thereof, and the like. In an example, the phosphor material is a high-density phosphor element. In an example, the high-density phosphor element has a density greater than 90% of pure host crystal. Cerium (III)-doped YAG (YAG:Ce3+, or Y3Al5O12:Ce3+) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (blueish) white. The yellow emission of the Ce3+:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with Ce3+ ions (Y1-aGda)3(Al1-bGab)5O12:Ce3+, SrGa2S4:Eu2+, SrS:Eu2+, terbium aluminum based garnets (TAGs) (Tb3Al5O5), colloidal quantum dot thin films containing CdTe, ZnS, ZnSe, ZnTe, CdSe, or CdTe.

In further alternative examples, some rare-earth doped Sialons can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red CaAlSiN3-based (CASN) phosphor may be used.

In yet a further example, white light sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from one or more of $(Y, Gd, Tb, Sc, Lu, La)_3(Al, Ga, In)_5O_{12}:Ce^{3+}$, $SrGa_2S_4:Eu^{2+}$, $SrS:Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from one or more of the group consisting of $(Gd,Y,Lu,La)_2O_3:Eu^{3+}, Bi^{3+}$; $(Gd,Y,Lu,La)_2O_2S:Eu^{3+}, Bi^{3+}$; $(Gd,Y,Lu,La)VO_4:Eu^{3+}, Bi^{3+}$; $Y_2(O,S)_3:Eu^{3+}$; $Ca_{1-x}Mo_{1-y}Si_yO_4$: where $0.05 \leq x \leq 0.5$, $0 \leq y \leq 0.1$; $(Li,Na,K)_5Eu(W,Mo)O_4$; $(Ca,Sr)S:Eu.$ sup.2+; SrY.sub.2S.sub.4:Eu.sup.2+; CaLa.sub.2S.sub.4: Ce.sup.3+; (Ca,Sr)S:Eu.sup.2+; 3.5MgO*0.5MgF.sub.2* GeO.sub.2:Mn.sup.4+(MFG); (Ba,Sr,Ca)Mg.sub.xP.sub. 2O.sub.7:Eu.sup.2+, Mn.sup.2+; (Y,Lu).sub.2WO.sub.6:Eu. sup.3+, Mo.sup.6+; (Ba,Sr,Ca).sub.3Mg.sub.xSi.sub. 2O.sub.8:Eu.sup.2+, Mn.sup.2+, wherein 1<x.ltoreq.2; (RE. sub.1-yCe.sub.y)Mg.sub.2-xLi.sub.xSi.sub.3-xPxO.sub.12, where RE is at least one of Sc, Lu, Gd, Y, and Tb, 0.0001<x<0.1 and 0.001<y<0.1; (Y, Gd, Lu, La).sub.2-xEu.sub.xW.sub.1-yMo.sub.yO.sub.6, where 0.5.ltoreq.x.l-toreq.1.0, 0.01.ltoreq.y.ltoreq.1.0; (SrCa).sub.1-xEu.sub.xSi.sub.5N.sub.8, where 0.01.ltoreq.x.ltoreq.0.3; SrZnO.sub.2:Sm.sup.+3; M.sub.mO.sub.nX, wherein M is selected from the group of Sc, Y, a lanthanide, an alkali earth metal and mixtures thereof; X is a halogen; 1.ltoreq.m.l-toreq.3; and 1.ltoreq.n.ltoreq.4, and wherein the lanthanide doping level can range from 0.1 to 40% spectral weight; and Eu.sup.3+ activated phosphate or borate phosphors; and mixtures thereof. Further details of other phosphor species and related techniques can be found in U.S. Pat. No. 8,956,894, in the name of Raring et al. issued Feb. 17, 2015, and titled White light devices using non-polar or semipolar gallium containing materials and phosphors, which is commonly owned, and hereby incorporated by reference herein.

In some embodiments of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the integrated white light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 1 W to 100 W range focused to spot sizes of less than 1 mm in diameter, less than 500 microns in diameter, or even less than 100 microns in diameter, power densities of over 1 W/mm2, 100 W/mm2, or even over 2,500 W/mm2 can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm2, 10 W/mm2, or even over 250 W/mm2. Thus, even for this best case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is either attached to the common support member as the laser diode as in the CPoS or is attached to an intermediate submount member that is subsequently attached to the common support member. Candidate materials for the common support member or intermediate submount member are SiC, AlN, BeO, diamond, copper, copper tungsten, sapphire, aluminum, or others. The interface joining the phosphor to the submount member or common support member must be carefully considered. The joining material should be comprised of a high thermal conductivity material such as solder (or other) and be substantially free from voids or other defects that can impede heat flow. In some embodiments, glue materials can be used to fasten the phosphor. Ideally the phosphor bond interface will have a substantially large area with a flat surface on both the phosphor side and the support member sides of the interface.

In the present invention, the laser diode output beam must be configured to be incident on the phosphor material to excite the phosphor. In some embodiments the laser beam may be directly incident on the phosphor and in other embodiments the laser beam may interact with an optic, reflector, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The white light apparatus also has an electrical input interface configured to couple electrical input power to the laser diode device to generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 1000 lumens, 10,000 lumens, or greater of white light output.

The support member is configured to transport thermal energy from the at least one laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(mK), aluminum with a thermal conductivity of about 200 W/(mK), 4H—SiC with a thermal conductivity of about 370 W/(mK), 6H—SiC with a thermal conductivity of about 490 W/(mK), AlN with a thermal conductivity of about 230 W/(mK), a synthetic diamond with a thermal conductivity of about >1000 W/(mK), sapphire, or other metals, ceramics, or semiconductors. The support member may be formed from a growth process such as SiC, AlN, or synthetic diamond, and then mechanically shaped by machining, cutting, trimming, or molding. Alternatively the support member may be formed from a metal such as copper, copper tungsten, aluminum, or other by machining, cutting, trimming, or molding.

In a preferred configuration of this CPoS white light source, the common support member comprises the same submount that the gallium and nitrogen containing laser diode chip is directly bonded to. That is, the laser diode chip is mounted down or attached to a submount configured from a material such as SiC, AlN, or diamond and the phosphor material is also mounted to this submount, such that the submount is the common support member. The phosphor material may have an intermediate material positioned between the submount and the phosphor. The intermediate material may be comprised of a thermally conductive material such as copper. The laser diode can be attached to a first surface of the submount using conventional die attaching techniques using solders such as AuSn solder, but can be other techniques such as SAC solder, lead containing phosphor, or indium. Similarly, the phosphor material may be bonded to the submount using a soldering technique such as AuSn solder, SAC solder, lead containing phosphor, or with indium, but it can be other techniques. The joint could also be formed from thermally conductive glues, thermal epoxies such as silver epoxy, thermal adhesives, and other materials. Alternatively the joint could be formed from a metal-metal bond such as a Au—Au bond. Optimizing the bond for the lowest thermal impedance is a key parameter for heat dissipation from the phosphor, which is critical to prevent phosphor degradation and thermal quenching of the phosphor material.

In an alternative configuration of this CPoS white light source, the laser diode is bonded to an intermediate submount configured between the gallium and nitrogen containing laser chip and the common support member. In this configuration, the intermediate submount can be comprised of SiC, AlN, diamond, or other, and the laser can be attached to a first surface of the submount using conventional die attaching techniques using solders such as AuSn solder, but can be other techniques such as. The second surface of the submount can be attached to the common support member using similar techniques, but could be others. Similarly, the phosphor material may have an intermediate material or submount positioned between the common support member and the phosphor. The intermediate material may be comprised of a thermally conductive material such as copper. The phosphor material may be bonded using a soldering technique. In this configuration, the common support member should be configured of a thermally conductive material such as copper. Optimizing the bond for the lowest thermal impedance is a key parameter for heat dissipation from the phosphor, which is critical to prevent phosphor degradation and thermal quenching of the phosphor material.

In a specific embodiment of the present invention, the CPoS white light source is configured for a side-pumped phosphor operated in transmissive mode. In this configuration, the phosphor is positioned in front of the laser facet that outputs the laser beam such that upon activation the generated laser beam is incident on a backside of the phosphor, wherein both the laser and the phosphor are configured on a support member. The gallium and nitrogen containing laser diode is configured with a cavity that has a length greater than 100 um, greater than 500 um, greater than 1000 um, or greater than 1500 um long and a width greater than 1 um, greater than 10 um, greater than 20 um, greater than 30 um, or greater than 45 um. The cavity is configured with a front facet or mirror and back facet or mirror on the end, wherein the front facet comprises the output facet and configured to emit the laser beam incident on the phosphor. The front facet can be configured with an anti-reflective coating to decrease the reflectivity or no coating at all thereby allowing radiation to pass through the mirror without excessive reflectivity. In some cases the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor is comprised of a ceramic yttrium aluminum garnet (YAG) doped with $Ce^{3+}$ ions and emits yellow emission. The phosphor is shaped as a block, plate, sphere, cylinder, or other geometrical form. Specifically, the phosphor geometry primary dimensions may be less than 50 um, less than 100 um, less than 200 um, less than 500 um, less than 1 mm, or less than 10 mm. Operated in transmissive mode, the phosphor has a first primary side (back side) for receiving the incident laser beam and at least a second primary side (front side) where most of the useful white light will exit the phosphor to be coupled to the application. The phosphor is attached to the common support member or submount positioned in front of the laser diode output facet such that the first primary side of the phosphor configured for receiving the excitation light will be in the optical pathway of the laser output beam. The laser beam geometrical shape, size, spectral width, wavelength, intensity, and polarization are configured to excite the phosphor material. An advantage to transmissive mode phosphor operation is mitigation of the excitation source blocking or impeding any useful white light emitted from the primary emitting surface. Additionally, by exciting from the backside of the phosphor there will not be an obstruction relating to the excitation source or beam that may make integration of optics to collimate or project the white light difficult. In alternative embodiments the YAG:CE can be configured to emit a green emission. In yet alternative or the same embodiments the YAG can be doped with Eu to emit a red emission. In alternative embodiments, silicon nitrides or aluminum-oxinitrides can be used as the crystal host materials for red, green, yellow, or blue emissions.

Figure 11:
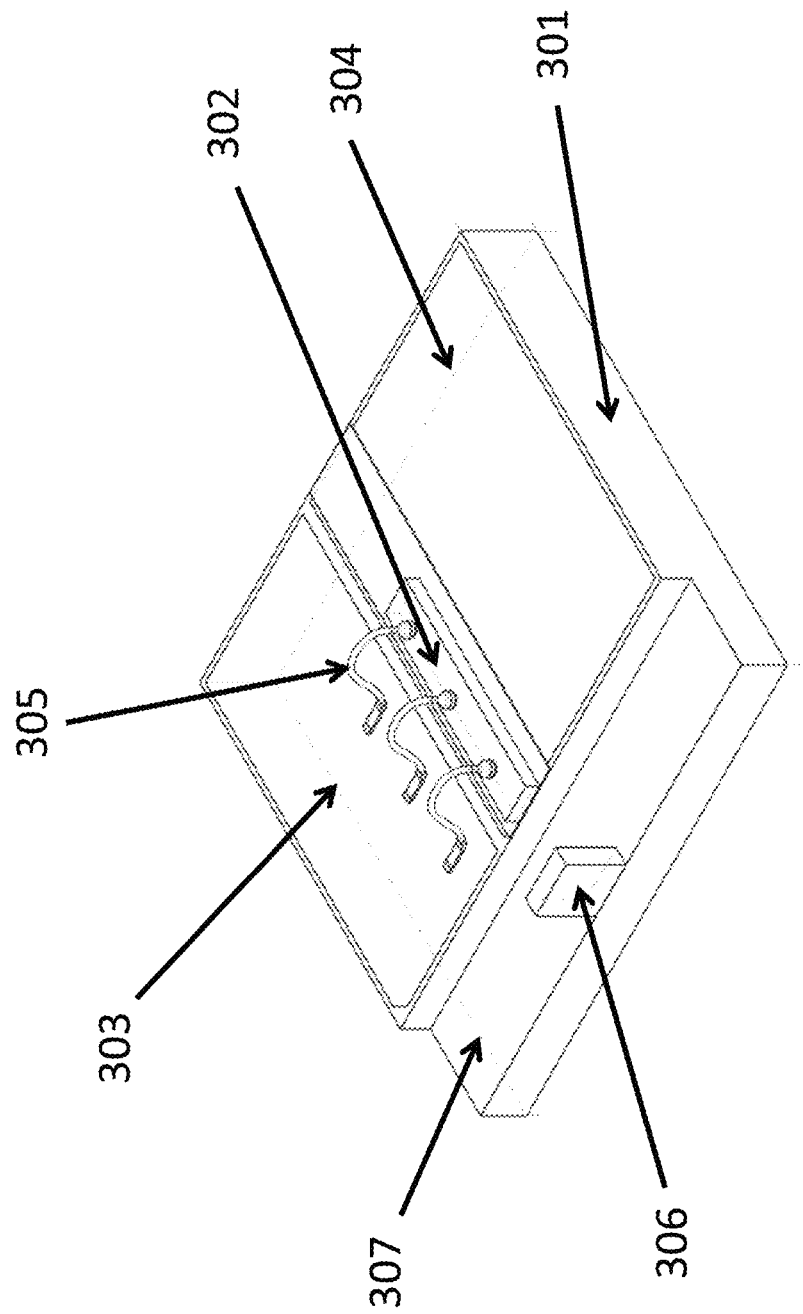
FIG. 11 is a simplified diagram illustrating an integrated laser-based white light source with a laser diode and phosphor member integrated onto a submount wherein the phosphor is configured for transmissive operation according to an embodiment of the present invention.

FIG. 11 presents a schematic diagram illustrating a transmissive embodiment of a CPoS integrated white light source based on a conventional laser diode formed on gallium and nitrogen containing substrate technology according to this present invention. The laser based CPoS white light device is comprised of submount material 301 that serves as the common support member configured to act as an intermediate material between a laser diode chip 302 and a final mounting surface and as an intermediate material between the phosphor material 306 and a final mounting surface. The submount is configured with electrodes 303 and 304 that may be formed with deposited metal layers such as Au. In one example, Ti/Pt/Au is used for the electrodes. Wirebonds 305 are configured to couple the electrical power from the electrodes 303 and 304 on the submount to the laser diode chip to generate a laser beam output from the laser diode. The laser beam output excites a phosphor plate 306 positioned in front of the output laser facet. The phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple the power to the laser diode device. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

Figure 12:
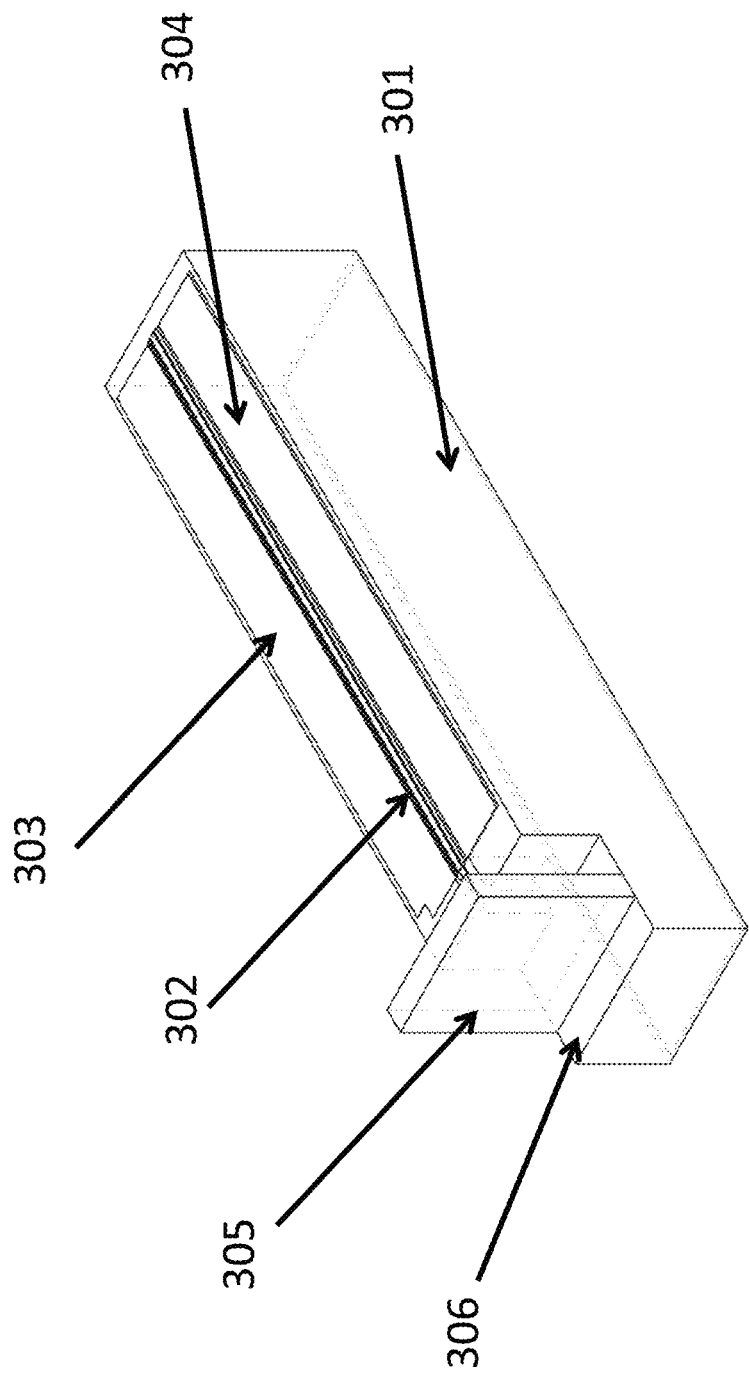
FIG. 12 is a simplified diagram illustrating an integrated laser-based white light source with a laser diode fabricated in gallium and nitrogen containing epitaxial layers transferred to a submount member and a phosphor member integrated onto the submount member wherein the phosphor is configured for transmissive operation according to an embodiment of the present invention.

FIG. 12 presents a schematic diagram illustrating an alternative transmissive embodiment of a CPoS integrated white light source based according to the present invention. In this embodiment the gallium and nitrogen containing lift-off and transfer technique is deployed to fabricate a very small and compact submount member with the laser diode chip formed from transferred epitaxy layers. The laser based CPoS white light device is comprised of submount material 301 that serves as the common support member configured to act as an intermediate material between a laser diode 302 formed in transferred gallium and nitrogen containing epitaxial layers and a final mounting surface and as an intermediate material between the phosphor plate material 305 and a final mounting surface. The laser diode or CoS submount is configured with electrodes 303 and 304 that may be formed with deposited metal layers and combination of metal layers including, but not limited to Au, Pd, Pt, Ni, Al, titanium, or others. The laser beam output excites a phosphor plate 305 positioned in front of the output laser facet. The phosphor plate is attached to the submount on a ledge 306 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In many embodiments of the present invention the attachment interface between the phosphor and the common support member must be designed and processed with care. The thermal impedance of this attachment joint should be minimized using a suitable attaching material, interface geometry, and attachment process practices for a thermal impedance sufficiently low to allow the heat dissipation. Moreover, the attachment interface may be designed for an increased reflectivity to maximize the useful white light exiting the emission surface of the phosphor. Examples include AuSn solders, SAC solders, lead containing solders, indium solders, indium, and other solders. The joint could also be formed from thermally conductive glues, thermal epoxies, and other materials. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The side-pumped transmissive apparatus has a form factor characterized by a length, a width, and a height. In an example, the height is characterized by a dimension of less than 25 mm and greater than 0.5 mm, although there may be variations.

To improve the efficiency of the integrated white light source, measures can be taken to minimize the amount of light exiting from the first surface wherein the laser excitation light is incident on the phosphor and maximize the light exiting the second primary white light emission side of the phosphor where the useful white light exits. Such measures can include the use of filters, spectrally selective reflectors, conventional mirrors, spatial mirrors, polarization based filters, holographic elements, or coating layers, but can be others.

In one example for a transmissive mode phosphor, a filter is positioned on the backside of the phosphor to reflect the backward propagating yellow emission toward the front of the phosphor where it has another opportunity to exit the primary emitting surface into useful white light. In this configuration the reflector would have to be designed to not block the blue excitation light from the laser. The reflector could be configured from the spectrally selective distributed Bragg reflector (DBR) mirror comprised of 2 or more alternating layers with different refractive indices designed to reflect yellow light over a wide range of angles. The DBR could be deposited directly on the phosphor using techniques such as e-beam deposition, sputter deposition, or thermal evaporation. Alternatively, the DBR could be in the form of a plate-like element that is applied to the phosphor. Since in a typical white light source configured from a mixing of yellow and blue emission the yellow emission comprised about 70% of the energy, this approach of reflecting the yellow light may be a sufficient measure in many applications. Of course, there can be additional variations, modifications, and alternatives.

In another example for a transmissive mode phosphor, a filter system is positioned on the backside of the phosphor to reflect the backward propagating yellow emission and the scattered blue excitation light back toward the front of the phosphor where it has another opportunity to exit the primary emitting surface into useful white light. The challenge of this configuration is to allow the forward propagating blue pump excitation light to pass through the filter without allowing the scattered backward propagating blue light to pass. One approach to overcoming this challenge is deploying a filter designed for incident angular reflectivity dependence and configuring the laser at an incident angle wherein the reflectivity is a minimum such as a normal incidence. Again, in this configuration the reflector could be configured from DBR mirrors such that one DBR mirror pair would reflect yellow and a second DBR pair would serve to reflect the blue light with the determined angular dependence. The DBR could be deposited directly on the phosphor using techniques such as e-beam deposition, sputter deposition, or thermal evaporation. Alternatively, the DBR could be in the form of a plate-like element that is applied to the phosphor. Of course, there can be additional variations, modifications, and alternatives.

Figure 13:
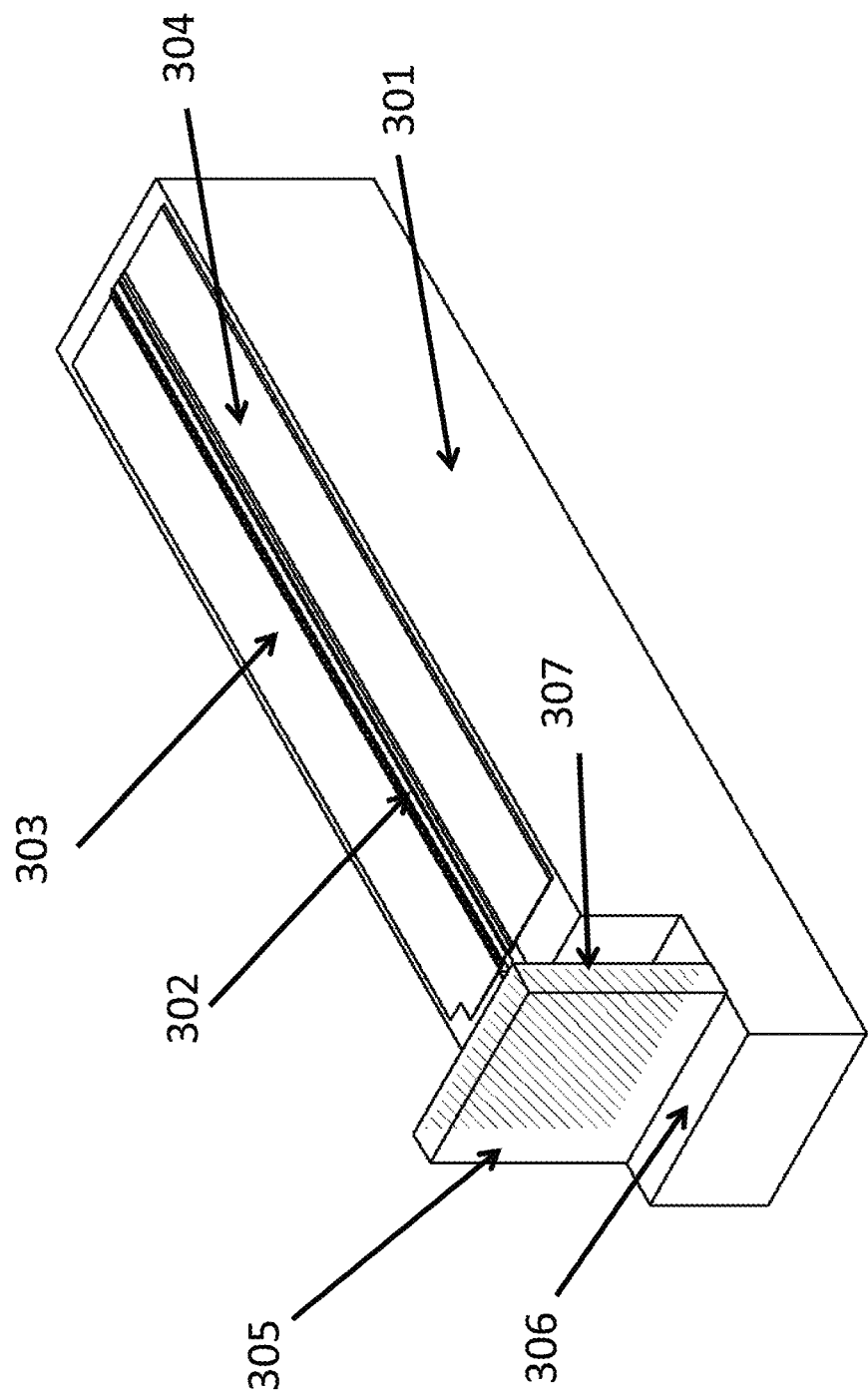
FIG. 13 is a simplified diagram illustrating the apparatus configuration of FIG. 12 but with modification of the phosphor configured with a coating or modification to increase the useful white light output according to an embodiment of the present invention.

FIG. 13 presents a schematic diagram illustrating an alternative transmissive embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment could be used for this embodiment including optical elements for improved efficiency. The laser based CPoS white light device is comprised of submount material 301 that serves as the common support member configured to act as an intermediate material between a laser diode 302 formed in transferred gallium and nitrogen containing epitaxial layers and a final mounting surface and as an intermediate material between the phosphor plate material 305 and a final mounting surface. The laser diode or CoS submount is configured with electrodes 303 and 304 that may be formed with deposited metal layers and combination of metal layers including, but not limited to Au, Pd, Pt, Ni, Al, titanium, or others. The laser beam output excites a phosphor plate 305 positioned in front of the output laser facet. In this embodiment, the phosphor is coated with a material 307 configured to increase the efficiency of the white source such that more of the useful white light escapes from the primary emitting surface of the phosphor. In this embodiment, the coating 307 is configured to increase the reflectivity of yellow and possibly blue emission to reflect the light back toward the front emitting surface. The phosphor plate is attached to the submount on a ledge 306 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

A second approach to overcoming the challenge of reflecting a backward propagating blue emission and yellow emission while allowing a forward blue emission to pass is deploying a filter system that combines a yellow spectrally selective reflector such as a DBR and a polarization based reflector for the blue light. Since the blue emission from the laser excitation source can be highly polarized with polarization ratios greater than 90% or greater than 95% and the backward propagating scattered blue light will have a mixed polarization, the polarization based reflector can be configured to allow the polarization state of the laser diode output beam (eg TE) to freely pass the filter while acting as a reflector to other polarization states. This configuration would likely require two elements that may be combined into a single thing film. A first element would be a yellow reflector such as a DBR mirror pair or another single layer or multi-layer film designed to reflect yellow. The second element would be a polarization sensitive material such as a plastic, ceramic, metal, or glass. The DBR or other yellow reflective material could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

A third approach to overcoming the challenge of reflecting a backward propagating blue emission and yellow emission while allowing a forward blue emission to pass is deploying a filter system that combines a yellow spectrally selective reflector such as a DBR and a spatial based reflector for the blue light. This configuration would likely require two elements that may be combined into a single thing film. A first element would be a yellow reflector such as a DBR mirror pair or another single layer or multi-layer film designed to reflect yellow. The second element would be a comprised of an element to reflect blue and would be applied to the back of the phosphor in a selective manner such that it was not present where the laser beam is incident on the phosphor, but is present over the area where the laser beam is not incident. The second element could be another DBR coating stack or a broadband reflector material such as Ag or Al. Both the first element such as a DBR or other yellow reflective material and the second element spatially reflective to blue light could be deposited directly on the phosphor or on the polarization filter element using techniques such as e-beam deposition, sputter deposition, or thermal evaporation. Alternatively, the DBR could be in the form of a plate-like element that is applied to the phosphor. The polarization sensitive element could be deposited on the phosphor or positioned, glued, or attached on the backside of the phosphor. Of course, there can be additional variations, modifications, and alternatives.

In other embodiments, coatings or other materials may be used to reduce the reflectivity of the front emission surface of the phosphor. In yet other embodiment, coatings or additional elements may be applied to reduce the reflectivity of the incident beam on the phosphor surface. In configurations where off axis laser beam incident angles are used such measure to reduce the reflectivity of the laser beam on the phosphor may be critical.

In the present invention, the laser diode output beam must be configured to be incident on the phosphor material to excite the phosphor. The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. Specifically, in many applications it is desirable to have a round laser excitation beam such that the illuminated spot on the phosphor is also round and the resulting white light emission radiates from a round area. Such a round area is advantageous for forming collimated or spot light sources using conventional optics and reflectors commonly available for round emission. Additionally, the round beam produces some symmetry in the phosphor so that there are not thermal hotspots which can lead to changes in phosphor conversion efficiency or even initiate failure mechanisms in the phosphor.

This same concept can also be utilized to generate other shapes such as elliptical, conical, rectangular and others for applications which require non-circular beams. In automotive headlights for example, customized spatial patterns are desired to produce illumination in desired areas, and darker spots in the beam pattern in order to avoid causing glare to other oncoming drivers.

In one embodiment of the present invention a collimating optic is positioned between the laser diode and the phosphor to collimate and beam shape the laser output beam. By placing a free space optic in front of the output laser beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to ball lenses, aspheric collimator, dichroic mirrors, turning mirrors, optical isolators, but could be others.

Figure 14:
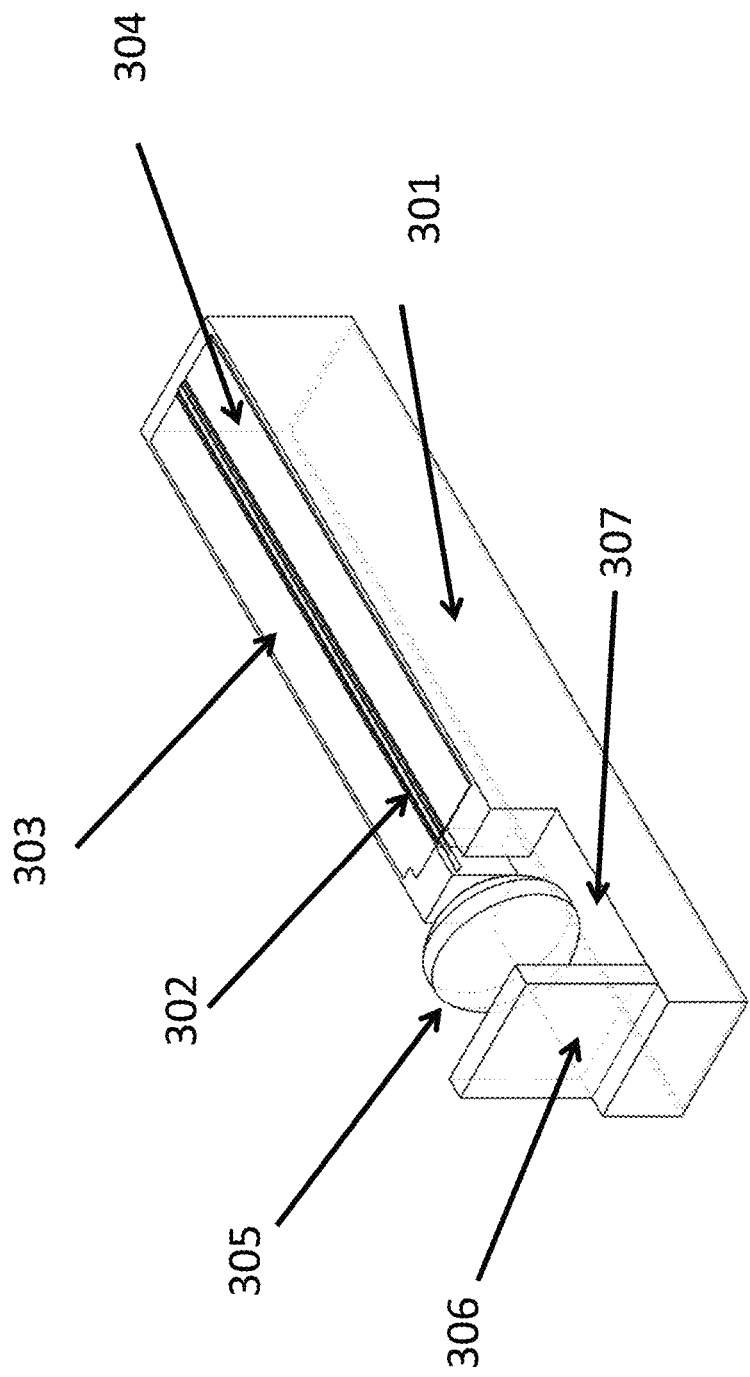
FIG. 14 is a simplified diagram illustrating the apparatus configuration of FIG. 12 but with modification of the laser beam configured through a collimating optic prior to incidence on the phosphor according to an embodiment of the present invention.

FIG. 14 presents a schematic diagram illustrating a transmissive phosphor embodiment of a CPoS integrated white light source including free-space optics to collimate and shape the laser beam for incidence on the phosphor according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment could be used for this integrated free-space optic embodiment. The laser based CPoS white light device is comprised of submount material 301 that serves as the common support member configured to act as an intermediate material between a laser diode 302 formed in transferred gallium and nitrogen containing epitaxial layers and a final mounting surface and as an intermediate material between the phosphor plate material 305 and a final mounting surface. The laser diode and/or submount is configured with electrodes 303 and 304 that may be formed with deposited metal layers and combination of metal layers including, but not limited to Au, Pd, Pt, Ni, Al, titanium, or others. The laser beam output is coupled into an aspheric lens 305 for collimation and beam shaping to create a more circular beam, which then excites a phosphor plate 305 positioned in front of aspeheric lens. The phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In an alternative preferred embodiment, beam shaping can achieved by tilting the phosphor excitation surface with respect the laser diode aperture and positioning the laser diode at a designed distance from the phosphor to exploit the beam divergence properties of the laser diode and achieve the desired spot size. This "optics-less" beam shaping embodiment is advantageous over embodiments where optical elements are introduced for beam shaping and collimation. These advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor. By positioning the phosphor about 70 um away from the laser aperture a relative uniform beam can be realized with about a 50 um diameter. In addition to controlling the distance of the laser from the phosphor, the incident angle of the laser beam can also be used to control the shape of the beam incident on the phosphor.

Figure 15:
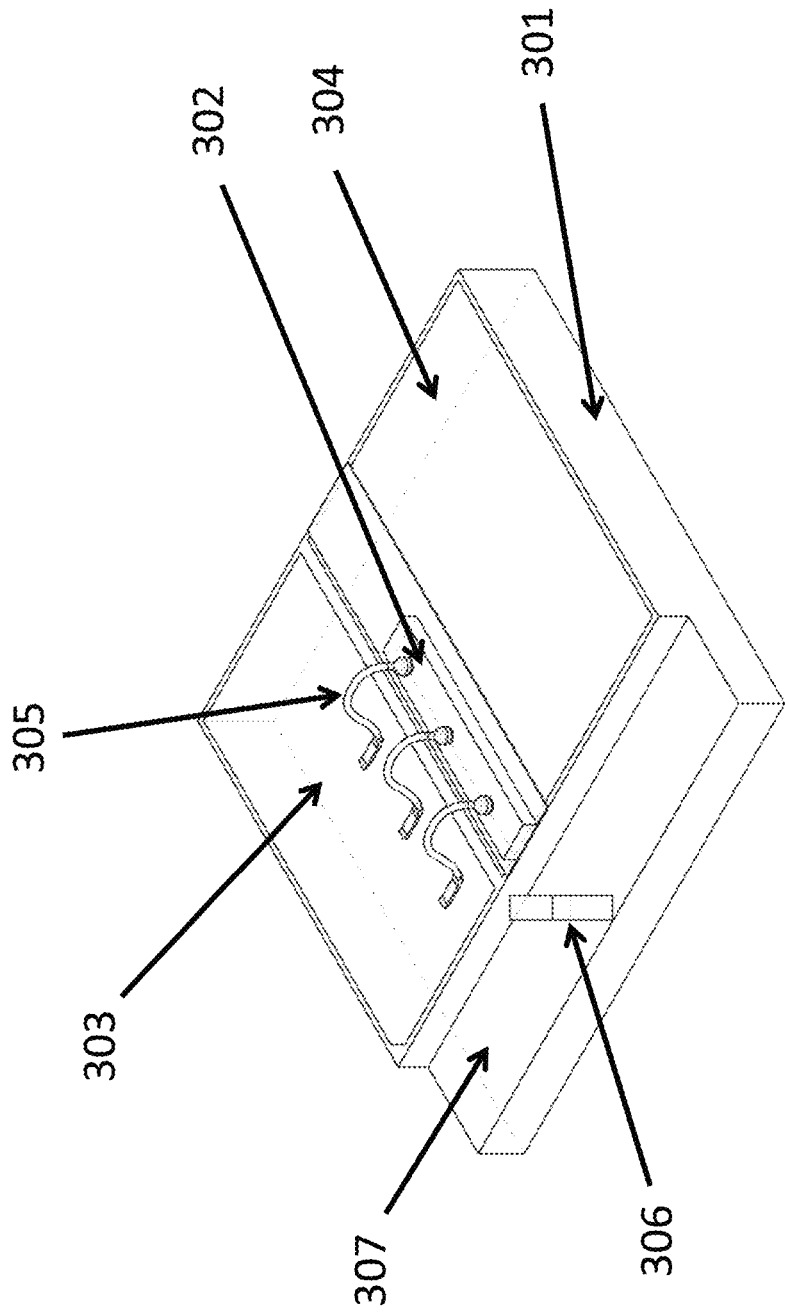
FIG. 15 is a simplified diagram illustrating an integrated laser-based white light source with a laser diode and phosphor member integrated onto a submount wherein the phosphor is configured at an angle with the respect to the laser diode for a beam shaping according to an embodiment of the present invention.

FIG. 15 presents a schematic diagram illustrating a transmissive phosphor embodiment of a CPoS integrated white light source including a tilted phosphor design to achieve a more circular excitation spot on the laser according to the present invention. In this embodiment a conventional full laser diode chip containing substrate is mounted on the submount. The laser based CPoS white light device is comprised of submount material 301 that serves as the common support member configured to act as an intermediate material between a laser diode chip 302 and a final mounting surface and as an intermediate material between the phosphor plate material 306 and a final mounting surface. The laser diode or CoS is configured with electrodes 303 and 304 that may be formed with deposited metal layers and combination of metal layers including, but not limited to Au, Pd, Pt, Ni, Al, titanium, or others. Wirebonds 305 are configured to couple the electrical power from the electrodes 303 and 304. The phosphor plate 306 is tilted about the slow axis of the laser diode output to result in a more circular excitation spot on the phosphor. For example, the phosphor could be at an angle of about 33 degrees. The phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different phosphor angle or orientation, different geometrical designs of the submount or common support member, different orientations of the laser output beam with respect to the phosphor, different electrode and electrical designs, and others.

Figure 16:
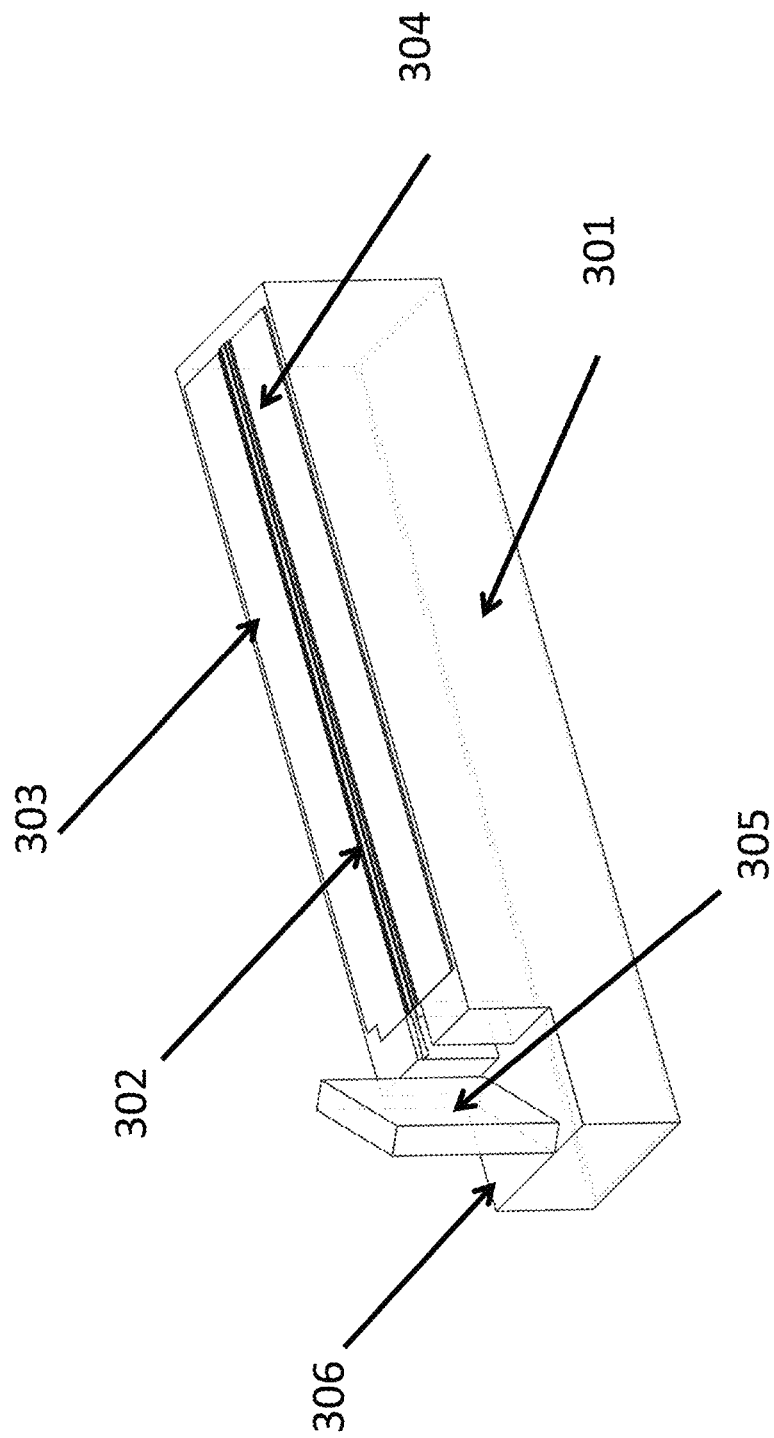
FIG. 16 is a simplified diagram illustrating an integrated laser-based white light source with a laser diode fabricated in gallium and nitrogen containing epitaxial layers transferred to a submount member and a phosphor member integrated onto the submount member wherein the phosphor is configured at an angle with the respect to the laser diode for a beam shaping according to an embodiment of the present invention.

FIG. 16 presents a schematic diagram illustrating a transmissive phosphor embodiment of a CPoS integrated white light source including a tilted phosphor design to achieve a more circular excitation spot on the laser according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment could be used for this tilted phosphor embodiment. The laser based CPoS white light device is comprised of submount material 301 that serves as the common support member configured to act as an intermediate material between a laser diode 302 formed in transferred gallium and nitrogen containing epitaxial layers and a final mounting surface and as an intermediate material between the phosphor plate material 305 and a final mounting surface. The laser diode or CoS is configured with electrodes 303 and 304 that may be formed with deposited metal layers and combination of metal layers including, but not limited to Au, Pd, Pt, Ni, Al, titanium, or others. The phosphor plate 305 is tilted about the slow axis of the laser diode output to result in a more circular excitation spot on the phosphor. For example, the phosphor could be at an angle of about 33 degrees according to the calculation in FIG. 20. The phosphor plate is attached to the submount on a ledge 307 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration and there could be many variants on this embodiment including but not limited to different shape phosphors, different phosphor angle or orientation, different geometrical designs of the submount or common support member, different orientations of the laser output beam with respect to the phosphor, different electrode and electrical designs, and others.

In alternative embodiments of the present invention, multiple phosphors are operated in a transmissive mode for a white emission. In one example, a violet laser diode configured to emit a wavelength of 395 nm to 425 nm and excite a first blue phosphor and a second yellow phosphor. In this configuration, a first blue phosphor plate could be fused or bonded to the second yellow phosphor plate. In a practical configuration the laser beam would be directly incident on the first blue phosphor wherein a fraction of the blue emission would excite the second yellow phosphor to emit yellow emission to combine with blue emission and generate a white light. Additionally, the violet pump would essentially all be absorbed since what may not be absorbed in the blue phosphor would then be absorbed in the yellow phosphor. In an alternative practical configuration the laser beam would be directly incident on the second yellow phosphor wherein a fraction of the violet electromagnetic emission would be absorbed in the yellow phosphor to excite yellow emission and the remaining violet emission would pass to the blue phosphor and create a blue emission to combine a yellow emission with a blue emission and generate a white light.

In an alternative embodiment of a multi-phosphor transmissive example according to the present invention, a blue laser diode operating with a wavelength of 425 nm to 480 nm is configured to excite a first green phosphor and a second red phosphor. In this configuration, a first green phosphor plate could be fused or bonded to the second red phosphor plate. In a practical configuration the laser beam would be directly incident on the first green phosphor wherein a fraction of the green emission would excite the second red phosphor to emit red emission to combine with green phosphor emission and blue laser diode emission to generate a white light. In an alternative practical configuration the laser beam would be directly incident on the second red phosphor wherein a fraction of the blue electromagnetic emission would be absorbed in the red phosphor to excite red emission and a portion of the remaining blue laser emission would pass to the green phosphor and create a green emission to combine with the red phosphor emission and blue laser diode emission to generate a white light. The benefit or feature of this embodiment is the higher color quality that could be achieved from a white light comprised of red, green, and blue emission. Of course there could be other variants of this invention including integrating more than two phosphor and could include one of or a combination of a red, green, blue, and yellow phosphor.

In yet another variation of a side pumped phosphor configuration, a "point source" or "point source like" CPoS white emitting device is achieved. In this configuration the phosphor would have a 3-dimensional geometry such as a cube geometry or a spherical geometry such that white light can be emitted from multiple primary emission surfaces, and ideally from the entirety of the surface area of the 3-dimensional phosphor geometry. For example, in a cube geometry up to all six faces of the cube can emit white light or in a sphere configuration the entire surface can emit to create a perfect point source. In some practical implementations of this present invention, certain surfaces of the 3-dimension phosphor geometry may not be to freely emit due to obstructions or impediments. For example, in some configurations of this embodiment the phosphor is attached to the common support member wherein the common support member may not be fully transparent. In this configuration the mounting surface or support member would be impede the phosphor emission from the side or portion of the phosphor facing the mounting surface or support member. This impediment would reduce the overall efficiency or quality of the point source white light emitter. However, this emission impediment can be minimized or mitigated using various techniques to provide a very efficient point source. In one configuration, the phosphor is supported by an optically transparent member such that the light is free to emit in all directions from the phosphor point source. In one variation, the phosphor is fully surrounded in or encapsulated by an optically transparent material such as a solid material like SiC, sapphire, diamond, GaN, or other, or a liquid material like water or a more thermally conductive liquid.

Figure 17:
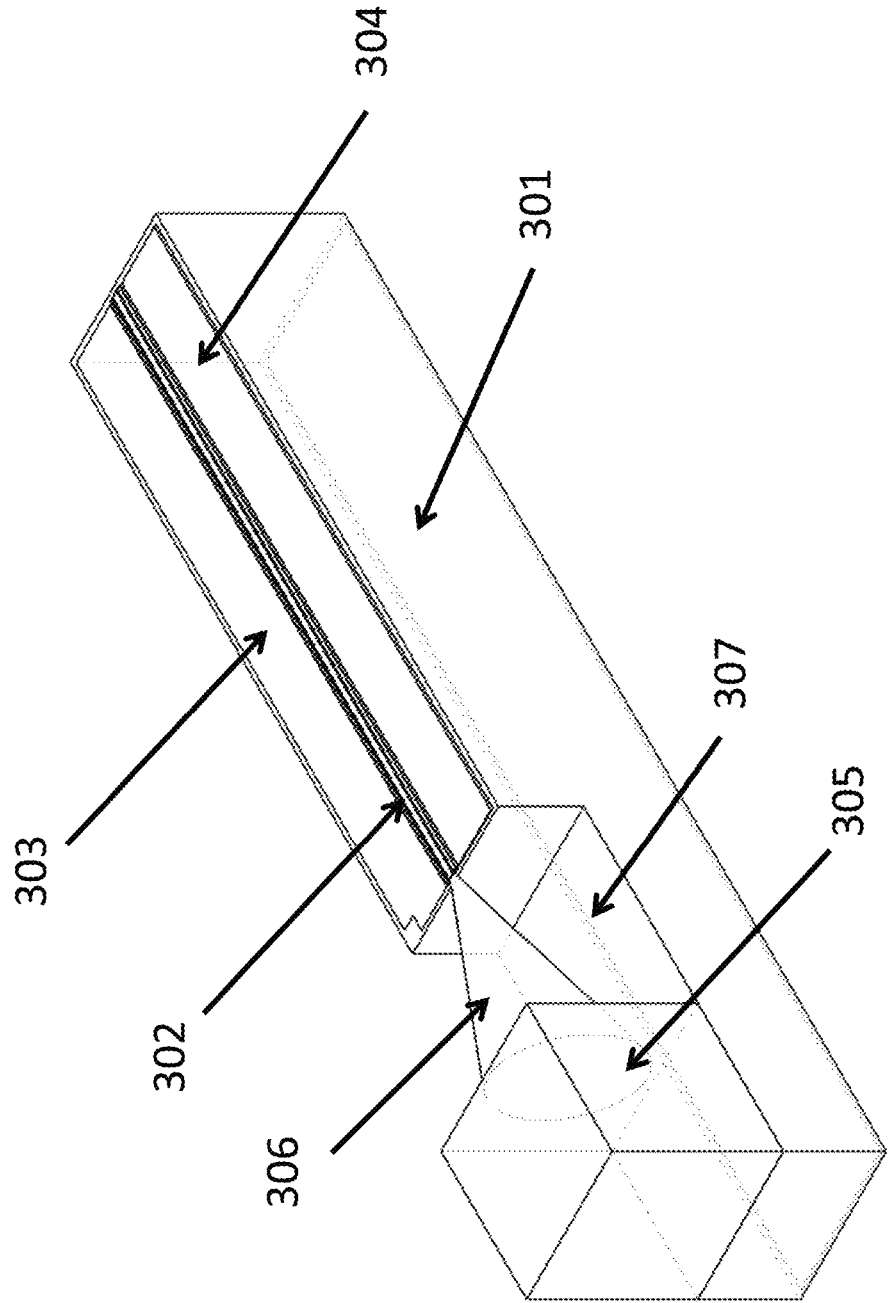
FIG. 17 is a simplified diagram illustrating an integrated laser-based white light source with a laser diode fabricated in gallium and nitrogen containing epitaxial layers transferred to a submount member and a phosphor member integrated onto the submount member wherein the phosphor is configured as point source according to an embodiment of the present invention.

FIG. 17 presents a schematic diagram illustrating a point source laser-pumped phosphor embodiment of a CPoS integrated white light source including a phosphor with a 3-dimensional geometrical design to provide a point source of light according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment could be used for this point source embodiment. The laser based CPoS white light device is comprised of submount material 301 that serves as the common support member configured to act as an intermediate material between a laser diode 302 formed in transferred gallium and nitrogen containing epitaxial layers and a final mounting surface and as an intermediate material between the phosphor plate material 305 and a final mounting surface. The laser diode or CoS is configured with electrodes 303 and 304 that may be formed with deposited metal layers and combination of metal layers including, but not limited to Au, Pd, Pt, Ni, Al, titanium, or others. The 3-dimensional phosphor member 305 is configured in front of the laser diode such that the output laser beam 306 is incident on an excitation side of the phosphor and multiple sides of the phosphor are configured to emit white light. Up to all sides of the phosphor can emit, but in some embodiments such as that shown in FIG. 17 the emission may be obstructed from the mounting surface where the phosphor is attached to the submount on a ledge 307 or recessed region. The electrodes 303 and 304 are configured for an electrical connection to an external power source such as a laser driver, a current source, or a voltage source. Wirebonds can be formed on the electrodes to couple electrical power to the laser diode device to generate a laser beam 306 output from the laser diode. Of course this is merely an example of a configuration and there could be many variants on this embodiment including but not limited to different shape phosphors such as spherical or semispherical, different phosphor angle or orientation, different geometrical designs of the submount or common support member, different orientations of the laser output beam with respect to the phosphor, different electrode and electrical designs, and others.

In other variations, the support member can be used to manipulate the light in the integrated white light source. In one example, an optically transparent support member could serve as a waveguide for the laser light to reach the phosphor. In another example, an optically transparent support member can be configured to transmit the laser light to the phosphor member. In other examples of this variation wherein the support member manipulates the light, the support member can be shaped or configured to form reflectors, mirrors, diffusers, lenses, absorbers, or other members to manipulate the light. In another variation, the support member could also serve as a protective safety measure to ensure that no direct emitting laser light is exposed as it travels to reach the phosphor. Such point sources of light that produce true omni-directional emission are increasing useful as the point source becomes increasing smaller, due to the fact that product of the emission aperture and the emission angle is conserved or lost as subsequent optics and reflectors are added. Specifically, for example, a small point source can be collimated with small optics or reflectors. However, if the same small optics or reflector assembly are applied to a large point source, the optical control and collimation is diminished.

In another specific preferred embodiment of the CPoS white light source, the present invention is configured for a reflective mode phosphor operation. In one example the excitation laser beam enters the phosphor through the same primary surface as the useful white light is emitted from. That is, operated in reflective mode the phosphor could have a first primary surface configured for both receiving the incident excitation laser beam and emitting useful white light. In this configuration, the phosphor is positioned in front of the laser facet that outputs the laser beam, wherein both the laser and the phosphor are configured on a support member. The gallium and nitrogen containing laser diode is configured with a cavity that has a length greater than 100 um, greater than 500 um, greater than 1000 um, or greater than 1500 um long and a width greater than 1 um, greater than 10 um, greater than 20 um, greater than 30 um, or greater than 45 um. The cavity is configured with a front facets and back facet on the end wherein the front facet comprises the output facet and emits the laser beam incident on the phosphor. The front facet can be configured with an anti-reflective coating to decrease the reflectivity or no coating at all thereby allowing radiation to pass through the mirror without excessive reflectivity. In some cases the coating may be configured to slightly increase the reflectivity. Since no laser beam is to be emitted from the back end of the cavity member, the back facet or mirror is configured to reflect the radiation back into the cavity. For example, the back facet includes highly reflective coating with a reflectivity greater than 85% or 95%. In one example, the phosphor can be comprised of Ce doped YAG and emits yellow emission. The phosphor may be a ceramic phosphor and could be a single crystal phosphor. The phosphor is preferably shaped as a substantially flat member such as a plate or a sheet with a shape such as a square, rectangle, polygon, circle, or ellipse, and is characterized by a thickness. In a preferred embodiment the length, width, and or diameter dimensions of the large surface area of the phosphor are larger than the thickness of the phosphor. For example, the diameter, length, and/or width dimensions may be 2× greater than the thickness, 5× greater than the thickness, 10× greater than the thickness, or 50× greater than the thickness. Specifically, the phosphor plate may be configured as a circle with a diameter of greater than 50 um, greater than 100 um, greater than 200 um, greater than 500 um, greater than 1 mm, or greater than 10 mm and a thickness of less than 500 um, less than 200 um, less than 100 um or less than 50 um. A key benefit to a reflective mode phosphor is the ability to configure it for excellent heat dissipation since the backside of surface of the phosphor can be directly heat-sunk to the common support member or intermediate submount member. Since the phosphor is preferably thin, the thermal path is short and can rapidly travel to the support member. In alternative or the same embodiments a YAG:CE can be configured to emit a green emission. In yet alternative or the same embodiments the YAG can be doped with Eu to emit a red emission. In alternative embodiments, silicon nitrides or aluminum-oxi-nitrides can be used as the crystal host materials for red, green, yellow, or blue emissions.

In one example of the reflective mode CPoS white light source embodiment of this invention optical coatings, material selections, or special design considerations are taken to improve the efficiency by maximizing the amount of light exiting the primary surface of the phosphor. In one example, the backside of the phosphor may be coated with reflective layers or have reflective materials positioned on the back surface of the phosphor adjacent to the primary emission surface. The reflective layers, coatings, or materials help to reflect the light that hits the back surface of the phosphor such that the light will bounce and exit through the primary surface where the useful light is captured. In one example, a coating configured to increase the reflectivity for yellow light and blue light is applied to the phosphor prior to attaching the phosphor to the common support member. Such coatings could be comprised of metal layers such as silver or aluminum, or others such as gold, which would offer good thermal conductivity and good reflectance or could be comprised of dielectric layers configured as single layers, multi layers, or DBR stacks, but could be others. In another example, a reflective material is used as a bonding medium that attaches the phosphor to the support member or to an intermediate submount member. Examples of reflective materials include reflective solders like AuSn, SnAgC (SAC), or Pb containing phosphors, or reflective glues, but could be others. With respect to attaching the phosphor to the common support member, thermal impedance is a key consideration. The thermal impedance of this attachment joint should be minimized using the best attaching material, interface geometry, and attachment process practices for the lowest thermal impedance with sufficient reflectivity. Examples include AuSn solders, SAC solders, Pb containing solders, indium, and other solders. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, aluminum, SiC, sapphire, AlN, or other metals, ceramics, or semiconductors. The reflective mode white light source apparatus has a form factor characterized by a length, a width, and a height. In an example, the height is characterized by a dimension of less than 25 mm and greater than 0.5 mm, although there may be variations. In an alternative example, the height is characterized by a dimension of less than 12.5 mm, and greater than 0.5 mm, although there may be variations. In yet an alternative example, the length and width are characterized by a dimension of less than 30 mm, less than 15 mm, or less than 5 mm, although there may be variations.

The reflective mode CPoS white light source embodiment of this invention is configured with the phosphor member attached to the common support member with the large primary surface configured for receiving laser excitation light and emitting useful white light positioned at an angle normal (about 90 degrees) or off-normal (about 0 degrees to about 89 degrees) to the axis of the laser diode output beam functioning to excite the phosphor. That is, the laser output beam is pointing toward the phosphor's emission surface at an angle of between 0 and 90 degrees, wherein 90 degrees (orthogonal) is considered normal incidence. The inherent geometry of this configuration wherein the laser beam is directed away from or in an opposite direction that the useful white light will exit the phosphor toward the outside world is ideal for safety. As a result of this geometry, if the phosphor get damaged or removed during operation or from tampering, the laser beam would not be directed to the outside world where it could be harmful. Instead, the laser beam would be incident on the backing surface where the phosphor was attached. With proper design of this backing surface the laser beam can be scattered, absorbed, or directed away from the outside world instead of exiting the white light source and into the surrounding environment.

In one embodiment of this reflective mode CPoS white light source the laser beam is configured normal to the primary phosphor emission surface. In this configuration the laser diode would be positioned in front of the primary emission surface of the phosphor where it could impede the useful white light emitted from the phosphor. This could create losses in or inefficiencies of the white light device and would lead to difficulty in efficiently capturing all white light emitted from the phosphor. Such optics and reflectors include, but are not limited to aspheric lenses or parabolic reflectors. To overcome the challenges of normal incident reflective mode phosphor excitation, in a preferable embodiment the laser beam would be configured with an incident angle that is off-axis to the phosphor such that it hits the phosphor surface at an angle of between 0 and 89 degrees or at a "grazing" angle. In this preferable embodiment the laser diode device is positioned adjacent to or to the side of the phosphor instead of in front of the phosphor where it will not substantially block or impede the emitted white light, and importantly, allow for optics such as collimating lenses or reflectors to access the useful light and project it to the application. Additionally, in this configuration the built in safety feature is more optimal than in the normal incidence configuration since when incident at an angle in the case of phosphor damage or removal the incident laser beam would not reflect directly off the back surface of the support member where the phosphor was attached. By hitting the surface at an off-angle or a grazing angle any potential reflected components of the beam can be directed to stay within the apparatus and not exit the outside environment where it can be a hazard to human beings, animals, and the environment.

Figure 18:
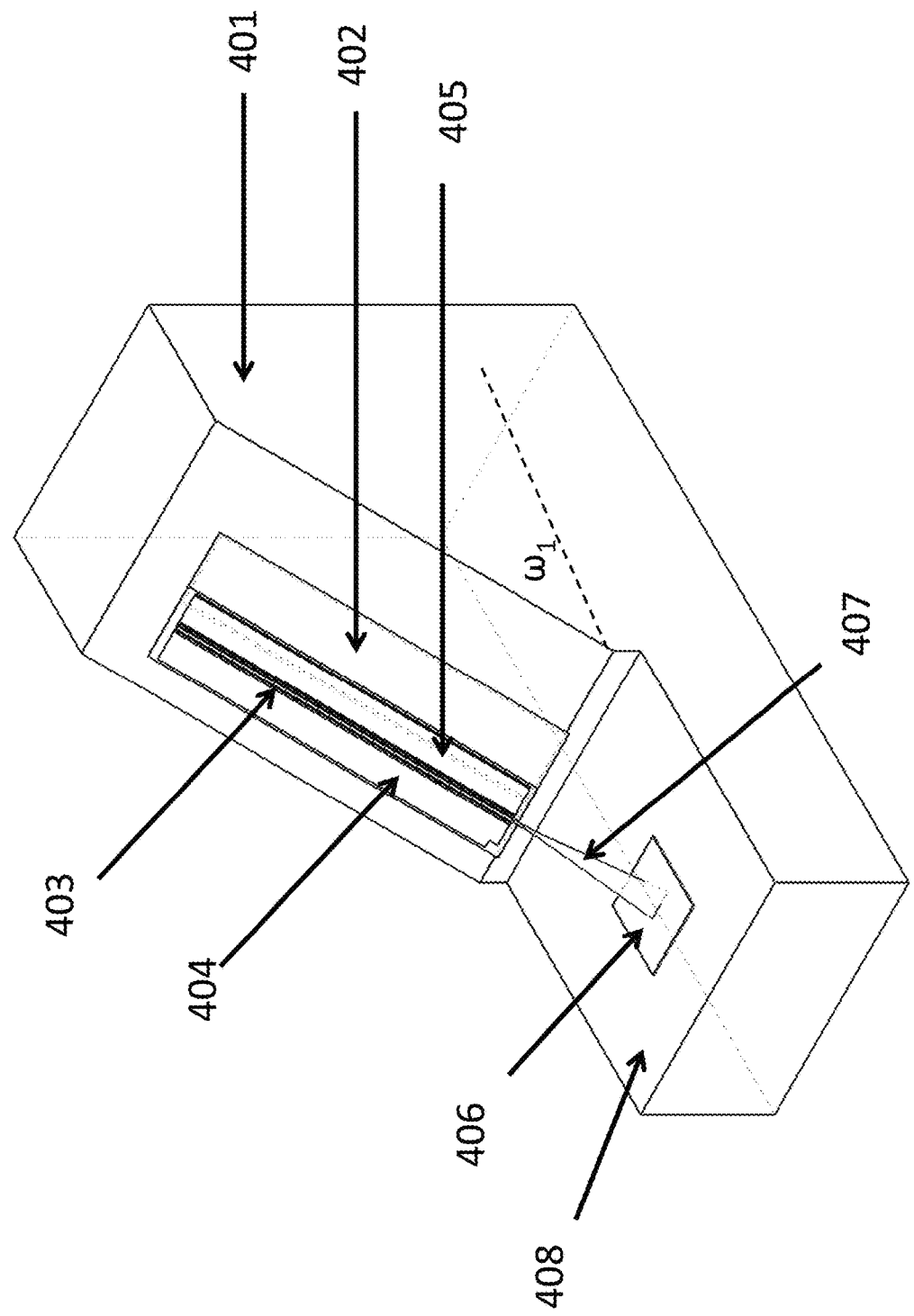
FIG. 18 is a simplified diagram illustrating an integrated laser-based white light source with a laser diode and phosphor member integrated onto a common support member wherein the phosphor is configured for reflective operation and the laser beam has an off-normal incidence to the phosphor according to an embodiment of the present invention.

FIG. 18 presents a schematic diagram illustrating an off-axis reflective mode embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based CPoS white light device is comprised of a common support member 401 that serves as the common support member configured to act as an intermediate material between a laser diode or laser diode CoS 402 formed in transferred gallium and nitrogen containing epitaxial layers 403 and a final mounting surface and as an intermediate material between the phosphor plate material 406 and a final mounting surface. The laser diode or CoS is configured with electrodes 404 and 405 that may be formed with deposited metal layers and combination of metal layers including, but not limited to Au, Pd, Pt, Ni, Al, titanium, or others. The laser beam output excites a phosphor plate 406 positioned in front of the output laser facet. The phosphor plate is attached to the common support member on a surface 408. The electrodes 404 and 405 are configured for an electrical connection to an external power source such as a laser driver, a current source, or a voltage source. Wirebonds can be formed on the electrodes to couple electrical power to the laser diode device to generate a laser beam 407 output from the laser diode and incident on the phosphor 406. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

The inherent divergence properties typical edge-emitting diode laser output beams leads to the beam expanding in both the x-direction (slow divergence axis) and y-direction (fast divergence axis) as it propagates in free/unguided space. Complicating matters is the different divergence rates of the beam on the fast and slow axis resulting from the waveguide confinement characteristics in the laser diode. For example, typical full width at half maximum (FWHM) beam divergences range from about 5-20 degrees in the slow axis and 10 to 40 degrees in the fast axis, but can be others. Another measure of divergence of the laser beam is the divergence angles taken at the point in the output beam where the power has dropped to the 1/e2 level. For this 1/e2 measure, typical beam divergences range from about 10-30 degrees in the slow axis and 20 to 80 degrees in the fast axis, but can be others. Thus, the ratio of the fast axis to slow axis divergence angles range from about 2:1 to about 4:1. The resulting projected spot from a free-space/unguided laser beam is an elliptical shape, typically with the fast axis diameter being greater than the slow axis diameter. For a laser beam configured for off-axis incidence in the fast direction as shown in FIG. 18 the elliptical nature of the beam would be exacerbated since the angle would increase the fast axis diameter D1.

In one embodiment of the present invention, the elliptical nature of the beam from the beam divergence and off-axis laser beam excitation incidence would be mitigating using a beam shaping optic such as a collimating optic. This optic would be positioned between the laser diode and the phosphor to shape and/or collimate the laser output beam prior to incidence with the phosphor. By placing a free space optic in front of the output laser beam the beam shape can be shaped to provide a circular beam profile and collimated such that the phosphor can be positioned at a distance in front of the facet with a large tolerance and maintain a relatively constant spot size. In one example an aspheric lens is used to collimate and/or shape the laser beam. In an alternative embodiment, the laser beam is collimated using fast axis collimating (FAC) and/or slow axis collimating (SAC) lenses. In alternative embodiments, other optics can be included in various combinations for the shaping, collimating, directing, filtering, or manipulating of the optical beam. Examples of such optics include, but are not limited to ball lenses, aspheric collimator, dichroic mirrors, turning mirrors, optical isolators, but could be others.

Figure 19:
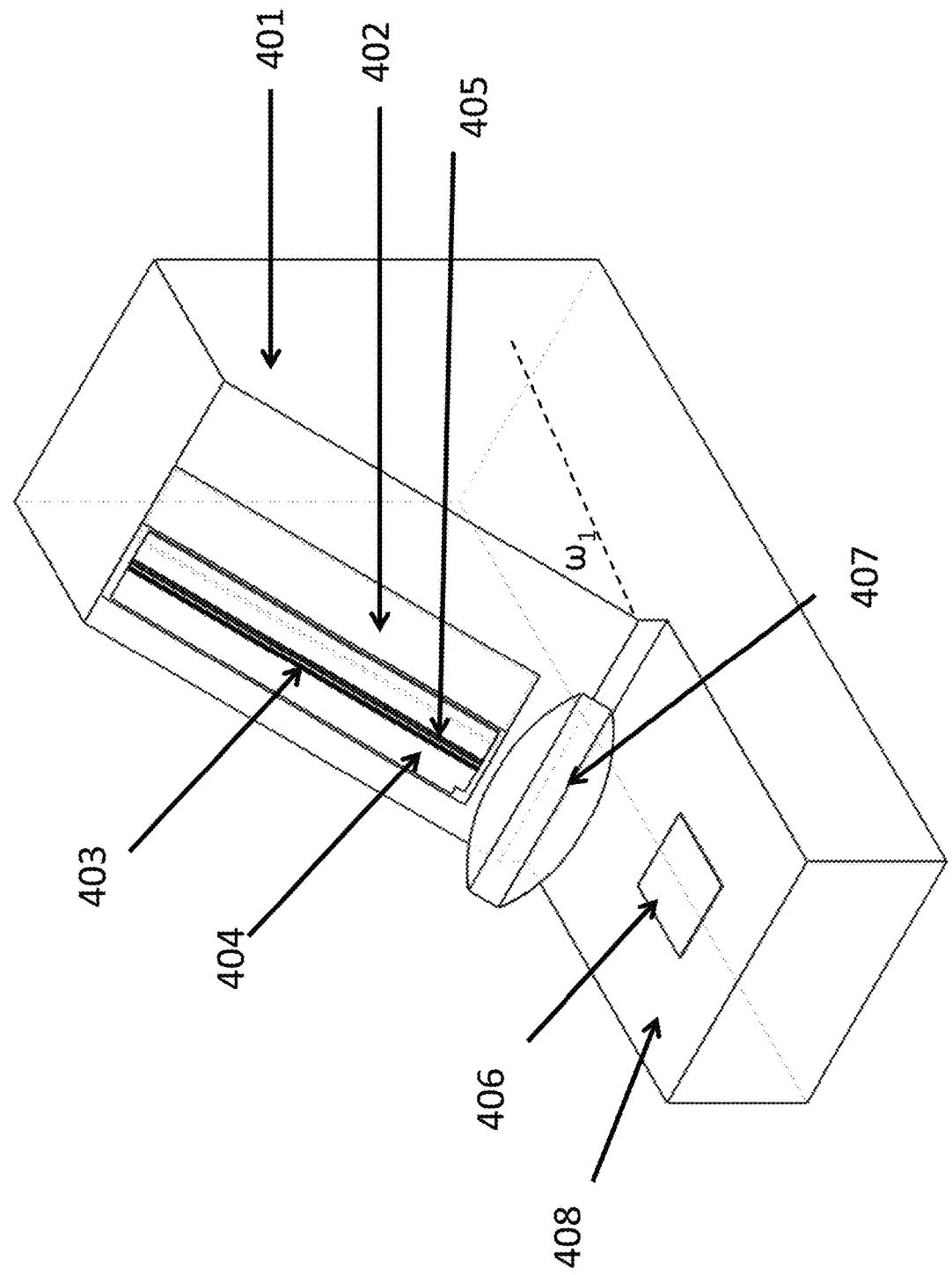
FIG. 19 is a simplified diagram illustrating an integrated laser-based white light source with a laser diode and phosphor member integrated onto a common support member wherein the phosphor is configured for off-axis reflective operation and the laser beam is configured with a collimating or shaping optic according to an embodiment of the present invention.

FIG. 19 presents a schematic diagram illustrating an off-axis reflective mode embodiment of a CPoS integrated white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based CPoS white light device is comprised of a common support member 401 that serves as the common support member configured to act as an intermediate material between a laser diode or laser diode CoS 402 formed in transferred gallium and nitrogen containing epitaxial layers 403 and a final mounting surface and as an intermediate material between the phosphor plate material 406 and a final mounting surface. The laser diode or CoS is configured with electrodes 404 and 405 that may be formed with deposited metal layers and combination of metal layers including, but not limited to Au, Pd, Pt, Ni, Al, titanium, or others. The laser beam is passed through an aspheric lens 407 for beam shaping and/or collimating prior to incidence on a phosphor plate 406. The phosphor plate is attached to the common support member on a surface 408. The electrodes 404 and 405 are configured for an electrical connection to an external power source such as a laser driver, a current source, or a voltage source. Wirebonds can be formed on the electrodes to couple electrical power to the laser diode device to generate a laser beam 407 output from the laser diode and incident on the phosphor 406. Of course this is merely an example of a configuration and there could be many variants on this embodiment including but not limited to different shape phosphors, different geometrical designs of the submount or common support member, different orientations of the laser output beam with respect to the phosphor, different electrode and electrical designs, and others.

In an alternative preferred off-axis reflective mode embodiment, beam shaping can be achieved by rotating the laser beam with respect to the tilted phosphor excitation surface. By rotating the laser about the axis of the beam emission, the phosphor tilt will shift from increasing the fast axis beam diameter to the increasing the slow axis beam diameter, and hence, compensate for the slower diverging slow axis beam axis diameter and make for a more circular beam. This dual-axis tilting or rotation embodiment of "optics-less" beam shaping is advantageous over embodiments where optical elements are introduced for beam shaping and collimation. The advantages of this embodiment for the white light source apparatus include a simplified design, a lower cost bill of materials, a lower cost assembly process, and potentially a more compact white light source. In one embodiment, the incident angle from the laser to the phosphor is optimized to achieve a desired beam shape on the phosphor.

By positioning the phosphor about 70 um away from the laser aperture a relative uniform beam can be realized with about a 50 um diameter. In addition to controlling the distance of the laser from the phosphor, the incident angle of the laser beam can also be used to control the shape of the beam incident on the phosphor. By tilting along this axis a larger fast axis diameter D1 is generated on the phosphor such that the beam spot becomes more elliptical. By the same principle, when rotating the phosphor or projection surface about the slow axis, the slow axis diameter D2 can be increased such that the spot diameter ratio becomes closer to 1 and the beam becomes more circular.

Figure 20:
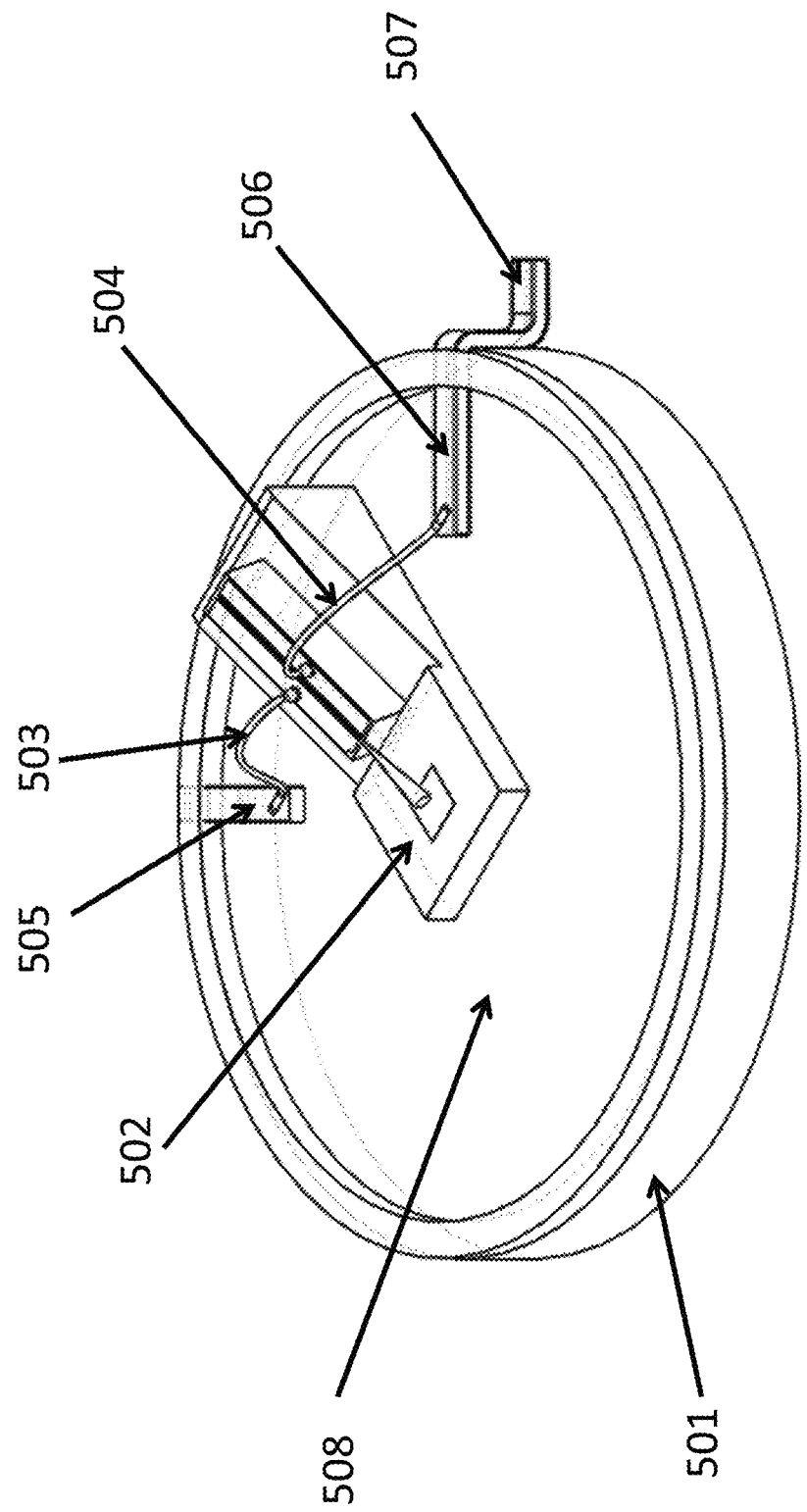
FIG. 20 is a simplified diagram illustrating a reflective mode phosphor integrated laser-based white light source mounted in a surface mount package according to an embodiment of the present invention.

An alternative example of a packaged CPoS white light source according to the present invention is provided in the schematic diagram of FIG. 20. In this example, a reflective mode white light source is configured in a surface mount device (SMD) type package. The example SMD package has a base member 501 with the reflective mode white light source 502 mounted on the base member wherein the base member is configured to conduct heat away from the white light source and to a heat sink. The base member is comprised of a thermally conductive material such as copper, copper tungsten, aluminum, SiC, steel, diamond, composite diamond, AlN, sapphire, or other metals, ceramics, or semiconductors The mounting to the base member can be accomplished using a soldering or gluing technique such as using AuSn solders, SAC solders, lead containing solders, indium, or other solders. The mounting joint could also be formed from thermally conductive glues, thermal epoxies, and other materials. Electrical connections from the p-electrode and n-electrode of the laser diode are made to using wirebonds 503 and 504 to internal feedthroughs 505 and 506. The feedthroughs are electrically coupled to external leads such as 507. The external leads can be electrically coupled to a power source to electrify the white light source and generate white light emission. The top surface 508 of the surface mount package may be comprised of or coated with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. Of course, the example is FIG. 20 is merely an example and is intended to illustrate one possible simple configuration of a surface mount packaged CPoS white light source. Specifically, since surface mount type packages are widely popular for LEDs and other devices and are available off the shelf they could be one option for a low cost and highly adaptable solution.

Figure 21:
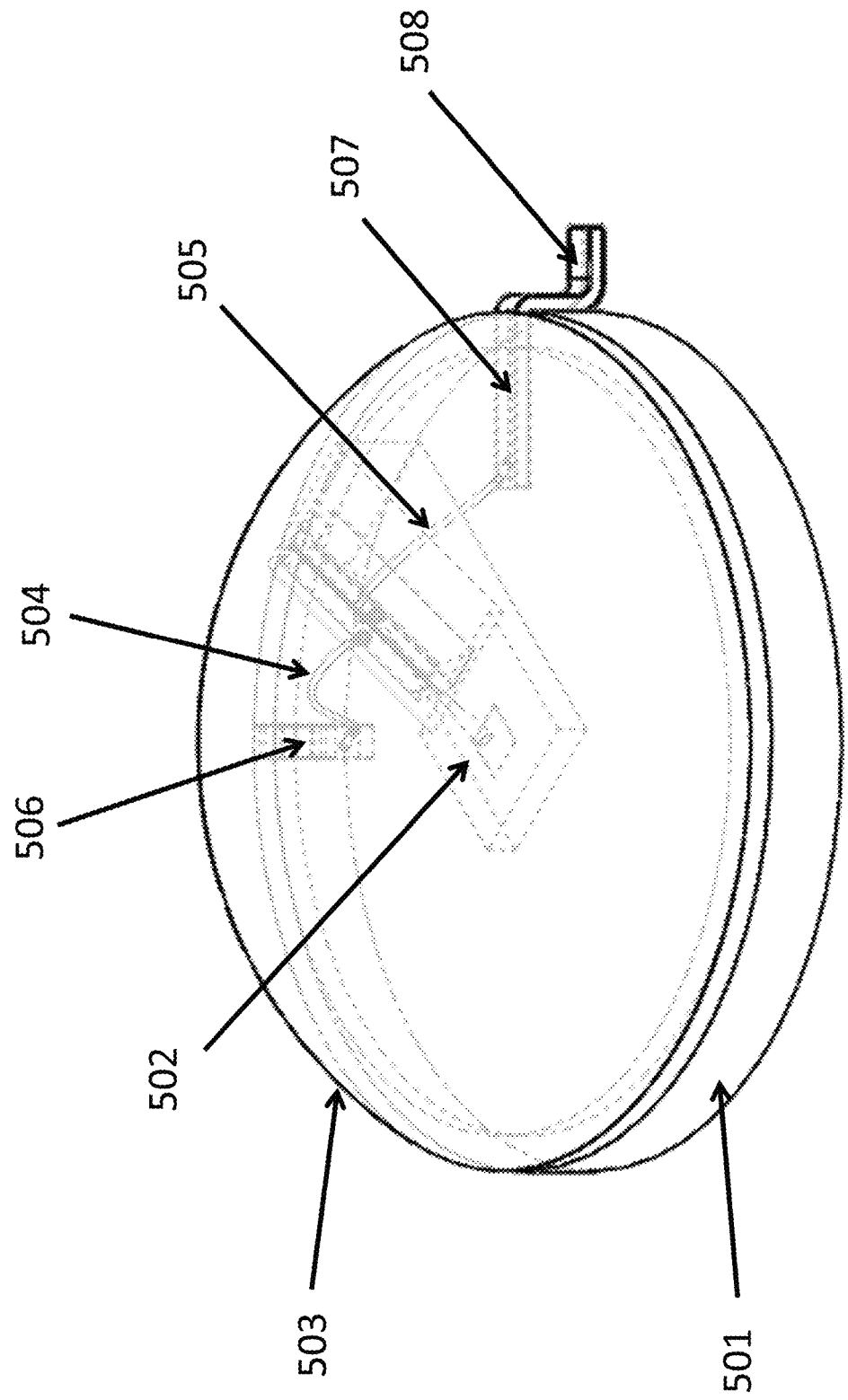
FIG. 21 is a simplified diagram illustrating a reflective mode phosphor integrated laser-based white light source mounted in a surface mount-type package and sealed with a cap member according to an embodiment of the present invention.

FIG. 21 is a schematic illustration of the CPoS white light source configured in a SMD type package as shown in FIG. 20, but with an additional cap member to form a seal around the white light source. As seen in FIG. 21, the SMD type package has a base member 501 with the white light source 502 mounted to the base. The mounting to the base can be accomplished using a soldering or gluing technique such as using AuSn solders, SAC solders, lead containing solders, indium, or other solders. Overlying the white light source is a cap member 503, which is attached to the base member around the sides. In an example, the attachment can be a soldered attachment, a brazed attachment, a welded attachment, or a glued attachment to the base member. The cap member has at least a transparent window region and in preferred embodiments would be primarily comprised of a transparent window region such as the transparent dome cap illustrated in FIG. 21. The transparent material can be a glass, a quartz, sapphire, silicon carbide, diamond, plastic, or any suitable transparent material. The sealing type can be an environmental seal or a hermetic seal, and in an example the sealed package is backfilled with a nitrogen gas or a combination of a nitrogen gas and an oxygen gas. Electrical connections from the p-electrode and n-electrode of the laser diode are made using wire bonds 504 and 505. The wirebonds connect the electrode to electrical feedthroughs 506 and 507 that are electrically connected to external leads such as 508 on the outside of the sealed SMD package. The leads are then electrically coupled to a power source to electrify the white light source and generate white light emission. In some embodiments, a lens or other type of optical element to shape, direct, or collimate the white light is included directly in the cap member. Of course, the example in FIG. 21 is merely an example and is intended to illustrate one possible configuration of sealing a white light source. Specifically, since SMD type packages are easily hermetically sealed, this embodiment may be suitable for applications where hermetic seals are needed.

Figure 22:
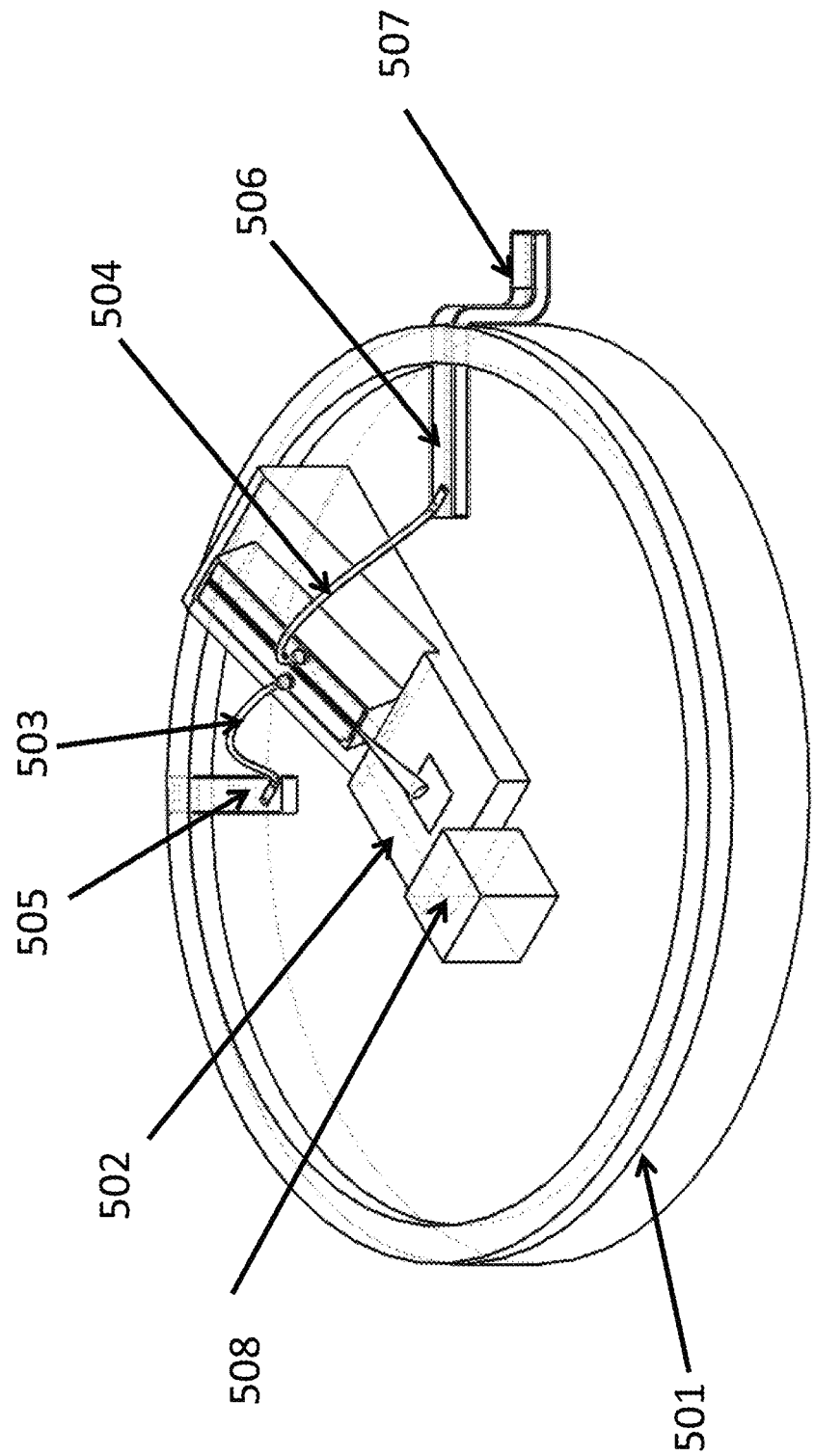
FIG. 22 is a simplified diagram illustrating a reflective mode phosphor integrated laser-based white light source mounted in a surface mount package with an integrated beam dump safety feature according to an embodiment of the present invention.

An example of a packaged CPoS white light source including a beam dump safety feature according to the present invention is provided in the schematic diagram of FIG. 22. In this example, a reflective mode white light source is configured in a surface mount device (SMD) type package. The example SMD package has a base member 501 with the reflective mode white light source 502 mounted on the base member wherein the base member is configured to conduct heat away from the white light source and to a heat sink. The base member is comprised of a thermally conductive material such as copper, copper tungsten, aluminum, SiC, steel, diamond, composite diamond, AlN, sapphire, or other metals, ceramics, or semiconductors The mounting to the base member can be accomplished using a soldering or gluing technique such as using AuSn solders, SAC solders, lead containing solders, indium, or other solders. The joint could also be formed from thermally conductive glues, thermal epoxies such as silver epoxy, thermal adhesives, and other materials. Alternatively the joint could be formed from a metal-metal bond such as a Au—Au bond. Electrical connections from the p-electrode and n-electrode of the laser diode are made to using wirebonds 503 and 504 to internal feedthroughs 505 and 506. The feedthroughs are electrically coupled to external leads such as 507. The external leads can be electrically coupled to a power source to electrify the white light source and generate white light emission. The example beam 508 is configured in the optical pathway of the laser diode in an event the phosphor were damage or removed and the laser beam was reflecting from the support member of the phosphor. In this example, the beam dump is shaped like a cube, but this is just an example and the shape, size, and location of the beam dump would be optimized based on providing the safety function while not unacceptably comprising efficiency of the white light source. In this example, the face of the beam dump configured to be in the optical pathway of the reflected beam could be configured from a porous material with deep cavities that propagate through the cube beam dump. Additionally, the beam dump could be comprised of an absorbing to absorb the laser beam and the beam is well heat sunk to the package member and a heat sink to dissipate the thermal energy generated during the absorption of the laser beam. The sides of the beam dump member 508 not positioned in the laser beam pathway could be comprised of a reflective material to increase the useful output white light. Moreover, all surfaces within the package including the laser diode member and submount member may be enhanced for increased reflectivity to help improve the useful white light output. In this configuration the white light source is not capped or sealed such that is exposed to the open environment. Of course, the example in FIG. 22 is merely an example and is intended to illustrate one possible simple configuration of a packaged CPoS white light source with a built in safety feature.

In many applications according to the present invention, the packaged integrated white light source will be attached to a heat sink member. The heat sink is configured to transfer the thermal energy from the packaged white light source to a cooling medium. The cooling medium can be an actively cooled medium such as a thermoelectric cooler or a microchannel cooler, or can be a passively cooled medium such as an air-cooled design with features to maximize surface and increase the interaction with the air such as fins, pillars, posts, sheets, tubes, or other shapes. The heat sink will typically be formed from one or more metal members, but can be others such as thermally conductive ceramics, semiconductors, or composites.

The heat sink member is configured to transport thermal energy from the packaged laser diode based white light source to a cooling medium. The heat sink member can be comprised of a metal, ceramic, composite, semiconductor, plastic and is preferably comprised of a thermally conductive material. Examples of candidate materials include copper which may have a thermal conductivity of about 400 W/(mK), aluminum which may have a thermal conductivity of about 200 W/(mK), 4H—SiC which may have a thermal conductivity of about 370 W/(mK), 6H—SiC which may have a thermal conductivity of about 490 W/(mK), AlN which may have a thermal conductivity of about 230 W/(mK), a synthetic diamond which may have a thermal conductivity of about >1000 W/(mK), a composite diamond, sapphire, or other metals, ceramics, composites, or semiconductors. The heat sink member may be formed from a metal such as copper, copper tungsten, aluminum, or other by machining, cutting, trimming, or molding.

The attachment joint joining the packaged white light source according to this invention to the heat sink member should be carefully designed and processed to minimize the thermal impedance. Therefore a suitable attaching material, interface geometry, and attachment process practice must be selected for an appropriate thermal impedance with sufficient attachment strength. Examples include AuSn solders, SAC solders, lead containing solders, indium solders, indium, and other solders. The joint could also be formed from thermally conductive glues, thermal epoxies such as silver epoxy, thermal adhesives, and other materials. Alternatively the joint could be formed from a metal-metal bond such as a Au—Au bond. The common support member with the laser and phosphor material is configured to provide thermal impedance of less than 10 degrees Celsius per watt or less than 5 degrees Celsius per watt of dissipated power characterizing a thermal path from the laser device to a heat sink.

Figure 23:
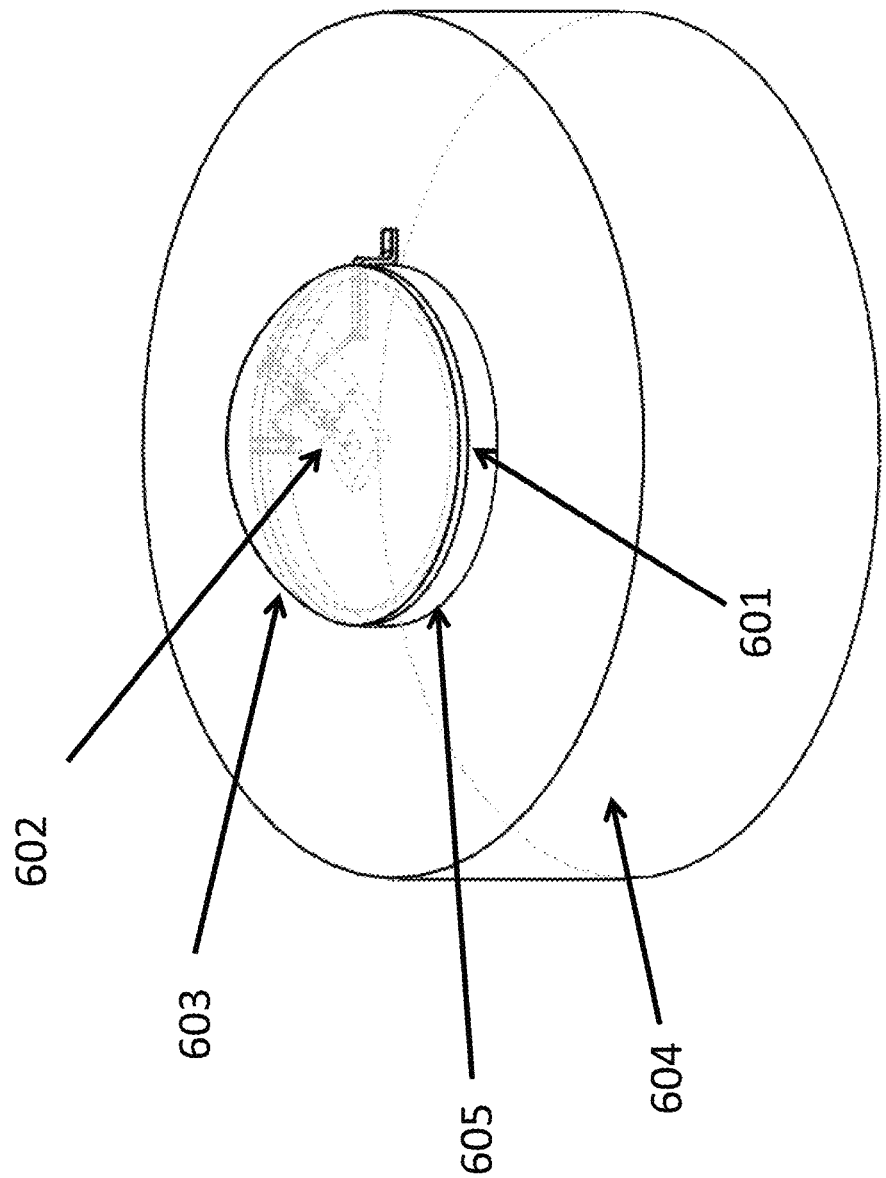
FIG. 23 is a simplified diagram illustrating a reflective mode phosphor integrated laser-based white light source mounted in a surface mount-type package, sealed with a cap member, and mounted on a heat-sink according to an embodiment of the present invention.

FIG. 23 is a schematic illustration of a CPoS white light source configured in a sealed SMD mounted on a heat sink member according to the present invention. The sealed white light source in an SMD package is similar to that example shown in FIG. 21. As seen in FIG. 23, the SMD type package has a base member 601 with the white light source 602 mounted to the base and a cap member 603 providing a seal for the light source. The mounting to the base can be accomplished using a soldering or gluing technique such as using AuSn solders, SAC solders, lead containing solders, indium, or other solders. The cap member has at least a transparent window region. The transparent material can be a glass, a quartz, sapphire, silicon carbide, diamond, plastic, or any suitable transparent material. The base member of the SMD package is attached to a heat sink member 604. The heat sink member can be comprised of a material such as a metal, ceramic, composite, semiconductor, or plastic and is preferably comprised of a thermally conductive material. Examples of candidate materials include aluminum, copper, copper tungsten, steel, SiC, AlN, diamond, a composite diamond, sapphire, or other materials. Of course, the example in FIG. 23 is merely an example and is intended to illustrate one possible configuration of a white light source according to the present invention mounted on a heat sink. Specifically, the heat sink could include features to help transfer heat such as fins.

In some embodiments of this invention, the CPoS integrated white light source is combined with one or more optical members to manipulate the generated white light. In an example the white light source could serve in a spot light system such as a flashlight or an automobile headlamp or other light applications where the light must be directed or projected to a specified location or area. As an example, to direct the light it should be collimated such that the photons comprising the white light are propagating parallel to each other along the desired axis of propagation. The degree of collimation depends on the light source and the optics using to collimate the light source. For the highest collimation a perfect point source of light with 4 pi emission and a sub-micron or micron-scale diameter is desirable. In one example, the point source is combined with a parabolic reflector wherein the light source is placed at the focal point of the reflector and the reflector transforms the spherical wave generated by the point source into a collimated beam of plane waves propagating along an axis.

In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector.

In an another example a simple singular lens or system of lenses is used to collimate the white light into a projected beam. In a specific example, a single aspheric lens is place in front of the phosphor member emitting white light and configured to collimate the emitted white light. In another embodiment, the lens is configured in the cap of the package containing the integrated white light source. In some embodiments, a lens or other type of optical element to shape, direct, or collimate the white light is included directly in the cap member. In an example, the lens is comprised of a transparent material such as a glass, SiC, sapphire, quartz, a ceramic, a composite, or a semiconductor.

Such white light collimating optical members can be combined with the white light source at various levels of integration. For example, the collimating optics can reside within the same package as the integrated white light source in a co-packaged configuration. In a further level of integration the collimating optics can reside on the same submount or support member as the white light source. In another embodiment, the collimating optics can reside outside the package containing the integrated white light source.

Figure 24:
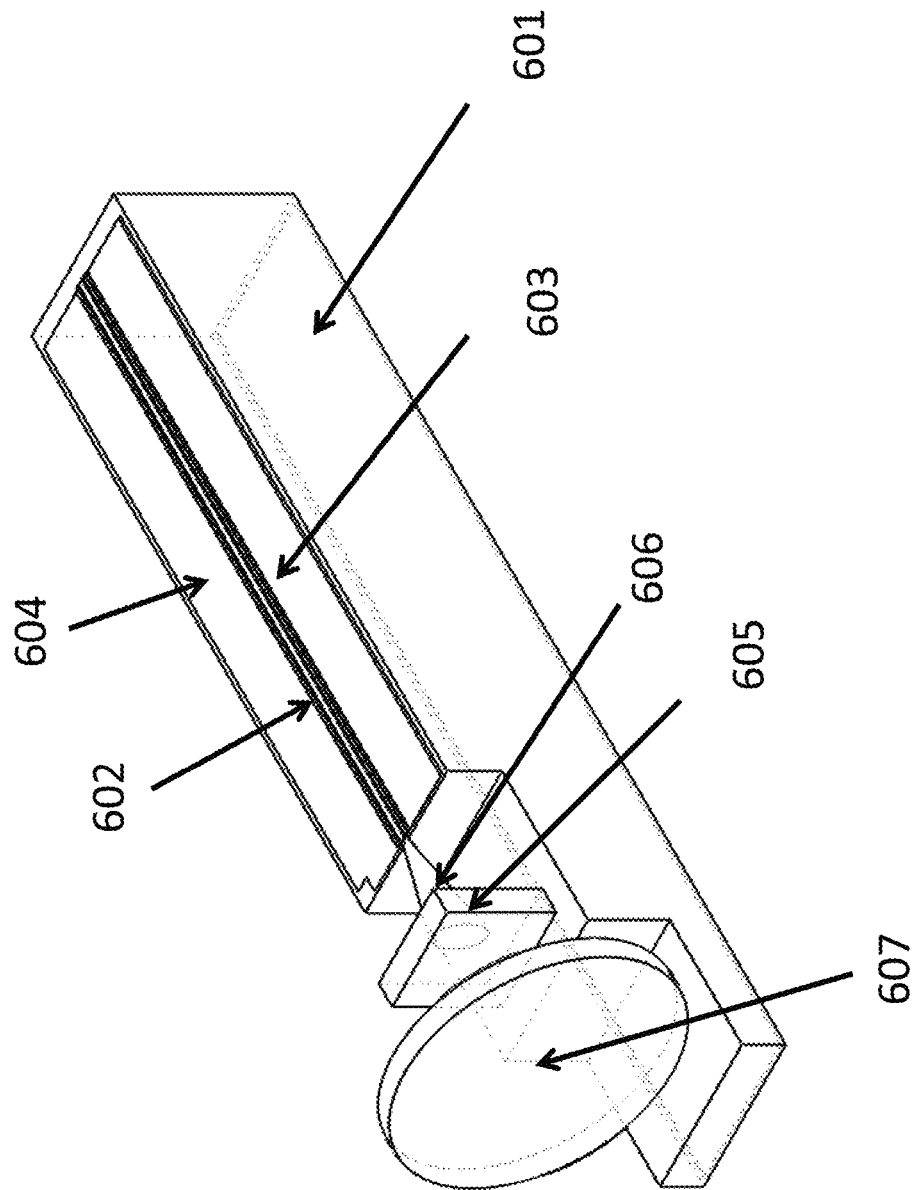
FIG. 24 is a simplified diagram illustrating an integrated laser-based white light source operating in transmissive mode with a collimating lens according to an embodiment of the present invention.

FIG. 24 presents a schematic diagram illustrating a transmissive phosphor embodiment of an integrated white light source including a white light collimating optic according to the present invention. In this embodiment the gallium and nitrogen containing lift-off and transfer technique is deployed to fabricate a very small and compact submount member with the laser diode chip formed from transferred epitaxy layers. Of course, a conventional chip on submount embodiment could be used for this integrated collimated white light embodiment. The laser based CPoS white light device is comprised of submount material 601 that serves as the common support member configured to act as an intermediate material between a laser diode 602 formed in transferred gallium and nitrogen containing epitaxial layers and a final mounting surface and as an intermediate material between the phosphor plate material 605 and a final mounting surface. The laser diode and/or submount is configured with electrodes 603 and 604 that may be formed with deposited metal layers and combination of metal layers including, but not limited to Au, Pd, Pt, Ni, Al, titanium, or others. Wirebonds can be configured to couple the electrical power to the electrodes 603 and 604 on the laser diode. The laser beam 606 is incident on the phosphor to form a white a light exiting the phosphor. The white light exiting the phosphor member is coupled into a lens such as an aspheric lens 607 for collimation and beam shaping. The electrodes 603 and 604 are configured for an electrical connection to an external power source such as a laser driver, a current source, or a voltage source. Wirebonds can be formed on the electrodes to couple electrical power to the laser diode device to generate a laser beam output from the laser diode. Of course this is merely an example of a configuration with an integrated collimating optic and there could be many variants on this embodiment including using a conventional chip on submount configuration for integration of the collimation optic with the laser diode and phosphor. In other alternatives phosphors with different sizes and shapes can be used, different geometrical designs of the submount or common support member can be used, different orientations of the laser output beam with respect to the phosphor can be deployed, and different electrode and electrical designs can be implemented, and others.

Figure 25:
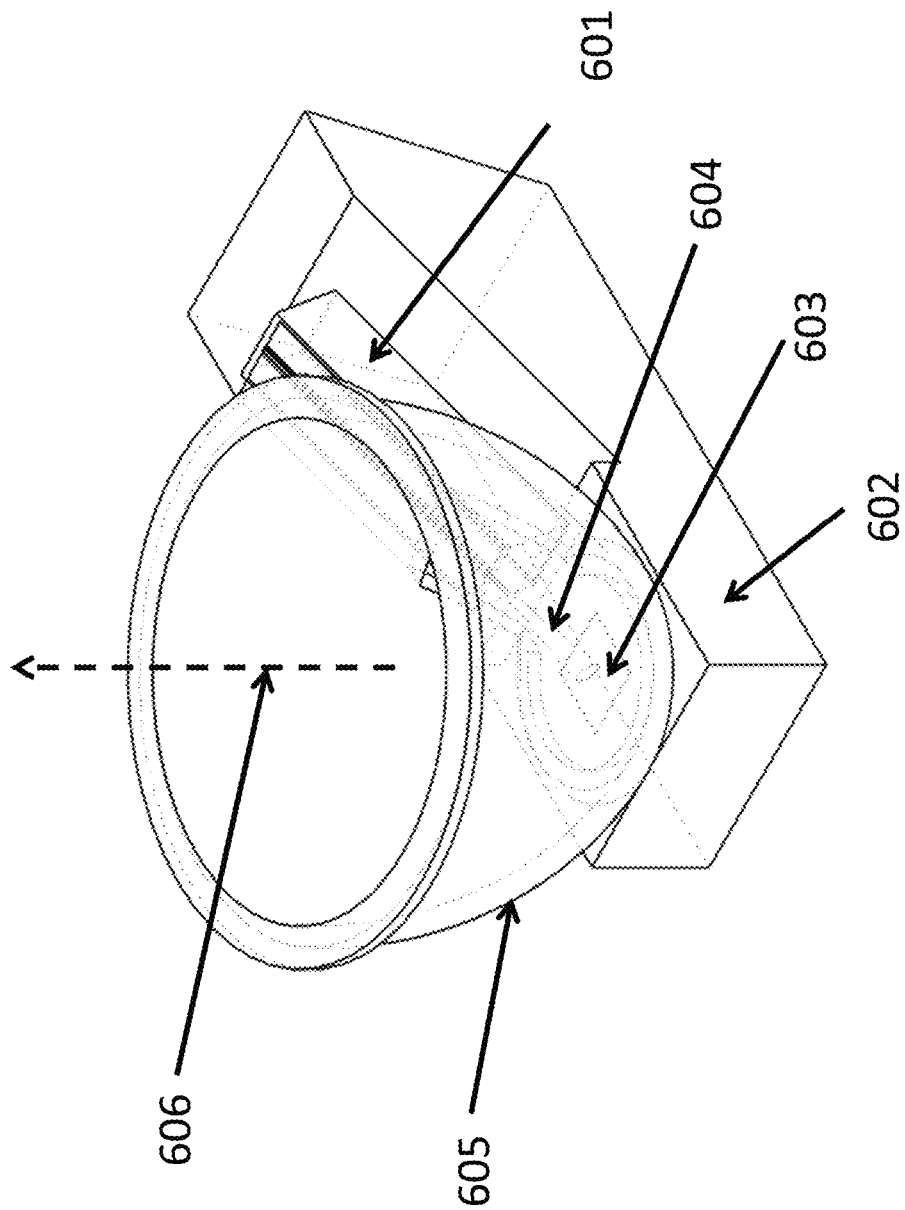
FIG. 25 is a simplified diagram illustrating an integrated laser-based white light source operating in reflective mode with a collimating reflector according to an embodiment of the present invention.

FIG. 25 presents a schematic diagram illustrating a reflective mode phosphor embodiment of an integrated white light source, but also including a reflector optic such as a parabolic reflector to collimate the white light according to the present invention. In this embodiment the gallium and nitrogen containing laser diode 601 or chip on submount is mounted on a common support member 602 which could be the submount member for the laser diode. The common support member also supports the phosphor member 603 configured to be located in the pathway of the laser diode output beam 604, wherein the laser diode beam can excite the phosphor and emit a white light. A reflector member 605 such as a parabolic reflector is positioned with respect to the primary emission surface of the phosphor member such that the phosphor member is near the focal point of the reflector. The reflector is configured to collect the white emission from the phosphor and collimate it into a beam of white light projected along an axis 606. The reflector member is configured with an opening or other entry for the laser beam 604 to enter inside the reflector to interact with the phosphor. In other alternatives phosphors with different sizes and shapes can be used, different geometrical designs of the submount or common support member can be used, different orientations of the laser output beam with respect to the phosphor can be deployed, different collimation optics or other optics can be used, and different electrode and electrical designs can be implemented, and others.

Figure 26:
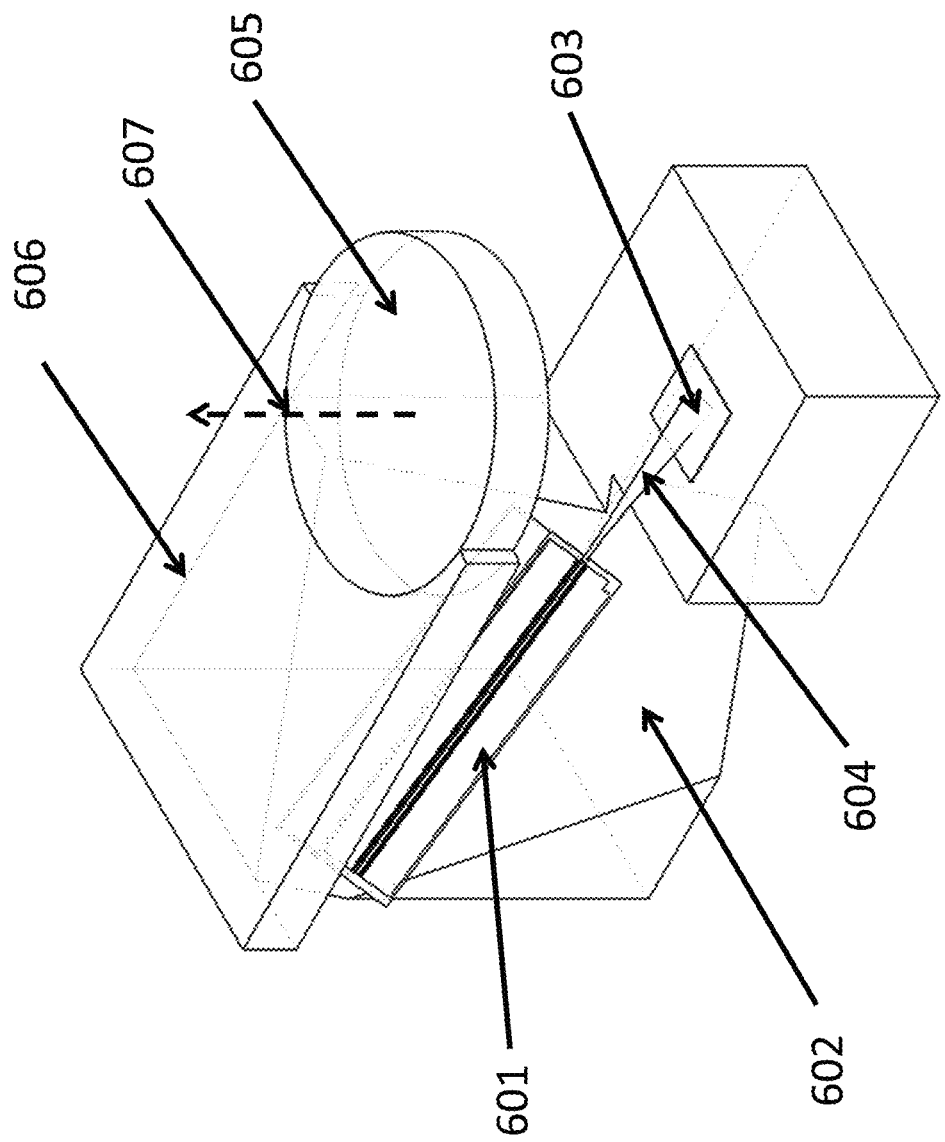
FIG. 26 is a simplified diagram illustrating an integrated laser-based white light source operating in reflective mode with a collimating lens according to an embodiment of the present invention.

FIG. 26 presents a schematic diagram illustrating a reflective mode phosphor embodiment of an integrated white light source, but also including a lens such as an aspheric lens to collimate the white light according to the present invention. In this embodiment the gallium and nitrogen containing laser diode 601 or chip on submount is mounted on a common support member 602 which could be the submount member for the laser diode. The common support member also supports the phosphor member 603 configured to be located in the pathway of the laser diode output beam 604, wherein the laser diode beam can excite the phosphor and emit a white light. A lens member 605 such as an aspheric lens is positioned in front of or above the primary emission surface from the phosphor member. The lens is configured to collect the white emission from the phosphor and collimate it into a beam of white light projected along an axis 606. The lens member is supported by a mechanical support member, which can be an additional member 607 or can be supported directly by the common support member. In other alternatives phosphors with different sizes and shapes can be used, different geometrical designs of the submount or common support member can be used, different orientations of the laser output beam with respect to the phosphor can be deployed, different collimation optics or other optics can be used, and different electrode and electrical designs can be implemented, and others.

In an alternative embodiment, FIG. 27 provides a schematic illustration of a white light source according to this invention configured in an SMD-type package as shown in FIG. 21, but with an additional parabolic member configured to collimate and project the white light. The example configuration for a collimated white light from SMD-type package according to FIG. 27 comprises an SMD type package 601 comprising a based and a cap or window region and the integrated white light source 602. The SMD package is mounted to a heat-sink member 603 configured to transport and/or store the heat generated in the SMD package from the laser and phosphor member. A reflector member 604 such as a parabolic reflector is configured with the white light emitting phosphor member of the white light source at or near the focal point of the parabolic reflector. The parabolic reflector functions to collimate and project the white light along the axis of projection 605. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

In an alternative embodiment, FIG. 28 provides a schematic illustration of a white light source according to this invention configured in an SMD-type package, but with an additional lens member configured to collimate and project the white light. The example configuration for a collimated white light from SMD-type package according to FIG. 28 comprises an SMD type package 601 comprising a based and a cap or window region and the integrated white light source 602. The SMD package is mounted to a heat-sink member 603 configured to transport and/or store the heat generated in the SMD package from the laser and phosphor member. A lens member 604 such as an aspheric lens is configured with the white light emitting phosphor member of the white light source to collect and collimate a substantial portion of the emitted white light. The lens member is supported by support members 605 to mechanically brace the lens member in a fixed position with respect to the white light source. The support members can be comprised of metals, plastics, ceramics, composites, semiconductors or other. The lens member functions to collimate and project the white light along the axis of projection 606. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

In an embodiment according to the present invention, FIG. 29 provides a schematic illustration of a white light source according to this invention configured in an SMD-type package, but with an additional lens member and reflector member configured to collimate and project the white light. The example configuration for a collimated white light from SMD-type package according to FIG. 29 comprises an SMD type package 601 comprising a based and a cap or window region and the integrated white light source 602. The SMD package is mounted to a heat-sink member 603 configured to transport and/or store the heat generated in the SMD package from the laser and phosphor member. A lens member 604 such as an aspheric lens is configured with the white light source to collect and collimate a substantial portion of the emitted white light. A reflector housing 605 or lens member is configured between the white light source and the lens member to reflect any stray light or light that would not otherwise reach the lens member into the lens member for collimation and contribution to the collimated beam. In one embodiment the lens member is supported by the reflector housing member to mechanically brace the lens member in a fixed position with respect to the white light source. The lens member functions to collimate and project the white light along the axis of projection 606. Of course, this is merely an example and is intended to illustrate one possible configuration of combining the integrated white light source according to this invention with a reflector collimation optic. In another example, the collimating reflector could be integrated into the window member of the cap or could be included within the package member. In a preferred embodiment, the reflector is integrated with or attached to the submount.

A further understanding of the nature and advantages of the present invention may be realized by reference to the latter portions of the specification and attached drawings.

In all of the side pumped and transmissive and reflective embodiments of this invention the additional features and designs can be included. For example shaping of the excitation laser beam for optimizing the beam spot characteristics on the phosphor can be achieved by careful design considerations of the laser beam incident angle to the phosphor or with using integrated optics such as free space optics like collimating lens. Safety features can be included such as passive features like physical design considerations and beam dumps and/or active features such as photodetectors or thermistors that can be used in a closed loop to turn the laser off when a signal is indicated. Moreover, optical elements can be included to manipulate the generated white light. In some embodiments reflectors such as parabolic reflectors or lenses such as collimating lenses are used to collimate the white light or create a spot light that could be applicable in an automobile headlight, flashlight, spotlight, or other lights.

In one embodiment, the present invention provides a laser-based white light source comprising a form factor characterized by a length, a width, and a height. The apparatus has a support member and at least one gallium and nitrogen containing laser diode devices and phosphor material overlying the support member. The laser device is capable of an emission of a laser beam with a wavelength preferably in the blue region of 425 nm to 475 nm or in the ultra violet or violet region of 380 nm to 425 nm, but can be other such as in the cyan region of 475 nm to 510 nm or the green region of 510 nm to 560 nm. In a preferred embodiment the phosphor material can provide a yellowish emission in the 560 nm to 580 nm range such that when mixed with the blue emission of the laser diode a white light is produced. In other embodiments phosphors with red, green, yellow, and even blue emission can be used in combination with the laser diode excitation source to produce a white light with color mixing. The apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In other embodiments free space optics such as collimating lenses can be used to shape the beam prior to incidence on the phosphor. The beam can be characterized by a polarization purity of greater than 60% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning. In an example, the laser beam incident on the phosphor has a power of less than 0.1 W, greater than 0.1 W, greater than 0.5 W, greater than 1 W, greater than 5 W, greater than 10 W, or greater than 10 W. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material. The white light apparatus also has an electrical input interface configured to couple electrical input power to the laser diode device to generate the laser beam and excite the phosphor material. The white light source configured to produce greater than 1 lumen, 10 lumens, 100 lumens, 1000 lumens, or greater of white light output. The support member is configured to transport thermal energy from the at least one laser diode device and the phosphor material to a heat sink. The support member is configured to provide thermal impedance of less than 10 degrees Celsius per watt or less than 5 degrees Celsius per watt of dissipated power characterizing a thermal path from the laser device to a heat sink. The support member is comprised of a thermally conductive material such as copper, copper tungsten, aluminum, SiC, sapphire, AlN, or other metals, ceramics, or semiconductors.

According to an embodiment, the present invention provides a dynamic laser-based light source or light projection apparatus including a micro-display such as a microelectromechanical system (MEMS) scanning mirror, or "flying mirror" or a digital light processing (DLP) chip to dynamically modify the spatial pattern and/or the color of the emitted light. In one embodiment the light is pixelated to activate certain pixels and not activate other pixels to form a spatial pattern or image of white light. In another example, the dynamic light source is configured for steering or pointing the light beam. The steering or pointing can be accomplished by a user input configured from a dial, switch, or joystick mechanism or can be directed by a feedback loop including sensors.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes one or more of a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a microelectromechanical system (MEMS) scanning mirror, or "flying mirror", configured to project the laser light or laser pumped phosphor white light to a specific location to the outside world. By rastering the laser beam using the MEMS mirror a pixel in two dimensions can be formed to create a pattern or image.

According to an embodiment, the present invention includes a housing having an aperture and an input interface for receiving one or more signals such as frames of images. The dynamic light system also includes a processing module. In one embodiment, the processing module is electrically coupled to an ASIC for driving the laser diode and the MEMS scanning mirrors.

In one embodiment, a laser driver module is provided. Among other things, the laser driver module is adapted to adjust the amount of power to be provided to the laser diode. For example, the laser driver module generates a drive current based one or more pixels from the one or more signals such as frames of images, the drive currents being adapted to drive a laser diode. In a specific embodiment, the laser driver module is configured to generate pulse-modulated signal at a frequency range of about 50 to 300 MHz.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes one or more of a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a laser driver module coupled to the laser source. The apparatus can include a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip.

The apparatus can include a laser driver module coupled to the laser source. The apparatus includes an optical member provided within proximity of the laser source, the optical member being adapted to direct the laser beam to the digital light processing chip. The apparatus includes a power source electrically coupled to the laser source and the digital light processing chip. In one embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode.

In a specific embodiment of the present invention including a dynamic light source, the dynamic feature is activated by a feedback loop including a sensor. Such sensors may be selected from, but not limited to a microphone, geophone, hydrophone, a chemical sensor such as a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video sensor, transducer, image sensor, infrared sensor, SONAR, LIDAR, or others.

In one example of a dynamic light feature including a feedback loop with a sensor a motion sensor is included. The dynamic light source is configured to illuminate a location where the motion is detected by sensing the spatial of position of the motion and steering the output beam to that location. In another example of a dynamic light feature including a feedback loop with a sensor an accelerometer is included. The accelerometer is configured to anticipate where the laser light source apparatus is moving toward and steer the output beam to that location even before the user of the apparatus can move the light source to be pointing at the desired location. Of course, these are merely examples of implementations of dynamic light sources with feedback loops including sensors. There can be many other implementations of this invention concept that includes combining dynamic light sources with sensors.

Figure 30A:
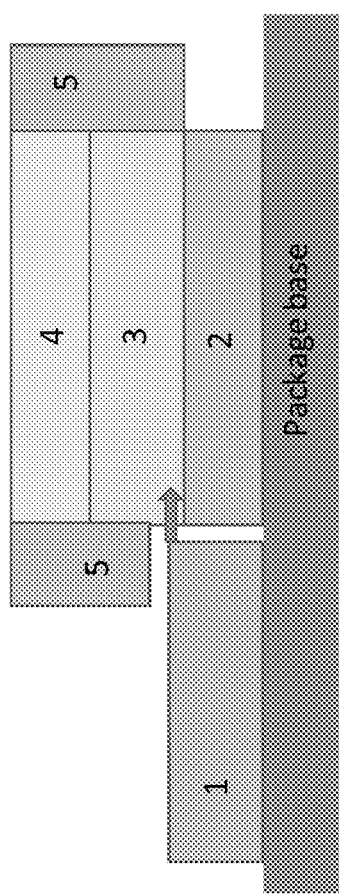
FIGS. 30A-30D are simplified cross-sectional views of a phosphor integrated laser-based light source according to some embodiments of the present invention.

FIG. 30A is a simplified cross-sectional view of a phosphor integrated laser-based light source according to an embodiment of the present invention. The light source includes a laser diode chip 1 arranged on a package base so that a facet is positioned to emit light into a cavity or groove formed in a top surface of a material 2 and/or formed in a bottom surface of an optically transparent material 3. Alternatively, the light may be emitted directly into the optically transparent material 3. The laser diode chip 1 may be formed in accordance with any of the embodiments described herein. The laser diode chip 1 may include one or more laser diodes, and the light may be, for example, a laser beam with a wavelength in a blue or another color region. The light can be injected directly from the laser diode chip 1 or via a light guide.

In some embodiments, the package base may be a printed circuit board (PCB). In other embodiments, the package base may be a bottom portion of a semiconductor package that is configured to conduct heat from the laser diode chip 1 and the material 2 to structures below, such as solder, a metal core PCB, a heat sink, or the like. The package base may also include a metal slug (e.g., Cu or Al), other metals plated, or a composite of ceramic materials (e.g., AlN, $Al_2O_3$) with metals. In yet other embodiments, the package base may be a slab of metal (e.g., Cu or Al) and form a part of a metal core PCB such as a chip on board (COB).

In an embodiment where the laser diode chip 1 emits light into the groove, the groove may constitute an air gap between the material 2 and the optically transparent material 3. A top surface of the material 2 and/or an inside of the groove may be covered with a reflective coating to direct and/or reflect the light upward. The reflective coating may be, for example, silver (Ag) or aluminum (Al), and the reflective coating may be deposited either as a flat specular film if the surface is smooth or a rough film producing a diffuse reflectance if the surface is rough.

The material 2 directs and/or reflects at least a portion of the light from the laser diode chip 1 in an upward direction towards the optically transparent material 3. The material 2 may have a high thermal conductivity to conduct heat from the optically transparent material 3 and/or a wavelength conversion material 4 to the package base. In some embodiments, the material 2 may include silicon (Si), silicon carbide (SiC), germanium (Ge), gallium arsenide (GaAs), sapphire, ceramic aluminum nitride (AlN), ceramic aluminum oxide ($Al_2O_3$, ceramic boron nitride (BN), aluminum (Al), copper (Cu), or other thermally conductive materials.

Figure 35:
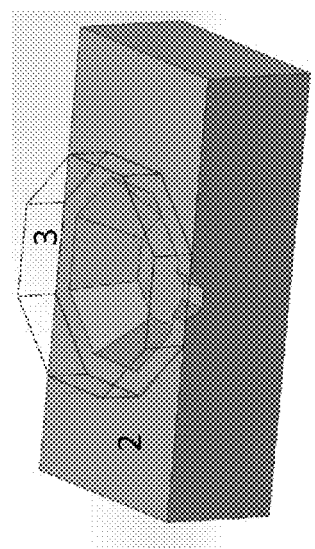
FIG. 35 is a simplified perspective view of a material with a groove formed on the top surface according to another embodiment of the present invention.

If the material 2 is Si, the groove can be formed with KOH etching to produce angled sidewalls. Many variations on the shape of the groove are possible. FIG. 35 provides an example of a groove with a narrow neck that opens up into a polygon shape. In some embodiments, the optically transparent material 3 may have a shape similar to that of the groove. For example, FIG. 35 includes an outline of the optically transparent material 3 having the polygon shape similar to the groove. In some embodiments, the groove may be partially or completely filled with a diffuse volume scatterer (e.g., $TiO_2$ or $Al_2O_3$ particles in a low refractive index matrix such as glass, epoxy, or silicone).

The optically transparent material 3 may be optically transparent and thermally conductive. Example materials include single crystalline SiC, sapphire, diamond, and transparent crystals from the garnet or spinel groups. The optically transparent material 3 allows the light to pass from the laser diode chip 1 to the wavelength conversion material 4 and conducts heat from the wavelength conversion material 4 to the material 2. The optically transparent material 3 may scatter light incident from other elements. Top and bottom surfaces of the optically transparent material 3 can be smooth or rough. A rough surface serves the purpose of scattering light and can help create good color uniformity of the light emitted from a top surface of the wavelength conversion material 4. In an embodiment, a thickness of the optically transparent material 3 may be between about 100-250 or about 20-50% of a lateral dimension of between about 300-1000 μm. A shape of the optically transparent material 3 as seen from a top view is not limited and can be square, rectangle, hexagon octagon, circle, or any other shape.

The wavelength conversion material 4 down-converts all or a portion of the light from the laser diode chip 1. The wavelength conversion material 4 may be formed and/or configured in accordance with any of the embodiments described herein. In an example, the wavelength conversion material 4 may be Ce-doped YAG. In some embodiments, the wavelength conversion material 4 may have inclusions of voids or other materials with a different refractive index that cause the light to scatter. The wavelength conversion material 4 may be single crystalline or sintered smaller particles. In some embodiments, the wavelength conversion material 4 may be Ce-doped YAG/Sapphire Eutectic Crystal. In an embodiment, a thickness of the wavelength conversion material 4 may be between about 50-800 μm, and a lateral dimension may be between about 300-1000 μm. A shape of the wavelength conversion material 4 as seen from a top view is not limited and can be square, rectangle, hexagon, octagon, circle, or any other shape.

Figure 30C:
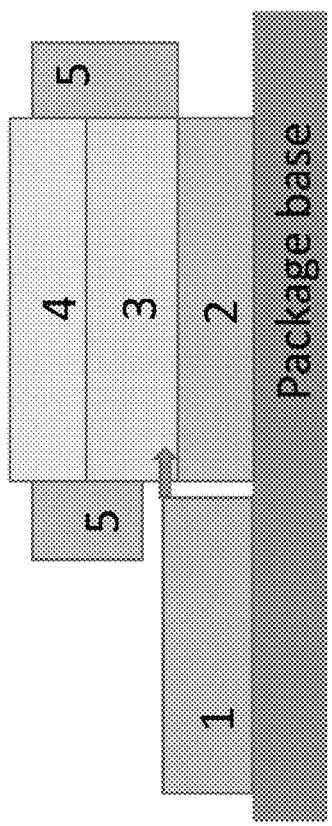
Figure 30B:
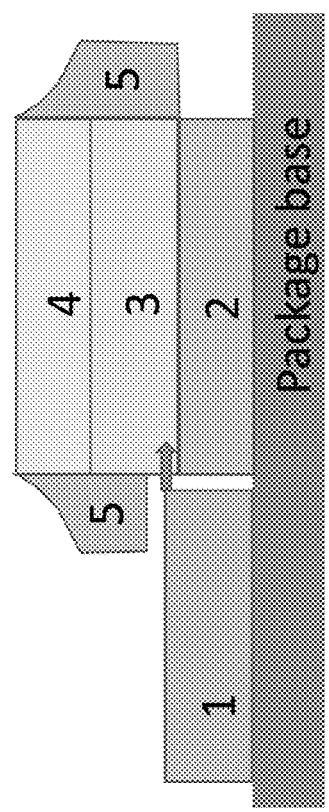
Figure 30D:
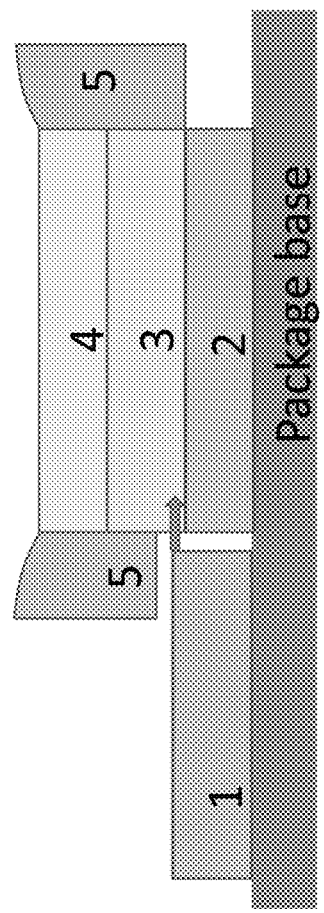

A reflective material 5 reflects light incident from sides of the optically transparent material 3 and the wavelength conversion material 4. The reflective material 5 may cover a part or all of the sides of the optically transparent material 3 and the wavelength conversion material 4 where light can be emitted. Example shapes of the reflective material 5 are shown in FIGS. 30B-30C. If the light from the laser diode chip 1 is injected directly into the optically transparent material 3, the reflective material 5 may be omitted from the area of the optically transparent material 3 where the laser diode chip 1 injects light into the optically transparent material 3. The reflective material 5 may be a diffuse volume scatterer (e.g., $TiO_2$ or $Al_2O_3$ particles in a low refractive index matrix such as glass, epoxy, or silicone). The reflective material 5 can also be a thin film coating (e.g. $SiO_2$/Ag or Ag) on the sidewalls of the optically transparent material 3 and the wavelength conversion material 4. A lateral thickness of the reflective material 5 may be between about 50-500 µm if it is a diffuse volume scatterer, and it may be between about 50 nm to 10 µm if it is a thin film coating. A height of the reflective material 5 may be approximately equal to a thickness of the optically transparent material 3 plus a thickness of the wavelength conversion material 4.

Figure 31:
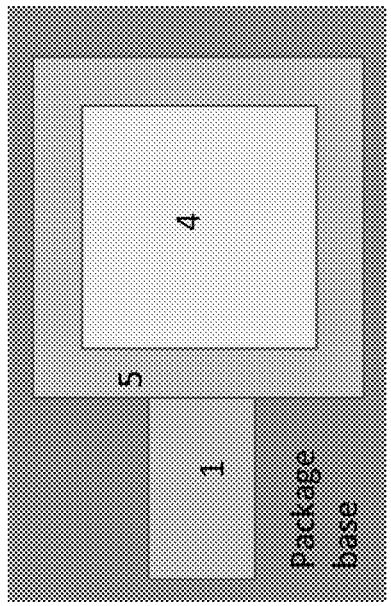
FIG. 31 is a simplified top view of the phosphor integrated laser-based light source of one of FIGS. 30A-30D according to an embodiment of the present invention.

FIG. 31 is a simplified top view of the phosphor integrated laser-based light source of one of FIGS. 30A-30D according to an embodiment of the present invention. In this example, the reflective material 5 surrounds the sides of the wavelength conversion material 4.

Figure 33:
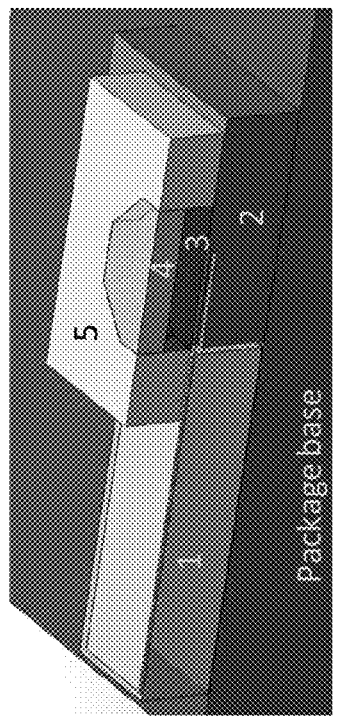
FIG. 33 is a simplified cross-sectional perspective view of the phosphor integrated laser-based light source of FIG. 32 according to an embodiment of the present invention.
Figure 32:
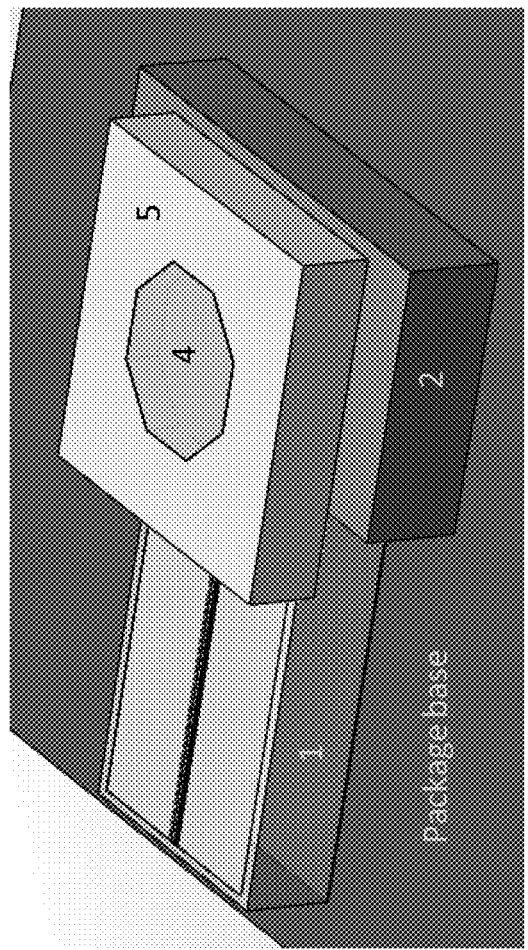
FIG. 32 is a simplified perspective view of a phosphor integrated laser-based light source according to another embodiment of the present invention.
Figure 34:
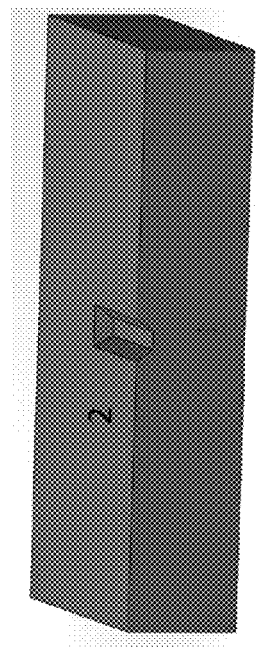
FIG. 34 is a simplified perspective view of a material with a groove formed on the top surface according to an embodiment of the present invention.

FIG. 32 is a simplified perspective view of a phosphor integrated laser-based light source according to another embodiment of the present invention. In this example, the reflective material 5 is offset compared to the material 2 and extends over a portion of the laser diode chip 1. Also, the wavelength conversion material 4 is shaped differently than the material 2. This can be seen more clearly in the cross-sectional view of FIG. 33, which shows a groove formed in a top of the material 2, with the optically transparent material 3 and the wavelength conversion material 4 arranged above the groove. FIG. 34 is a simplified perspective view of the material 2 with the groove formed on the top surface according to an embodiment.

Figure 36A:
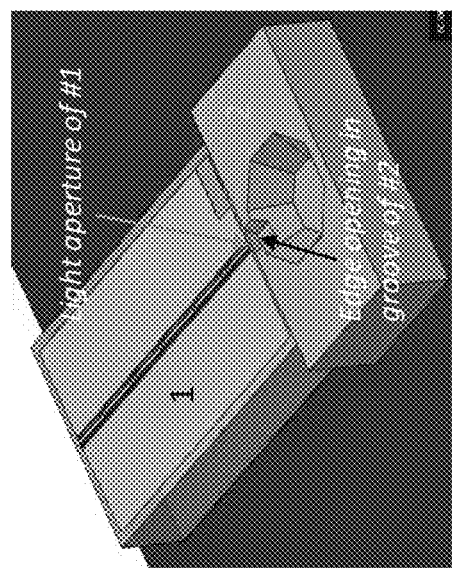
FIGS. 36A-36F are simplified diagrams illustrating processes for forming parts of a phosphor integrated laser-based light source according to an embodiment of the present invention.

FIGS. 36A-36F are simplified diagrams illustrating processes for forming parts of the phosphor integrated laser-based light source according to an embodiment of the present invention. FIG. 36A shows a laser diode chip 1 and material 2 assembled onto a package base. The laser diode chip 1 and the material 2 may be coupled to the package base using, for example, a soldering process. The material 2 has a groove formed in a top surface, and the light emitting aperture of the laser diode chip 1 is aligned with the groove so that light emitted from the laser diode chip 1 enters the groove.

Figure 36C:
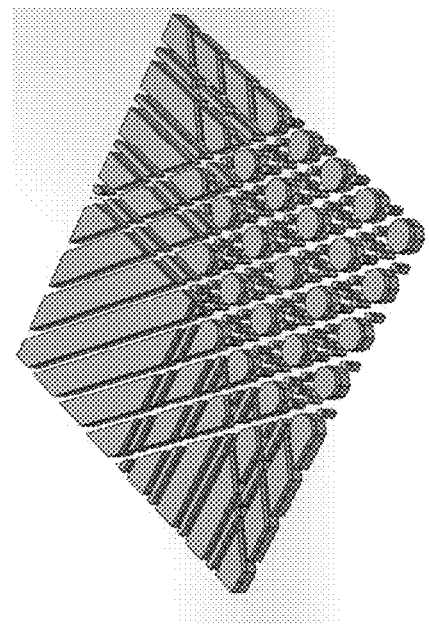
Figure 36B:
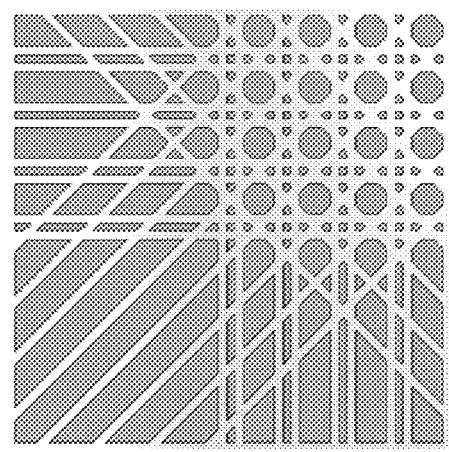

FIGS. 36B-36C show a partially diced sheet that includes a layer of optically transparent material and a layer of wavelength conversion material. FIG. 36B is a plan view of the partially diced sheet and FIG. 36C is a perspective view. The layers of optically transparent material and wavelength conversion material may be bonded using an adhesive. In an embodiment, the adhesive may be optically transparent and may produce a bond line that is thin enough to efficiently conduct heat between the optically transparent material and the wavelength conversion material. Example adhesives include epoxy, silicone, glass, spin-on-glass, or materials formed by sol-gel processes. Preferred properties of the adhesive include high thermal conductivity, optical transparency, good adhesion, and stability under long-term exposure to high temperatures and optical flux.

As shown in FIG. 36B-36C, the sheet of bonded materials may be diced into desired shapes. In this example, the sheet is diced into octagon shapes. This requires multiple cuts at different angles. An octagon shape does not utilize the sheet area as efficiently as a square shape, but the octagon shape is close to circular and may be desirable for some applications.

Figure 36E:
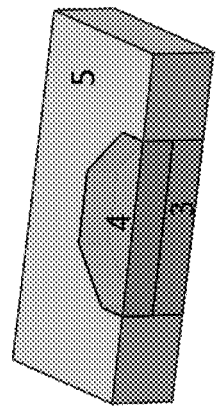
Figure 36D:
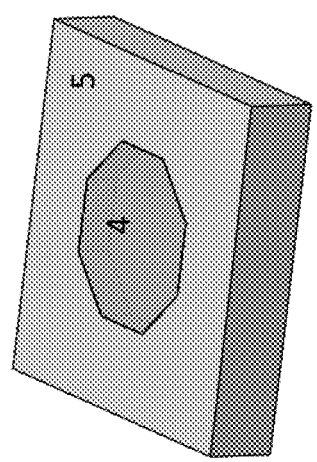

FIG. 36D-36E show a reflective material 5 formed around sides of the octagon shaped optically transparent material 3 and a wavelength conversion material 4 (the "octagon shaped materials"). The reflective material 5 may be a diffuse volume scatterer. The reflective material 5 may be dispensed around the octagon shaped materials after dicing and while the octagon shaped materials are still mounted on a dicing carrier or tape, or after removing the octagon shaped materials and re-assembling them on a new carrier at a desired spacing. In an embodiment, the reflective material 5 may be dispensed or otherwise deposited in gaps between an array of the octagon shaped materials. A heat treatment may be used to cure the reflective material 5 and ensure adhesion to the octagon shapes as necessary. Alternatively, the reflective material 5 may be deposited over the array of octagon shapes and subsequently removed through a planarization process such as grinding, lapping, or with a squeegee if the reflective material 5 is still in liquid or paste form. The octagon shaped materials surrounded by the reflective material 5 may be singulated using a dicing process.

Figure 36F:
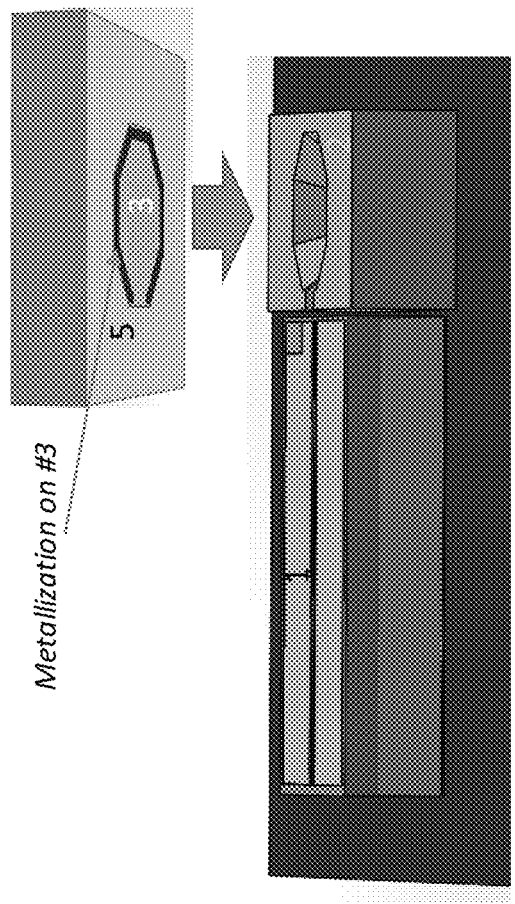

FIG. 36F shows assembly of the octagon shaped materials surrounded by the reflective material 5 onto the laser diode chip 1 and material 2. A material used for attachment may be an optically transparent material such as epoxy, silicone, glass, spin-on-glass, or materials formed through sol-gel processes. Alternatively, the material used for attachment may be a solder or similar material where mating surfaces are metalized. In this case, the metalization may be added to a bottom surface of the reflective material 5 and/or the optically transparent material 3 in a pattern that corresponds to a mating surface on the material 2. The metalization may serve as a reflector. In an embodiment, a metalization may include $SiO_2$/Ag/TiW/Au. The solder may be included in the metalization, in which case the stack may include $SiO_2$/Ag/TiW/AuSn.

Figure 37A:
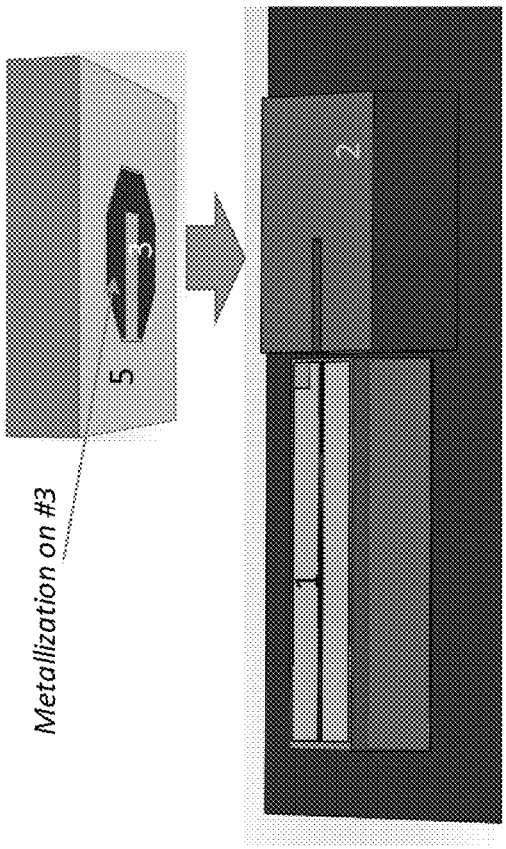
FIGS. 37A-37B are simplified diagrams illustrating processes for forming a part of a phosphor integrated laser-based light source according to an embodiment of the present invention.
Figure 37B:
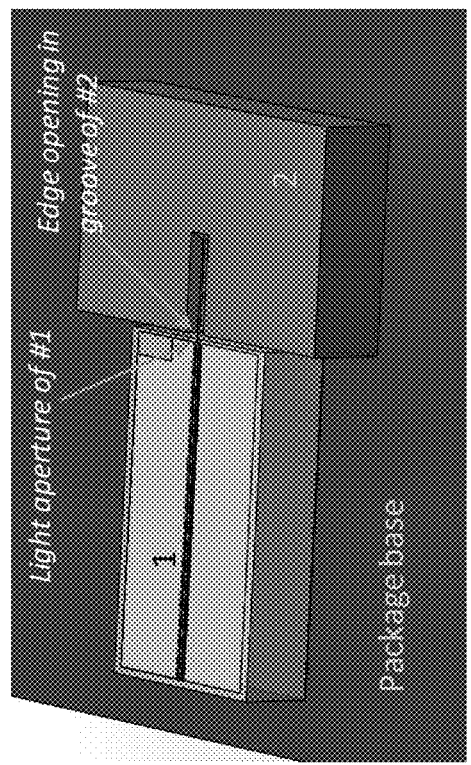

FIGS. 37A-37B are simplified diagrams illustrating processes for forming a part of a phosphor integrated laser-based light source according to an embodiment of the present invention. These figures are similar to FIGS. 36A and 36F except the groove in the material 2 has a different shape and the metalization is added to the optically transparent material 3 in a different pattern. Other steps may correspond to FIGS. 36B-36E and are not shown separately.

Figure 38A:
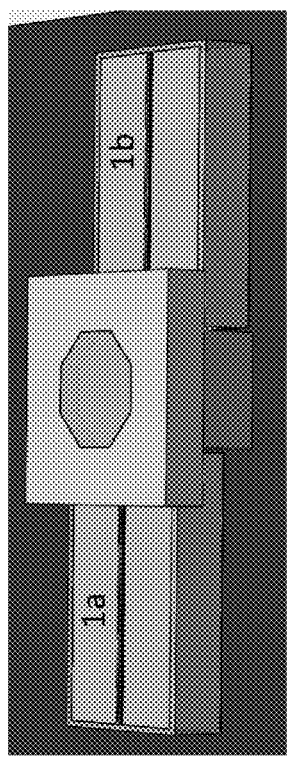
FIGS. 38A-38C are simplified diagrams of a phosphor integrated laser-based light source according to another embodiment of the present invention.
Figure 38B:
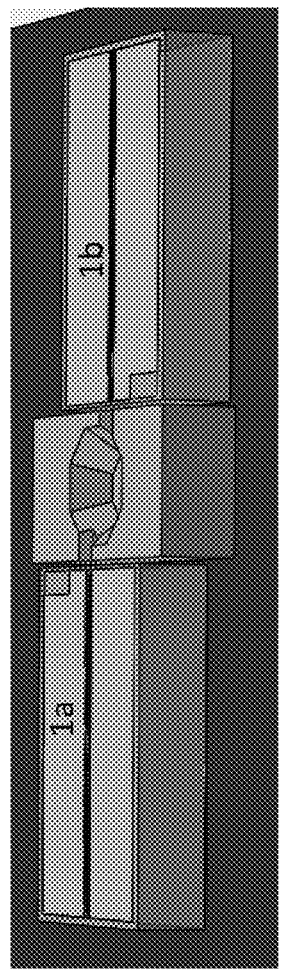
Figure 38C:
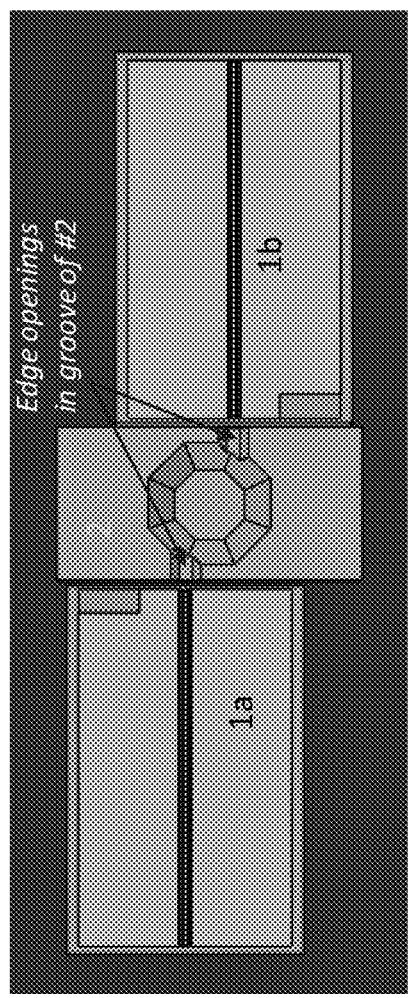

FIGS. 38A-38C are simplified diagrams of a phosphor integrated laser-based light source according to another embodiment of the present invention. The structure of this embodiment is similar to that of the embodiment shown in FIGS. 36A-36F, except this embodiment includes a first laser diode chip 1a and a second laser diode chip 1b, and the material 2 includes a separate portion of the groove for each laser diode chip. Depending on the shape of the groove, in some embodiments there may be a separate groove provided for each laser diode chip.

In the example shown in FIGS. 38A-38C, both of the laser diode chips 1a, 1b inject light into the groove. In some embodiments, the light from each of the laser diode chips 1a, 1b may be of a substantially similar wavelengths (e.g., 440-460 nm), or the light from each of the laser diode chips 1a, 1b may be of different wavelengths (e.g., 450 nm and 590-650 nm, 450 nm and 850 nm, 450 nm and 905 nm, 450 nm and 940 nm, 450 nm and 980 nm, 450 nm and 405 nm, or any other wavelengths). In some embodiments, one of the laser diode chips 1a, 1b may have an emission wavelength that is not down converted (e.g., red or infrared wavelength).

Figure 39A:
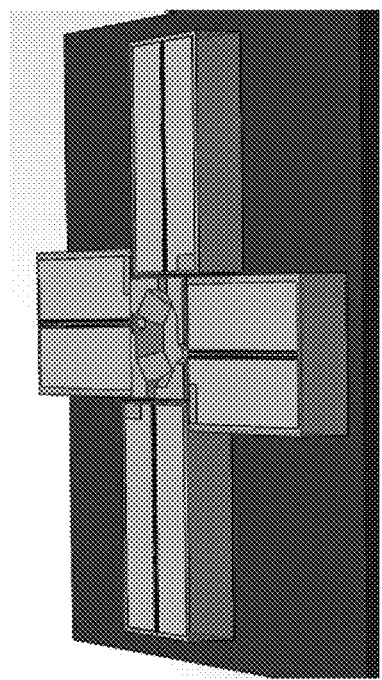
FIGS. 39A-39C are simplified diagrams of a phosphor integrated laser-based light source according to another embodiment of the present invention.
Figure 39B:
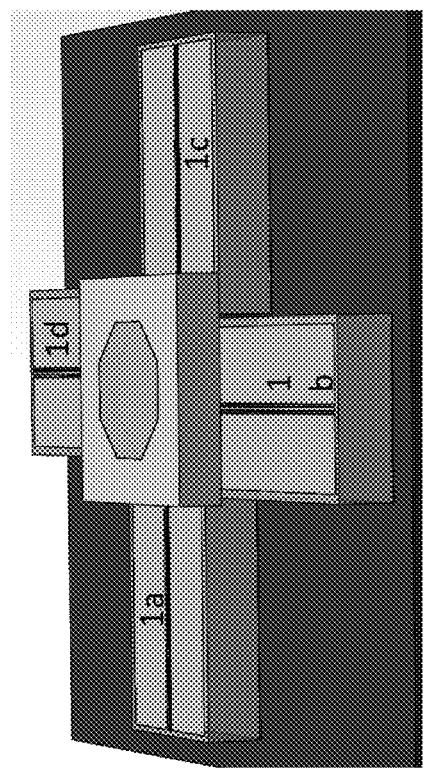
Figure 39C:
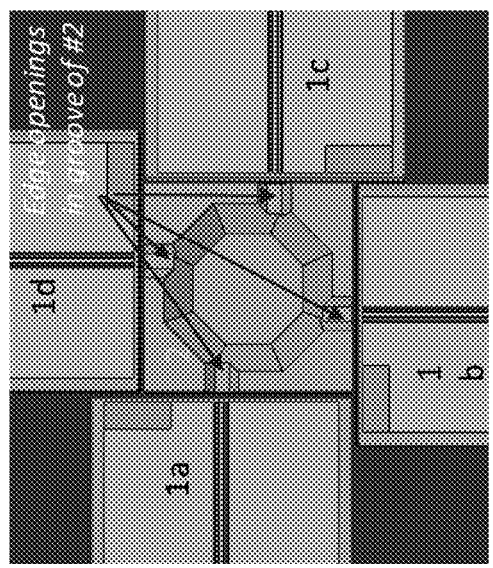

FIGS. 39A-39C are simplified diagrams of a phosphor integrated laser-based light source according to another embodiment of the present invention. This embodiment is similar to that of FIGS. 38A-38C, but this example includes laser diode chips 1a, 1b, 1c, 1d that each inject light into a separate portion of the groove. Other embodiments may include more or fewer laser diode chips each injecting light into a separate groove or a separate portion of the groove. A size of the material 2 may be increased to provide more space around the groove for additional laser diode chips.

Figure 40A:
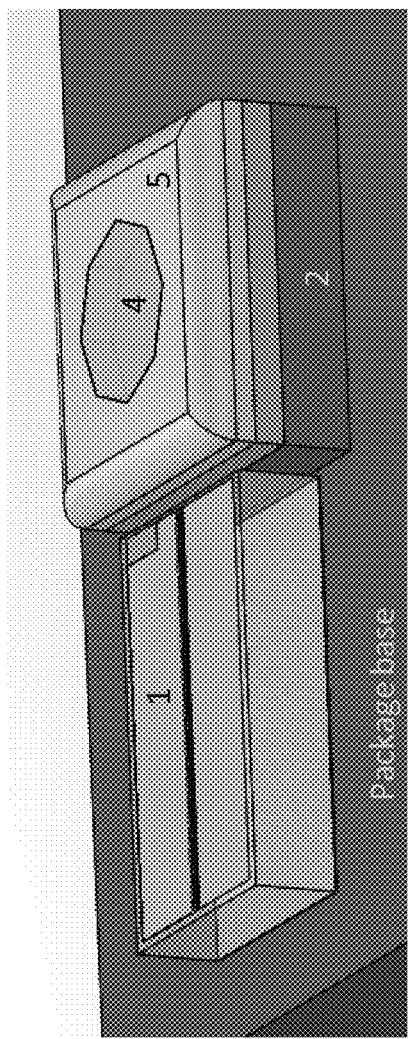
FIGS. 40A-40B are simplified diagrams of a phosphor integrated laser-based light source according to another embodiment of the present invention.
Figure 40B:
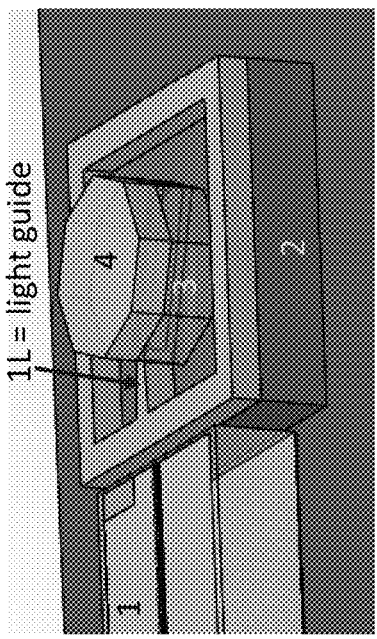
Figure 41A:
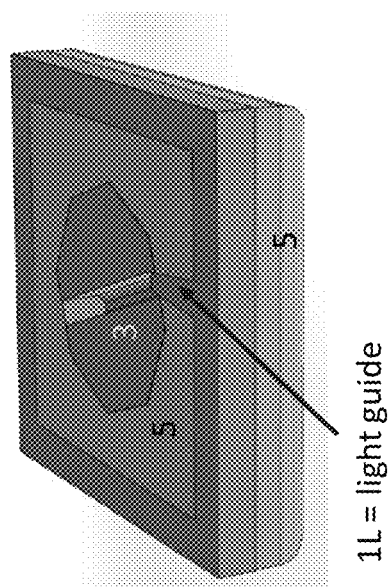
FIGS. 41A-41B are simplified diagrams showing a bottom view of the light guide and groove of the phosphor integrated laser-based light source of FIGS. 40A-40B according to an embodiment of the present invention.
Figure 41B:
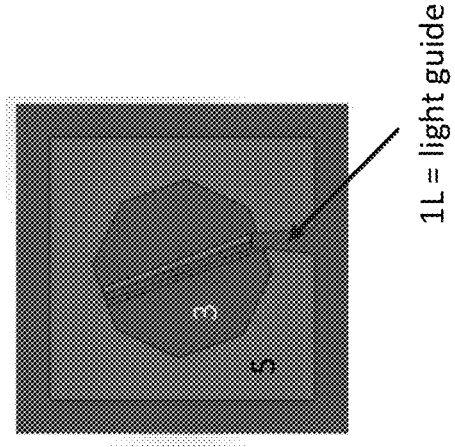

FIGS. 40A-40B are simplified diagrams of a phosphor integrated laser-based light source according to another embodiment of the present invention. FIG. 40B is similar to FIG. 40A, except a reflective material 5 has been removed to show a light guide 1L aligned with a groove in an optically transparent material 3. FIGS. 41A-41B are simplified diagrams showing a bottom view of the light guide 1L and the groove in the optically transparent material 3. The light guide 1L guides light from a laser diode chip 1 to the groove in the optically transparent material 3. The laser diode chip 1, material 2, optically transparent material 3, waveguide conversion material 4, and reflective material 5 may otherwise be similar to the corresponding features described with regard to FIGS. 30A-30D above.

In this embodiment, the light guide 1L guides light from a laser diode chip 1 to the groove in the optically transparent material 3. The light is injected into the groove, where it is transmitted to the wavelength conversion member 4. A top surface of the material 2 may be covered with a reflective material that reflects light upward through the optically transparent material 3.

The groove may be formed in a bottom surface of the optically transparent material 3. The groove may have a U-shape, V-shape, trench shape, or any other shape. The groove may extend partially through the optically transparent material 3. The groove may be aligned with the light guide 1L or may be at an angle relative to an optical axis of the light guide 1L. Surfaces of the groove may be smooth or rough.

Figure 42:
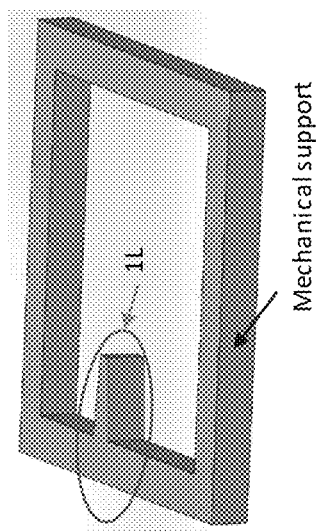
FIG. 42 is a simplified diagram of a light guide structure according to an embodiment of the present invention.

FIG. 42 is a simplified diagram of a light guide structure according to an embodiment of the present invention. The light guide structure includes the light guide 1L (or waveguide) and a frame. The light guide 1L may be tapered with a rectangular cross section in some embodiments, or the light guide 1L may have a different cross section including circular in other embodiments. The light guide 1L may have different taper angles including no taper in some embodiments. The light guide 1L may include an optical fiber. The structure that provides the light guide 1L may provide mechanical support and/or aid in assembly of the phosphor integrated laser-based light source. The light guide 1L may include a low refractive index material (cladding) surrounding a core material. The cladding may be formed by depositing, for example, $MgF_2$ on a glass core.

Figure 43B:
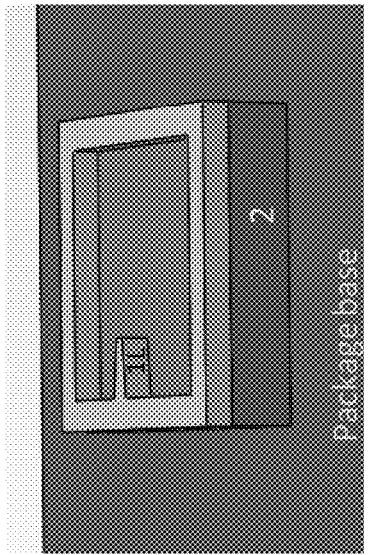
FIGS. 43A-43E are simplified diagrams illustrating processes for forming parts of a phosphor integrated laser-based light source according to an embodiment of the present invention.
Figure 43A:
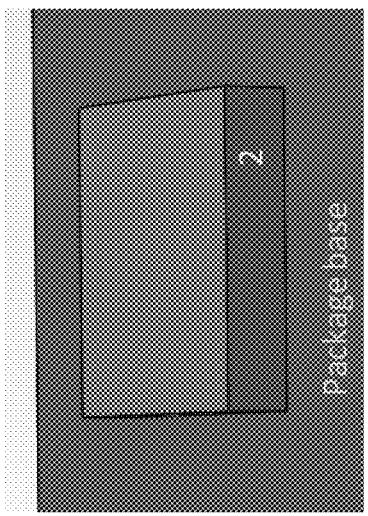

FIGS. 43A-43E are simplified diagrams illustrating processes for forming parts of a phosphor integrated laser-based light source according to an embodiment of the present invention. In FIG. 43A, a material 2 is arranged on a package base. The material 2 may be soldered or glued to the package base using an adhesive. In FIG. 43B, a light guide structure with a light guide 1L is arranged on the material 2. The light guide structure may be soldered or glued to the material 2 using an adhesive such as epoxy or silicone. Alternatively, the light guide structure may be part of an array of similar structures in a sheet form that are bonded to a sheet of material (a sheet of the material 2). In this embodiment, a singulation process may be used to form the light guide structure and the material 2 that are then assembled onto the package base. In either embodiment, the light guide structure may be formed, for example, from a glass substrate using known processes that may include deposition, patterning, etching, and singulation.

Figure 43C:
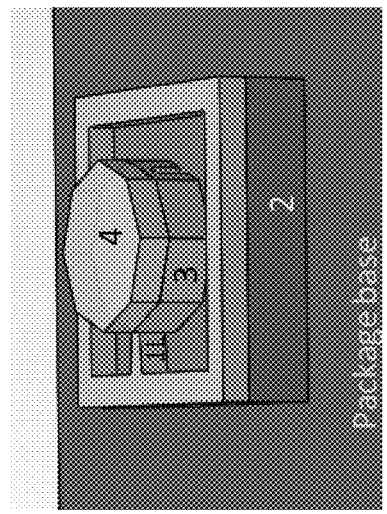
Figure 44B:
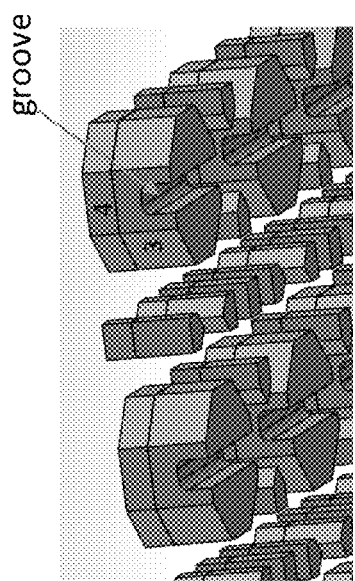
FIGS. 44A-44B are simplified diagrams illustrating processes for forming grooves in bottoms of optically transparent materials according to an embodiment of the present invention.
Figure 44A:
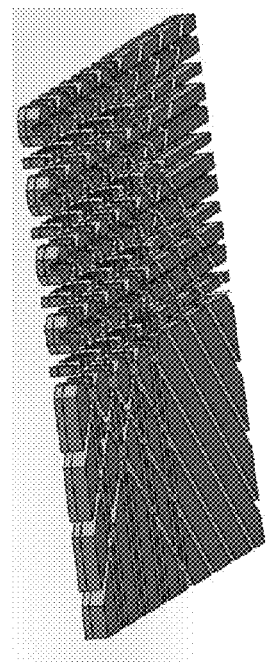
Figure 45:
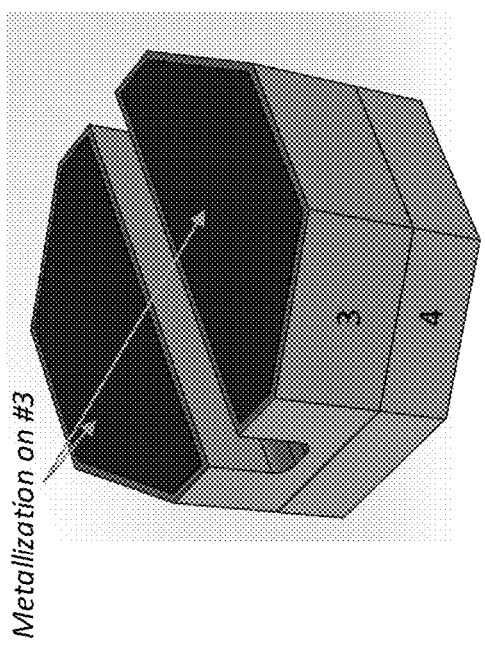
FIG. 45 is a simplified diagram of a metallization pattern on a bottom of an optically transparent material according to an embodiment of the present invention.

In FIG. 43C, an optically transparent material 3 and wavelength conversion material 4 are assembled onto the material 2. The optically transparent material 3 and the wavelength conversion material 4 may be formed in a manner to that illustrated in FIGS. 36B-36C described above, except in this embodiment a groove may be formed in a bottom of the optically transparent material as illustrated in FIGS. 44A-44B. The groove in the bottom of the optically transparent material 3 is aligned with an end of the light guide 1L. An adhesive used for attachment may be optically transparent such as epoxy, silicone, glass, spin-on-glass, or materials formed by sol-gel processes. Alternatively, the material used for attachment may be a solder or similar material where mating surfaces are metalized. In this case, the metalization may be added to a bottom surface of the optically transparent material 3 as illustrated in FIG. 45. The metalization may serve as a reflector. In an embodiment, a metalization may include $SiO_2/Ag/TiW/Au$. The solder may be included in the metalization, in which case the stack may include $SiO_2/Ag/TiW/AuSn$.

Figure 43E:
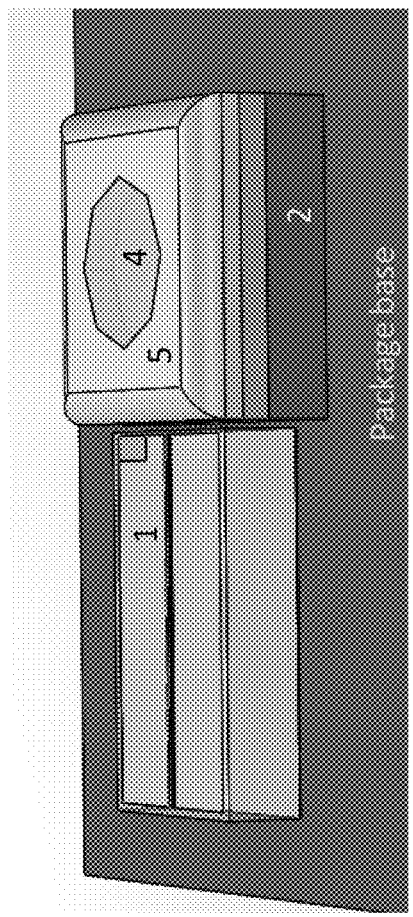
Figure 43D:
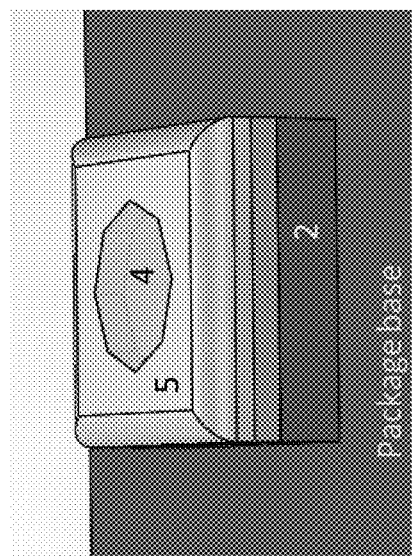

In FIG. 43D, a reflective material 5, such as a diffuse volume scatterer, is formed around sides of the optically transparent material 3 and the wavelength conversion material 4. In FIG. 43E, a laser diode chip 1 is assembled onto the package base. The laser diode chip 1 may be coupled to the package base using, for example, a soldering process. The light emitting aperture of the laser diode chip 1 is aligned with the light guide 1L so that light emitted from the laser diode chip 1 can be guided to the groove.

Figure 46B:
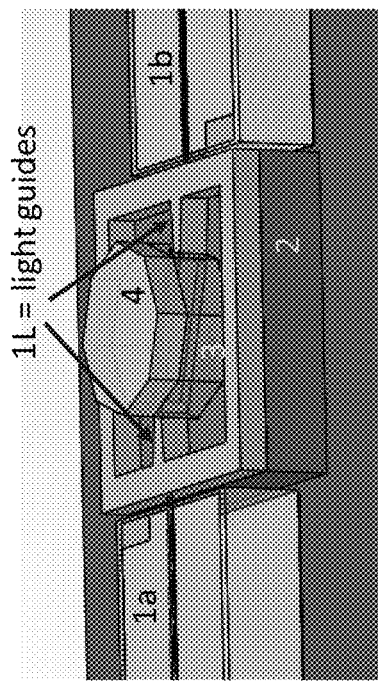
FIGS. 46A-46B are simplified diagrams of a phosphor integrated laser-based light source according to another embodiment of the present invention.
Figure 46A:
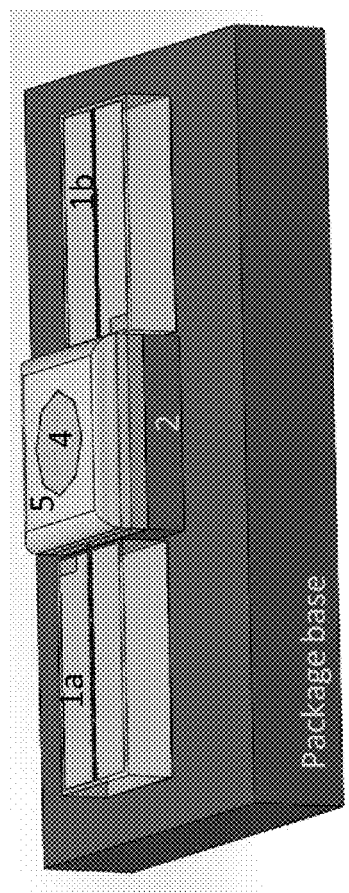

FIGS. 46A-46B are simplified diagrams of a phosphor integrated laser-based light source according to another embodiment of the present invention. The structure of this embodiment is similar to that of the embodiment shown in FIGS. 43A-43E, except this embodiment includes a first laser diode chip 1a and a second laser diode chip 1b, and the light guide structure includes a separate light guide 1L for each laser diode chip. The light guides 1L may be aligned with opposite ends of a single groove as shown in FIG. 46B, where the reflective material 5 is removed for clarity. In another embodiment, each light guide may be aligned with a separate groove.

Figure 47A:
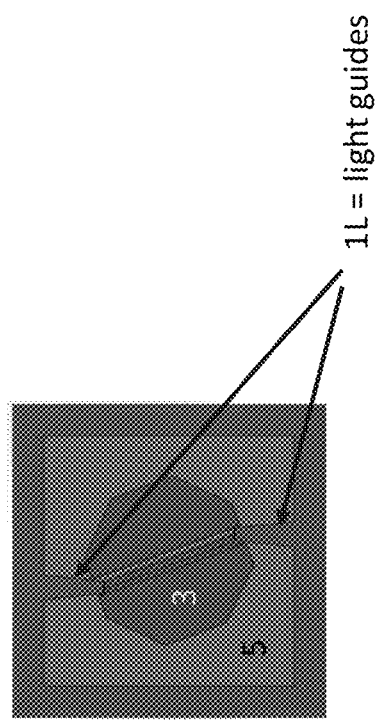
FIGS. 47A-47B are simplified diagrams showing a bottom view of the light guide and groove of the phosphor integrated laser-based light source of FIGS. 40A-40B according to an embodiment of the present invention.
Figure 47B:
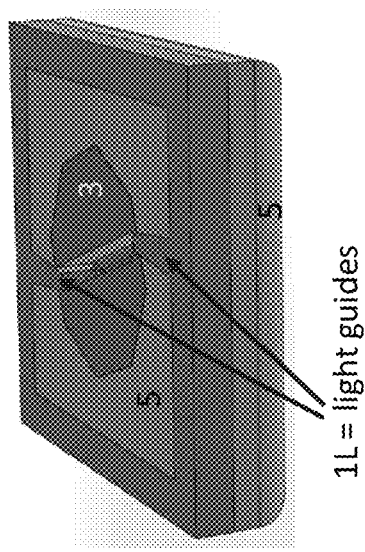

In the example shown in FIGS. 46A-46B, both of the laser diode chips 1a, 1b inject light into the same groove. In some embodiments, the light from each of the laser diode chips 1a, 1b may be of a substantially similar wavelengths (e.g., 440-460 nm), or the light from each of the laser diode chips 1a, 1b may be of different wavelengths (e.g., 450 nm and 590-650 nm, 450 nm and 850 nm, 450 nm and 905 nm, 450 nm and 940 nm, 450 nm and 980 nm, 450 nm and 405 nm, or any other wavelengths). FIGS. 47A-47B are simplified diagrams showing a bottom view of the light guide 1L on each end of the groove in the optically transparent material 3 according to an embodiment.

Figure 48:
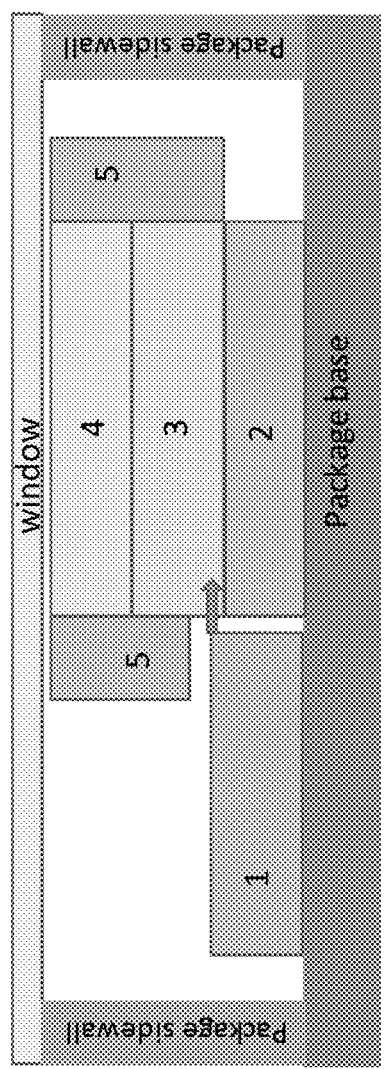
FIGS. 48-50 are simplified cross sectional views of a phosphor integrated laser-based light source package according to some embodiments of the present invention.
Figure 49:
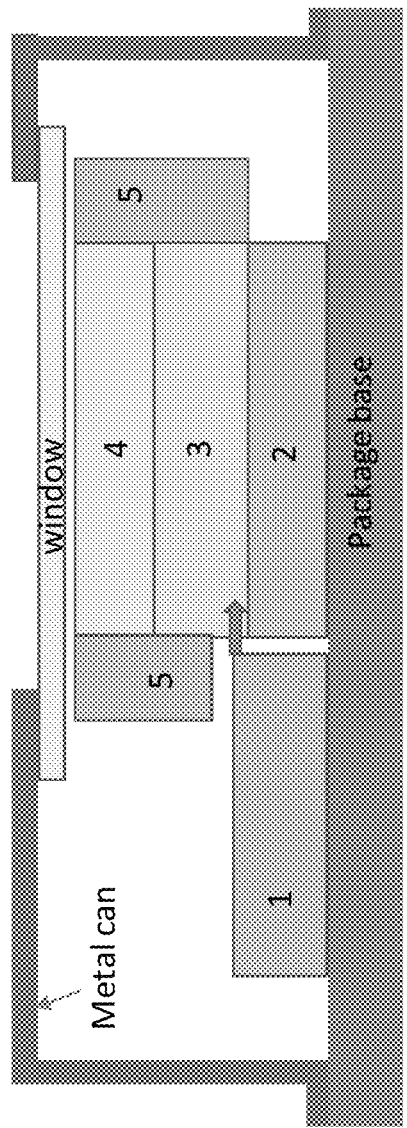
Figure 50:
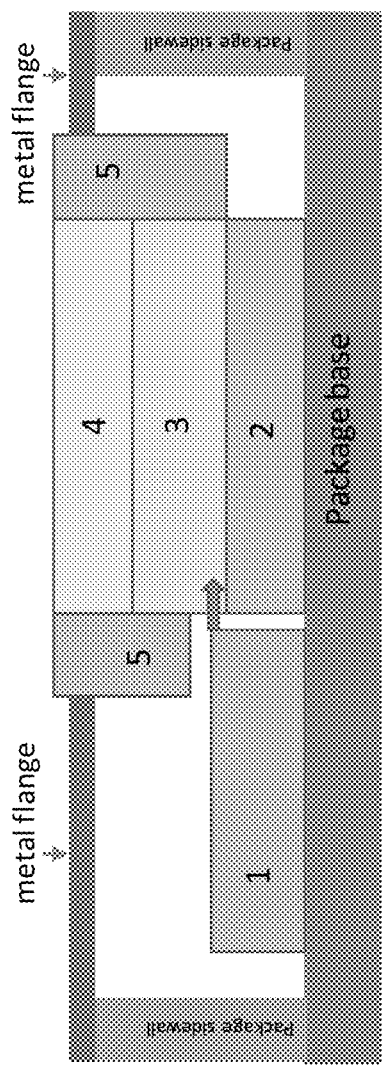

FIGS. 48-50 are simplified cross sectional views of a phosphor integrated laser-based light source package according to some embodiments of the present invention. In FIG. 48, a seal is formed between a window or lid and package sidewalls using an adhesive such as epoxy or solder. The window may be glass or another optically transparent material that allows the light to pass through. The window, package sidewalls, and package base may provide a hermitic seal for a laser diode chip 1, material 2, optically transparent material 3, wavelength conversion material 4, and reflective material 5.

In FIG. 49, a seal is formed between a window or lid and walls of a metal can using an adhesive such as a glass solder, brazing material, or metal soldering. A seal between the metal can and the package base may be formed with a projection welding. The walls of the metal can may block stray light from the laser diode 1. The window, walls, and package base may provide a hermetic seal for the laser diode chip 1, material 2, optically transparent material 3, wavelength conversion material 4, and reflective material 5.

In FIG. 50, a seal is formed between a metal flange and a reflective material 5 using an adhesive such as an epoxy or solder. The reflective material 5 and wavelength conversion material 4 may be non-porous enabling a hermetic seal of a laser diode chip 1, material 2, and optically transparent material 3.

Figure 51A:
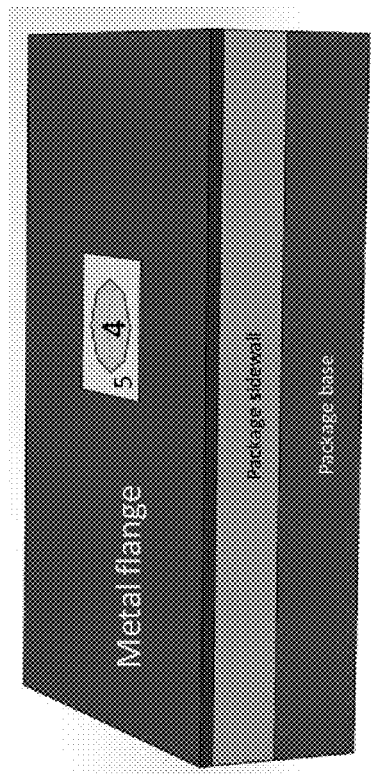
FIGS. 51A-51B are simplified perspective views of a phosphor integrated laser-based light source package according to another embodiment of the present invention.
Figure 51B:
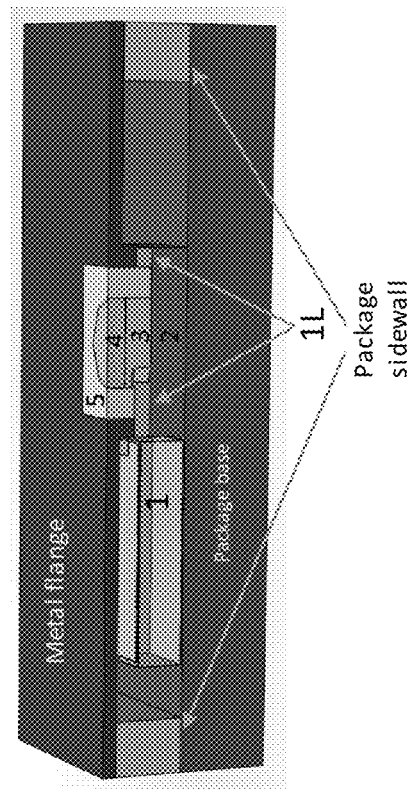

FIGS. 51A-51B are simplified perspective views of a phosphor integrated laser-based light source package according to another embodiment of the present invention. In this example, a light guide structure, for example as described above with regard to FIGS. 40A-40B, forms part of the package enclosure. A seal is formed between a metal flange and the light guide structure using an adhesive such as an epoxy or solder. A seal is formed between the metal flange and sidewalls using an adhesive such as an epoxy, solder, or projection welding.

Figure 52A:
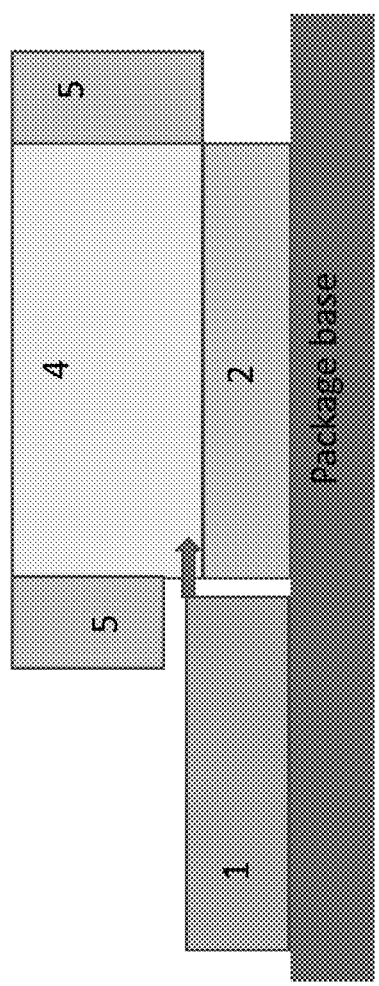
FIGS. 52A-52B are simplified cross-sectional and plan views of a laser-based light source according to some embodiments of the present invention.

FIG. 52A is a simplified cross-sectional view of a laser-based light source according to some embodiments of the present invention. The light source includes a laser diode 1 (or laser diode chip) arranged on a package base so that a facet is positioned to emit light into a cavity or groove formed in a top surface of a material 2 (e.g., a thermally conductive material) and/or formed in a bottom surface of an optical element 4 and/or into a cavity between the material 2 and the optical element 4. Alternatively, the light may be emitted directly into the optical element 4. The laser diode 1 may be formed in accordance with any of the embodiments described herein. The light source 1 may include one or more laser diodes, and the light may be, for example, a laser beam with a wavelength in a blue or another color region. The light can be injected directly from the laser diode 1 or via a light guide.

In some embodiments, the package base may be a printed circuit board (PCB). In other embodiments, the package base may be a bottom portion of a semiconductor package that is configured to conduct heat from the laser diode 1 and the material 2 to structures below, such as solder, a metal core PCB, a heat sink, or the like. The package base may also include a metal slug (e.g., Cu or Al), other plated metals, or a composite of ceramic materials (e.g., AlN, $Al_2O_3$) that may include metals. In yet other embodiments, the package base may be a slab of metal (e.g., Cu or Al) and form a part of a metal core PCB such as a chip on board (COB).

In an embodiment where the laser diode 1 emits light into the groove, the groove may constitute an air gap between the material 2 and the optical element 4. A top surface of the material 2 and/or an inside of at least part of the groove may be covered with a reflective coating to direct and/or reflect the light upward. The reflective coating may include, for example, silver (Ag) or aluminum (Al). Alternatively or additionally, the reflective coating may include an overlying dielectric layer for environmental protection and/or a dielectric stack comprising, for example, one or more layers of $SiO_2$ and/or $Ta_2O_5$ to increase reflectance. The reflective coating may be deposited either as a flat specular film if the surface is smooth or a rough film producing a diffuse reflectance if the surface is rough.

The material 2 directs and/or reflects at least a portion of the light from the laser diode 1 in an upward direction towards the optical element 4. The material 2 may have a high thermal conductivity to conduct heat from the optical element 4 to the package base. In some embodiments, the material 2 may include silicon (Si), silicon carbide (SiC), germanium (Ge), gallium arsenide (GaAs), sapphire, ceramic aluminum nitride (AlN), ceramic aluminum oxide (Al2O3, ceramic boron nitride (BN), aluminum (Al), copper (Cu), or other thermally conductive materials.

If the material 2 is Si, the groove can be formed with KOH etching to produce angled sidewalls. Many variations on the shape of the groove are possible. FIG. 35 provides an example of a groove with a narrow neck that opens up into a polygon shape. In some embodiments, the optical element 4 may have a shape similar to that of the groove. For example, FIG. 35 includes an outline of an optically transparent material 3 having a polygon shape similar to the groove. In some embodiments, the groove may be partially or completely filled with a diffuse volume scatterer (e.g., $TiO_2$ or $Al_2O_3$ particles in a low refractive index matrix such as glass, epoxy, or silicone).

The optical element 4 may include a wavelength conversion material that down-converts all or a portion of the light from the laser diode 1. The wavelength conversion material may be dispersed uniformly throughout the optical element 4. The optical element 4 may be formed and/or configured in accordance with any of the embodiments described herein. In an example, the optical element 4 may include Ce-doped YAG. In another example, the optical element 4 may include Ce-doped YAG with sapphire in a eutectic crystal. In some embodiments, the optical element 4 may have inclusions of voids or other materials with a different refractive index that cause the light to scatter. The optical element 4 may be single crystalline or sintered smaller particles. In an embodiment, a thickness of the optical element 4 may be between about 50-800 μm or more, and a lateral dimension may be between about 300-1000 μm. A shape of the optical element 4 as seen from a top view is not limited and can be square, rectangle, hexagon, octagon, circle, or any other shape.

A reflective material 5 reflects light incident from sides of the optical element 4. The reflective material 5 may cover a part or all of the sides of the optical element 4 where light can be emitted. Example shapes of the reflective material 5 are shown in FIGS. 30B-30C. If the light from the laser diode 1 is injected directly into the optical element 4, the reflective material 5 may be omitted from the area where the laser diode 1 injects light into the optical element 4. The reflective material 5 may be a diffuse volume scatterer (e.g., $TiO_2$ or $Al_2O_3$ particles in a low refractive index matrix such as glass, epoxy, or silicone). The reflective material 5 can also be a thin film coating (e.g. $SiO_2$/Ag or Ag) on the sidewalls of the optical element 4. A lateral thickness of the reflective material 5 may be between about 20-500 μm if it is a diffuse volume scatterer, and it may be between about 50 nm to 10 μm if it is a thin film coating. A height of the reflective material 5 may be approximately equal to a thickness of the optical element 4.

Figure 52B:
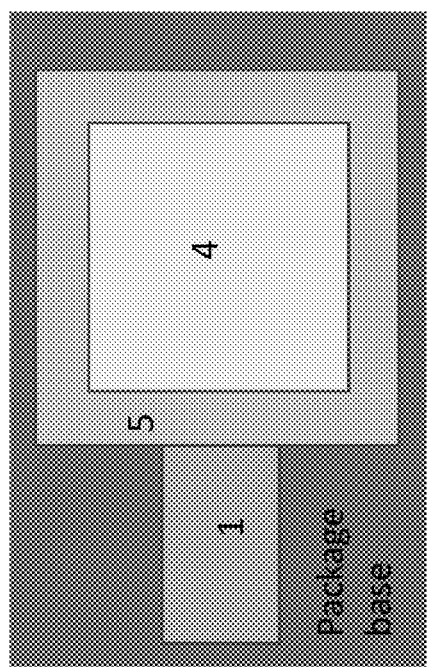

FIG. 52B is a simplified plan view of the laser-based light source of FIG. 52A according to an embodiment of the present invention. In this example, the reflective material 5 surrounds the sides of the optical element 4.

Figure 53C:
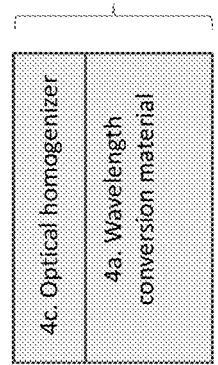
FIGS. 53A-53D are simplified cross-sectional views of optical elements that can be used in laser-based light sources according to some embodiments of the present invention.
Figure 53D:
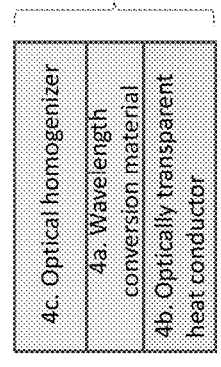
Figure 53A:
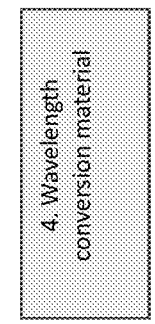

FIGS. 53A-53D are simplified cross-sectional views of optical elements that can be used in any of the laser-based light sources described herein according to some embodiments of the present invention. In the example of FIG. 53A, the optical element 4 includes a wavelength conversion material. A thermal conductivity of the wavelength conversion material may be sufficient to conduct heat from the optical element 4 to the underlying material 2. In some embodiments that include a cavity between the optical element 4 and the material 2, the thermal conductivity of the wavelength conversion material may be sufficient to conduct heat from the optical element 4 and from around the cavity to the underlying material 2.

Figure 53B:
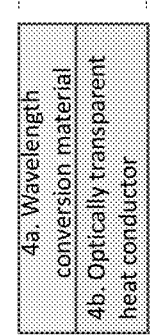

In the example of FIG. 53B, the optical element 4 includes a wavelength conversion material 4a overlying an optically transparent heat conductor 4b. The optically transparent heat conductor 4b may be disposed between the wavelength conversion material 4a and the material 2. The optically transparent heat conductor 4b may be configured to allow light to pass from the laser diode 1 and the material 2 to the wavelength conversion material 4a, and to conduct heat from the wavelength conversion material 4a to the material 2 and the package base. The optically transparent heat conductor 4b may also be configured to scatter light incident from other elements to improve color uniformity of light emitted from a top surface of the optical element 4. Light scattering can occur at one or more interfaces of the optically transparent heat conductor 4b and/or within a bulk of the optically transparent heat conductor 4b.

In the example of FIG. 53C, the optical element 4 includes a wavelength conversion material 4a and at least one optical homogenizer 4c. The at least one optical homogenizer 4c is configured to improve color uniformity of light emitted from a top surface of the optical element 4. The optical homogenizer 4c may be optically transparent (e.g., glass or sapphire) or at least partially translucent (e.g., Al2O3 ceramic). A top surface of the optical homogenizer 4c may be rough and/or include optical scattering features in some embodiments.

In the example of FIG. 53D, the optical element 4 includes a wavelength conversion material 4a disposed between an optically transparent heat conductor 4b and at least one optical homogenizer 4c. The optically transparent heat conductor 4b may include features similar to those described with regard to FIG. 53B, and the at least one optical homogenizer 4c may include features similar to those described with regard to FIG. 53C.

Figure 54A:
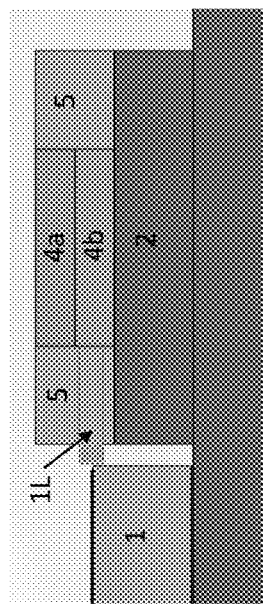
FIGS. 54A-54B are simplified cross-sectional and partially cutaway views of a laser-based light source according to some embodiments of the present invention.
Figure 54B:
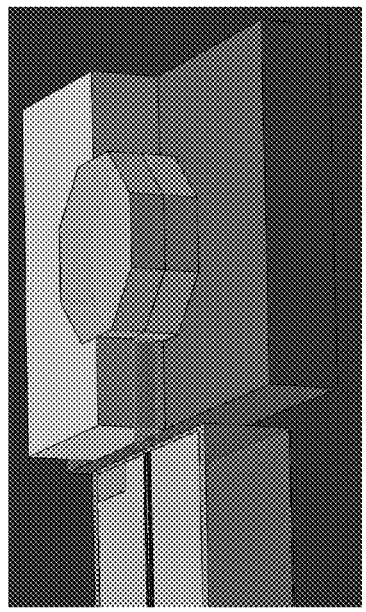

FIGS. 54A-54B are simplified cross-sectional and partially cutaway views of a laser-based light source according to some embodiments of the present invention. The optical element 4 includes a wavelength conversion material 4a disposed on an optically transparent heat conductor 4b. Alternatively, the optical element may include any of the other configurations shown in FIGS. 53A-53D. In this particular example, the wavelength conversion material 4a may include features similar to those described with regard to FIG. 53A, and the optically transparent heat conductor 4b may include features similar to those described with regard to FIG. 53B. The embodiments of FIGS. 54A and 54B also include a light guide 1L. The light guide 1L may have features similar to those of light guides discussed with reference to FIGS. 40-43. The light guide 1L is configured to guide light from the laser diode 1 to the optical element 4 or to a space or groove between material 2 and the optical element 4. In embodiments that include a space or groove, at least a portion of the light guide 1L may be disposed in the space or groove. In some embodiments, the light guide 1L may have light extraction features along at least a portion of its length, for example the portion in the space or groove.

In the example of FIG. 54A, a cross-sectional view is illustrated showing a relative spatial arrangement of the various elements of the embodiment. Light emitted by the laser diode 1 is transmitted to the transparent heat conductor by the light guide 1L.

In the example of FIG. 54B, a cutaway view is illustrated showing a relative spatial arrangement of the various elements of the embodiment. As can be seen in this figure, the wavelength conversion material 4a and the optically transparent heat conductor 4b may have a polygon shape surrounded by the reflective material 5.

Figure 55A:
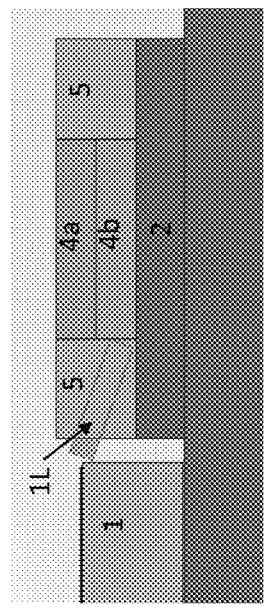
FIGS. 55A-55B are simplified cross-sectional and partially cutaway views of a laser-based light source according to some embodiments of the present invention.
Figure 55B:
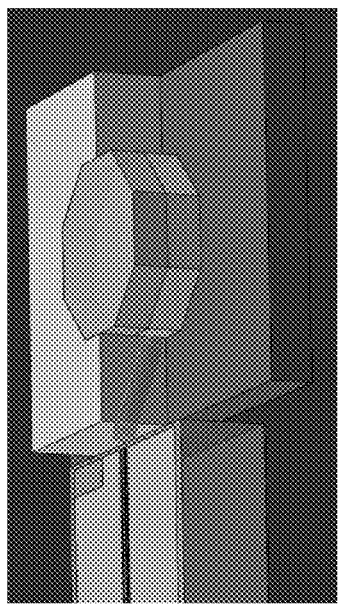

FIGS. 55A-55B are simplified cross-sectional and partially cutaway views of a laser-based light source according to some embodiments of the present invention. This embodiment is similar to that of FIGS. 54A-54B except the light guide 1L is arranged an angle with respect to the laser diode 1 and the optical element 4 (or the optically transparent heat conductor 4b in this example). Other angles may be used in other embodiments and the particular angle is not limited.

In the example of FIG. 55A, a cross-sectional view is illustrated showing a relative spatial arrangement of the various elements of the embodiment including the angle of the light guide 1L extending between the laser diode 1 and the optical element 4.

In the example of FIG. 55B, a cutaway view is illustrated showing a relative spatial arrangement of the various elements of the embodiment. As discussed previously, the light guide 1L may be configured to guide light from the laser diode 1 to the optical element 4 or to a space or groove between material 2 and the optical element 4.

Figure 56A:
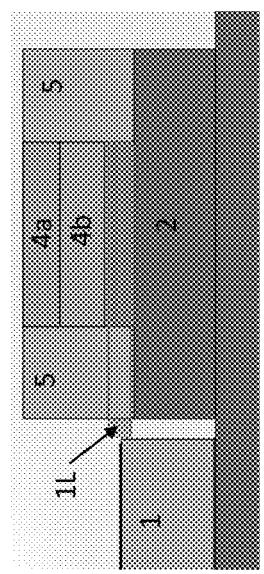
FIGS. 56A-56B are simplified cross-sectional and partially cutaway views of a laser-based light source according to some embodiments of the present invention.
Figure 56B:
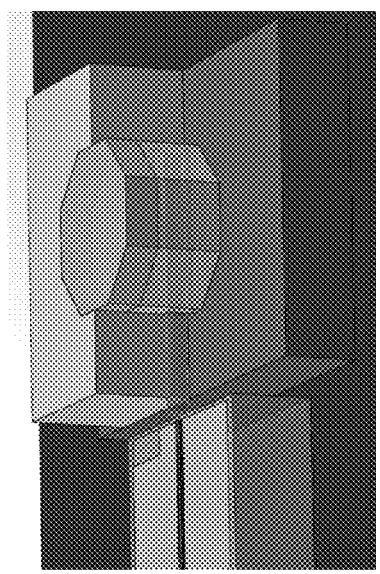

FIGS. 56A-56B are simplified cross-sectional and partially cutaway views of a laser-based light source according to some embodiments of the present invention. The optical element 4 includes a wavelength conversion material 4a disposed on an optically transparent heat conductor 4b. The wavelength conversion material 4a may include features similar to those described with regard to FIG. 53A, and the optically transparent heat conductor 4b may include features similar to those described with regard to FIG. 53B. The embodiments of FIGS. 56A and 56B also include a light guide 1L. The light guide 1L may have features similar to the light guides discussed with reference to FIGS. 40-43. In the illustrated embodiment, there is a cavity between the material 2 and the optically transparent heat conductor 4b formed as a space or groove in the bottom surface of optically transparent heat conductor 4b. A portion of light guide 1L is placed in this groove. The light guide 1L may have light extraction features along a portion of its length, for example the portion in the groove.

In the example of FIG. 56A, a cross-sectional view is illustrated showing a relative spatial arrangement of the various elements of the embodiment including the light guide 1L extending into the cavity between the material 2 and the optical element 4.

In the example of FIG. 56B, a cutaway view is illustrated showing a relative spatial arrangement of the various elements of the embodiment. This figure also shows the light guide 1L extending into the cavity.

FIGS. 57A-57B are simplified cross-sectional and plan views of a laser-based light source according to some embodiments of the present invention. In the illustrated embodiment, a gap extends between optical element 4 and reflective material 5. Reflective material 5 reflects light incident from the side of the optical element 4 and covers most or all of the side area of the optical element 4 where light can be emitted. In some embodiments the reflective material 5 may not cover a portion of the optical element 4 where the laser diode 1 injects light into the optical element 4.

In the example of FIG. 57A, a cross-sectional view is illustrated showing a relative spatial arrangement of the various elements of the embodiment including the gap between the optical element 4 and the reflective material 5.

In the example of FIG. 57B, a top-down view with respect to the orientation shown in FIG. 57A is illustrated showing a relative spatial arrangement of the various elements of the embodiment.

Figure 58C:
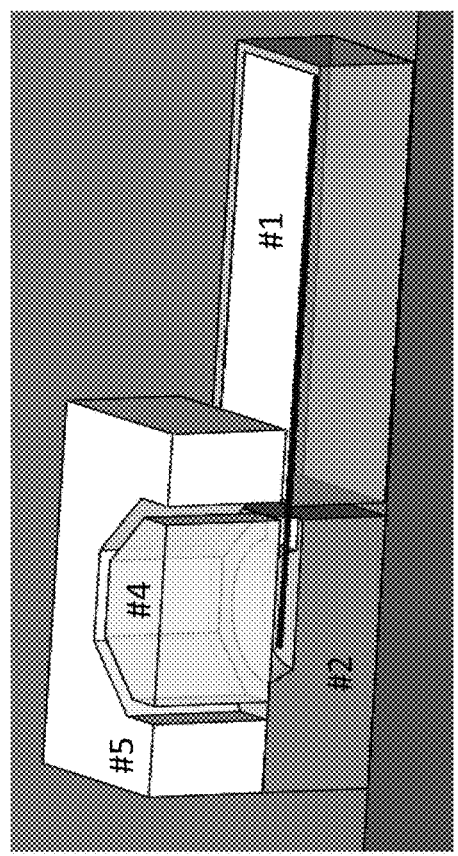
FIGS. 58A-58C are simplified cross-sectional, perspective, and cutaway views of a laser-based light source according to some embodiments of the present invention.
Figure 58A:
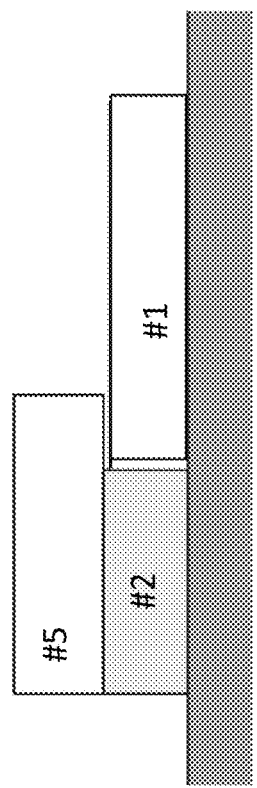
Figure 58B:
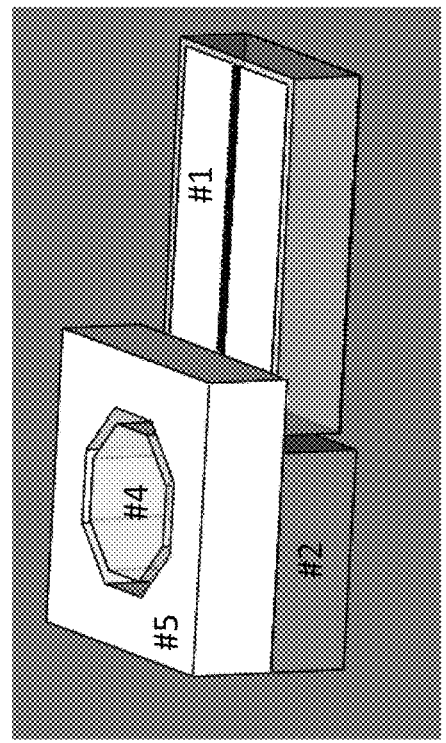

FIGS. 58A-58C are simplified side, perspective, and cutaway views of a laser-based light source according to some embodiments of the present invention. In the illustrated embodiment, a gap extends between the optical element 4 and the reflective material 5. In some embodiments, for example, due to tolerances, a nominal small gap between the optical element 4 and the reflective material 5 may exist. From an optical standpoint it may be desirable that the gap is less than, for example, up to about 40 um, up to about 50 um, up to about 60 um, or greater. The Gap may have other sizes depending, for example, on the various materials, shapes, manufacturing processes, and/or assembly techniques.

In some embodiments, the reflective material 5 is formed, for example, separately using a sintering process, a high temperature ceramic process, or a particle-in-glass process and subsequently assembled with the optical element 4 and may include a gap. In some embodiments, the reflective material 5 has diffusive properties. In some embodiments, the reflective material 5 is formed with materials such as TiO2 or BaTiO3 particles co-sintered with a clear low refractive index material (e.g. glass, SiO2, or Al2O3). In some embodiments, the reflective material 5 may be formed separately (e.g., by a sintering process) and then assembled with the optical material 4. In other embodiments, the reflective material 5 may include an element with a reflective film or coating on an inside wall (or walls) facing the optical element 4. As an example, the reflective material 5 may be a silicon element with a hole created using an etching process (e.g., reactive ion etching), and the silicon element may include a reflective coating (e.g., Ag coating) on the inside wall (or walls) facing the optical element 4.

In the example of FIG. 58A-58B, side and perspective views are illustrated, respectively, showing a relative spatial arrangement of the various elements of the embodiment. In the example of FIG. 58C, a cutaway view is illustrated showing that light is emitted either directly or by a light guide 1L into a cavity in an upper surface of the material 2 in accordance with an embodiment. In other embodiments the light may be emitted into the optical element 4, into a cavity in a bottom surface of the optical element 4, or into a cavity between the material 2 and the optical element 4.

Figure 59A:
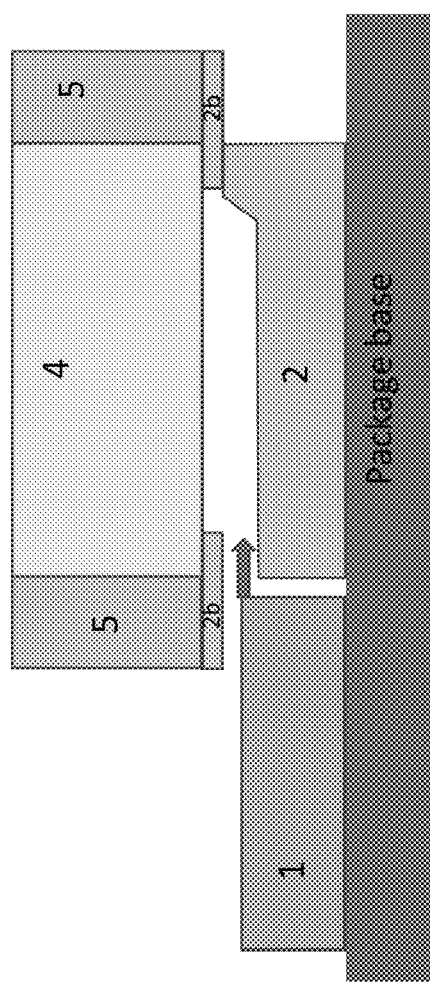
FIGS. 59A-59B are simplified cross-sectional and plan views of a laser-based light source according to some embodiments of the present invention.
Figure 59B:
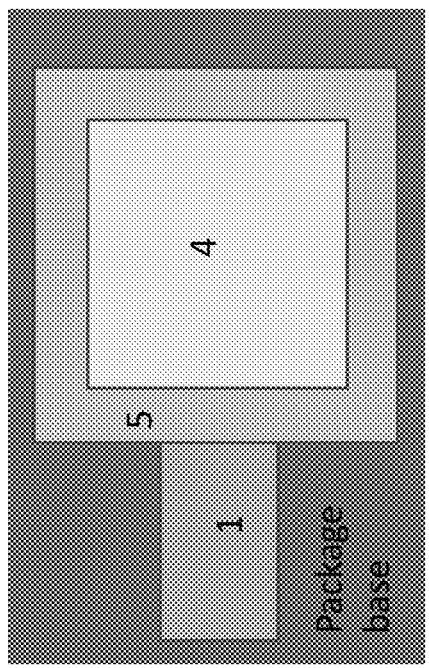

FIGS. 59A-59B are simplified cross-sectional and plan views of a laser-based light source according to some embodiments of the present invention. In the illustrated embodiment, an element 2b is included. The element 2b may be a reflective element. The laser diode 1 injects light into a cavity between the material 2, the element 2b, and the optical element 4. Multiple devices are possible that inject light from different positions. Light can be injected directly from the laser diode 1 or via a light guide 1L (not shown), for example, and that may be at least partially extended into the cavity. The cavity may, for example, be formed by a groove in a top surface of the material 2 and a through hole in the reflective element 2b.

In some embodiments, the material 2 redirects a portion of the incident light in an upward direction. In addition, the reflective element 2b may also serves to redirect a portion of incident light in an upward direction. The reflective element 2b may also serve as a mechanical support for the optical element 4 and/or the reflective material 5. The reflective element 2b may also be configured to conduct heat from the optical element 4 to the package base via the material 2.

Figure 60A:
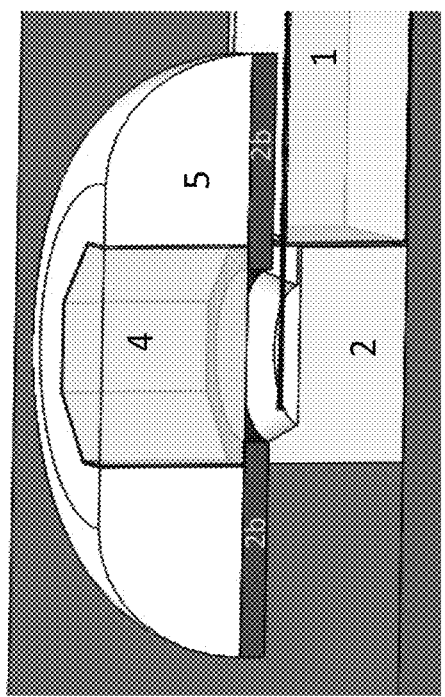
FIGS. 60A-60B are simplified cutaway views of a laser-based light source according to some embodiments of the present invention.
Figure 60B:
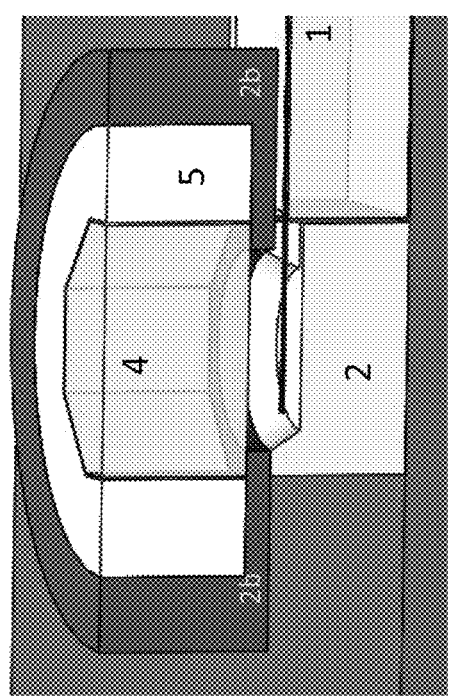

FIGS. 60A-60B are simplified cutaway views of a laser-based light source according to some embodiments of the present invention. In the illustrated embodiments, different shaped elements 2b are shown. In some embodiments, the element 2b can be formed by, for example, wafer fabrication techniques, including photolithography, etching, and deposition; photo chemical etching, including the use of different mask designs on top and bottom ("half etching"); or a stamping/pressing or other shaping of sheet metal. Materials for the reflective elements 2b may include, for example, Si, Ge, sapphire, SiC, glass, and various metals. In some embodiments, the materials have reflective coatings.

In the example of FIGS. 60A-60B, cutaway cross-sectional views are illustrated showing a relative spatial arrangement of the various elements of the embodiment including the element 2b. In the example of FIG. 60A, the element 2b has a relatively flat shape with a through hole for the light to pass. In the example of FIG. 60B, the element 2b also extends around sides of the reflective material 5.

Figure 61C:
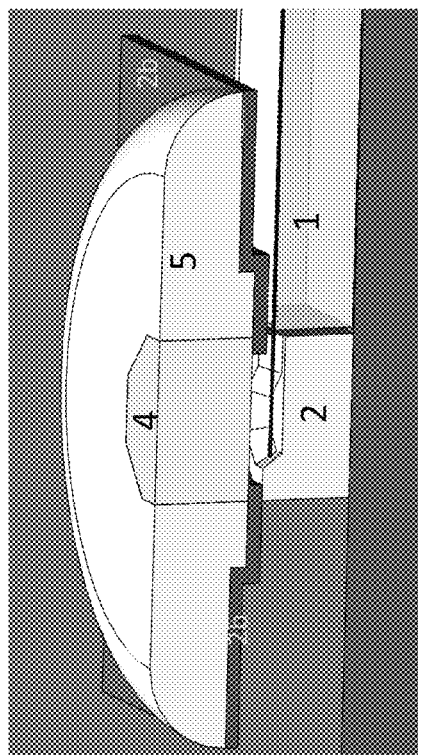
FIGS. 61A-61C are simplified cross-sectional, perspective, and cutaway views of a laser-based light source according to some embodiments of the present invention.
Figure 61A:
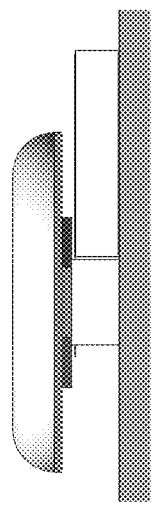
Figure 61B:
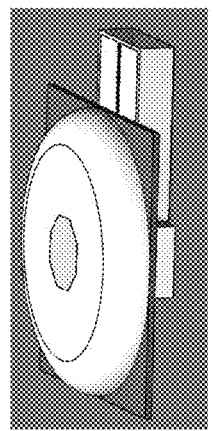

FIGS. 61A-61C are simplified cross-sectional, perspective, and cutaway cross-sectional views of a laser-based light source according to some embodiments of the present invention. In the illustrated embodiments, another element 2b is shown. As illustrated in FIG. 61C, the element 2b has a step feature providing clearance between the element 2b and a top surface of the laser diode 1. In some embodiments, the clearance may be used, for example, for wire bonds on the top surface of the laser diode 1.

Figure 62A:
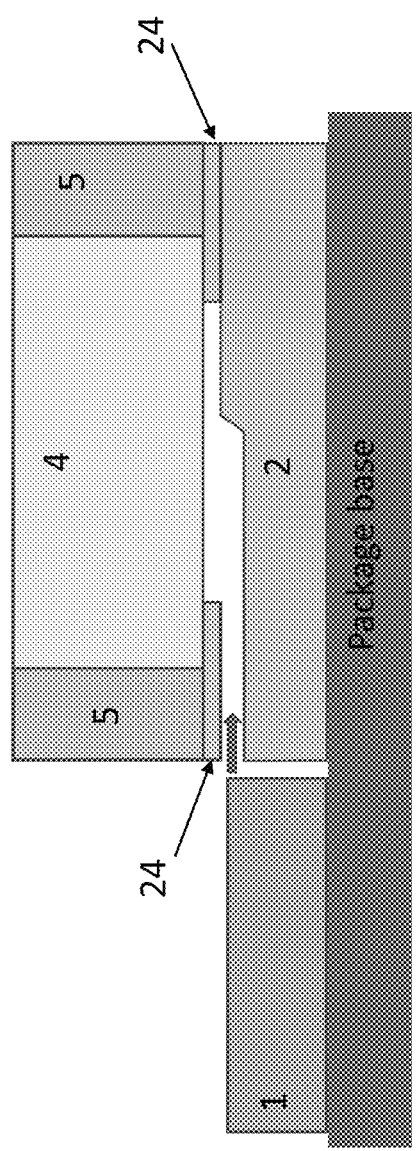
FIGS. 62A-62B are simplified cross-sectional and plan views of a laser-based light source according to some embodiments of the present invention.
Figure 62B:
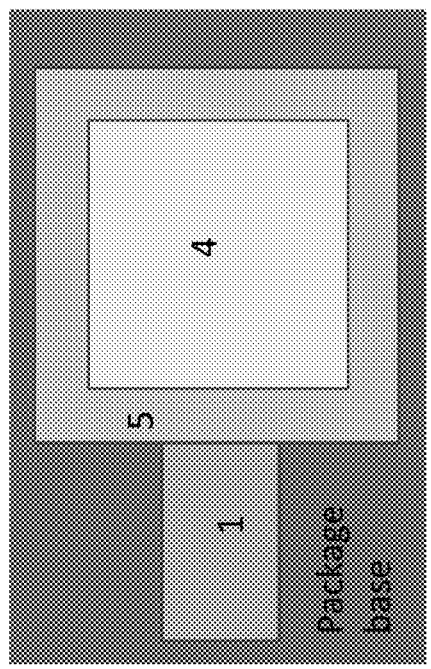

FIGS. 62A-62B are simplified cross-sectional and plan views of a laser-based light source according to some embodiments of the present invention. In the illustrated embodiment, an element 24 is included. The laser diode 1 injects light into a cavity between the material 2, the element 24, and the optical element 4. Multiple devices are possible that inject light from different positions. Light can be injected directly from the laser diode 1 or via a light guide 1L (not shown) that may, for example, be at least partially located in the cavity. The cavity between the material 2, the element 24, and the optical element 4 may, for example, be formed by a groove in a top surface of the material 2. The element 24 may be an element or material that redirects a portion of incident light in an upward direction and may be formed as a topological feature of material 2. In some embodiments, the element 24 is distinct from material 2.

In some embodiments, the material 2 includes a step feature to redirect a portion of incident light in an upward direction, and the element 24 also serves to redirect a portion of incident light in an upward direction.

FIGS. 63A-63D are simplified perspective and cutaway views of laser-based light sources and components according to some embodiments of the present invention. In the illustrated embodiments, the material 2 is shown having a groove or cavity and a through hole. An element 24 may also be included on top of the material 2. The element 24 may couple the material 2 to the optical element 4. In some embodiments, the groove is formed within the material 2. Light from the laser diodes 1 is injected into the groove. The inside walls of the groove, including the top and bottom, may have a high reflectance coating applied to minimize absorption losses. In some embodiments, the material 2 may comprise a bottom piece with a groove and an element 24 that are joined to form the groove.

Figure 63B:
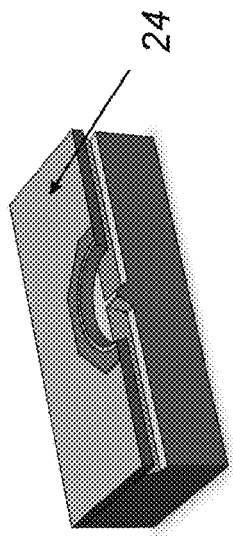
FIGS. 63A-63D are simplified perspective and cutaway views of laser-based light sources and components according to some embodiments of the present invention.
Figure 63D:
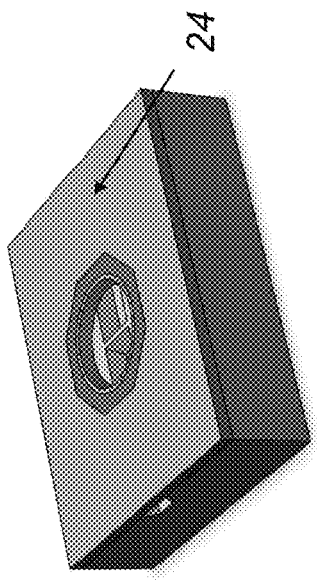
Figure 63A:
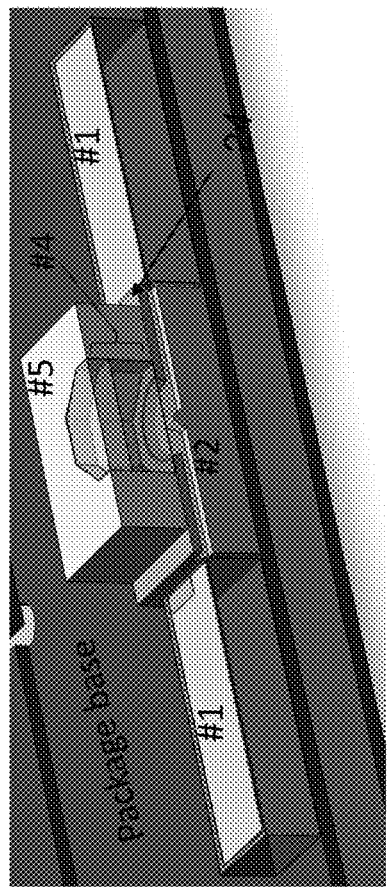
Figure 63C:
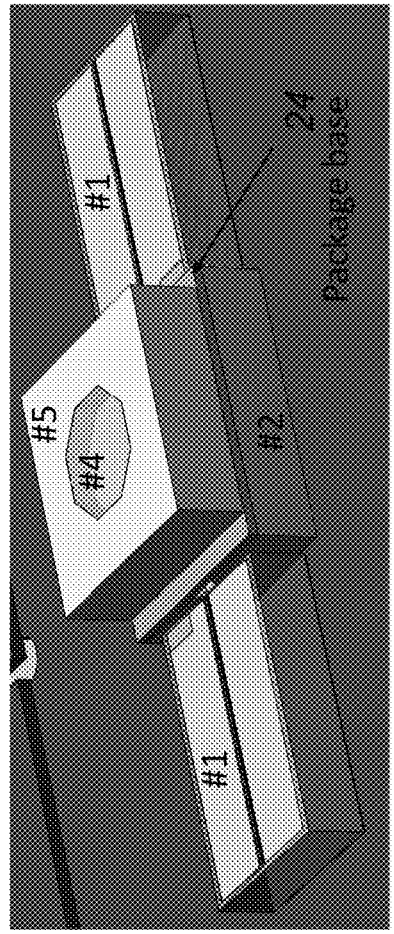

FIGS. 63A and 63C are simplified perspective and cutaway views of a laser-based light source according to some embodiments of the present invention. In the illustrated embodiment, the optical element 4 and the reflective material 5 are arranged on top of the element 24 and the material 2. Laser diodes 1 are arranged on each side so that light is injected into each end of a groove. The material 2 includes a step feature within the groove to redirect a portion of incident light in an upward direction. These figures show how light emitted from the laser diodes 1 can be directed upward through a hole in the element 24 and into the optical element 4.

In the example of FIG. 63B, a cutaway view is illustrated showing a relative spatial arrangement of the various elements of the embodiment. In this example, a step or ramp-shaped feature is included in the groove to facilitate directing light upward through the hole and into the optical element 4.

In the example of FIG. 63D, a perspective view is illustrated showing a relative spatial arrangement of the various elements of the embodiment including how a top surface of the element 24 forms a base or support for the optical element 4 (not shown).

Figure 64A:
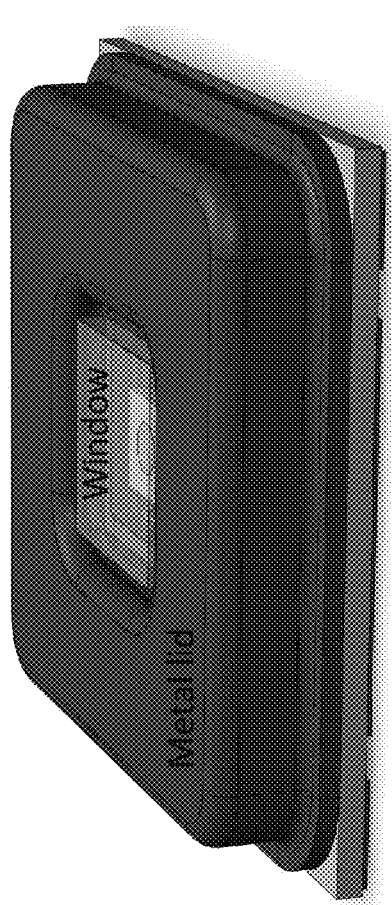
FIGS. 64A-64B are simplified perspective and cutaway views of a laser-based light source according to some embodiments of the present invention.
Figure 64B:
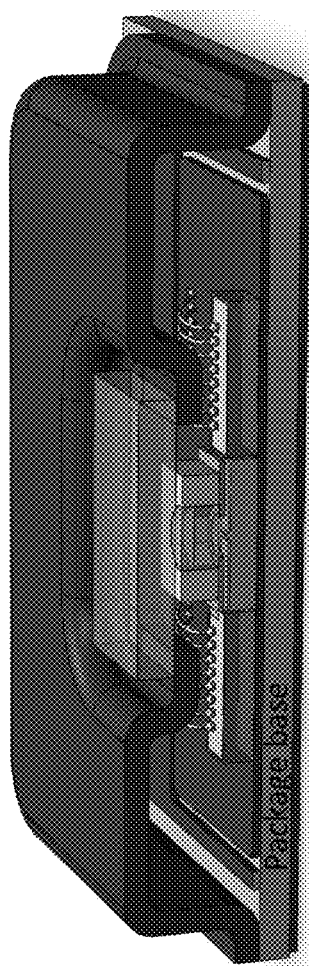

FIGS. 64A-64B are simplified perspective and cutaway views of a laser-based light source according to some embodiments of the present invention. In the illustrated embodiment, a packaging configuration is illustrated. The package structure houses a laser-based light source according to some embodiments of the present invention, and the package structure includes a lid and a window. The lid may be metal, ceramic, plastic, or another material, and the window may be a transparent material. In this example the lid is square-shaped (square-shaped can include a rectangular shape) with rounded corners and a ridge around a bottom. Other shapes may be used in accordance with embodiments described herein. In some embodiments, a seal between the window and the lid is formed with, for example, a glass frit, brazing material, solder, epoxy, or another seal material. A seal between lid and package base may, for example, be formed with projection welding, glass frit, brazing material, solder, epoxy, or another method.

In some embodiments, the window comprises glass or other transparent material. The shape of the window may be flat or include topological features such as a curve. The window may include a lens, for example, which may be flat or have topology such as a laterally varying thickness. The window may have an optical coating applied to one or both sides, for example an anti-reflection coating or a wavelength filter. Furthermore, in some embodiments, the window may have diffractive or scattering features formed on one or both sides or in the bulk.

In the example of FIG. 64A, a perspective view is illustrated showing a relative spatial arrangement of the various elements of the embodiment, and in the example of FIG. 64B, a cutaway view is illustrated showing a relative spatial arrangement of the various elements of the embodiment including an exemplary laser-based light source as described herein. Other laser-based light sources may be used with the package.

Figures 65A, 65B:
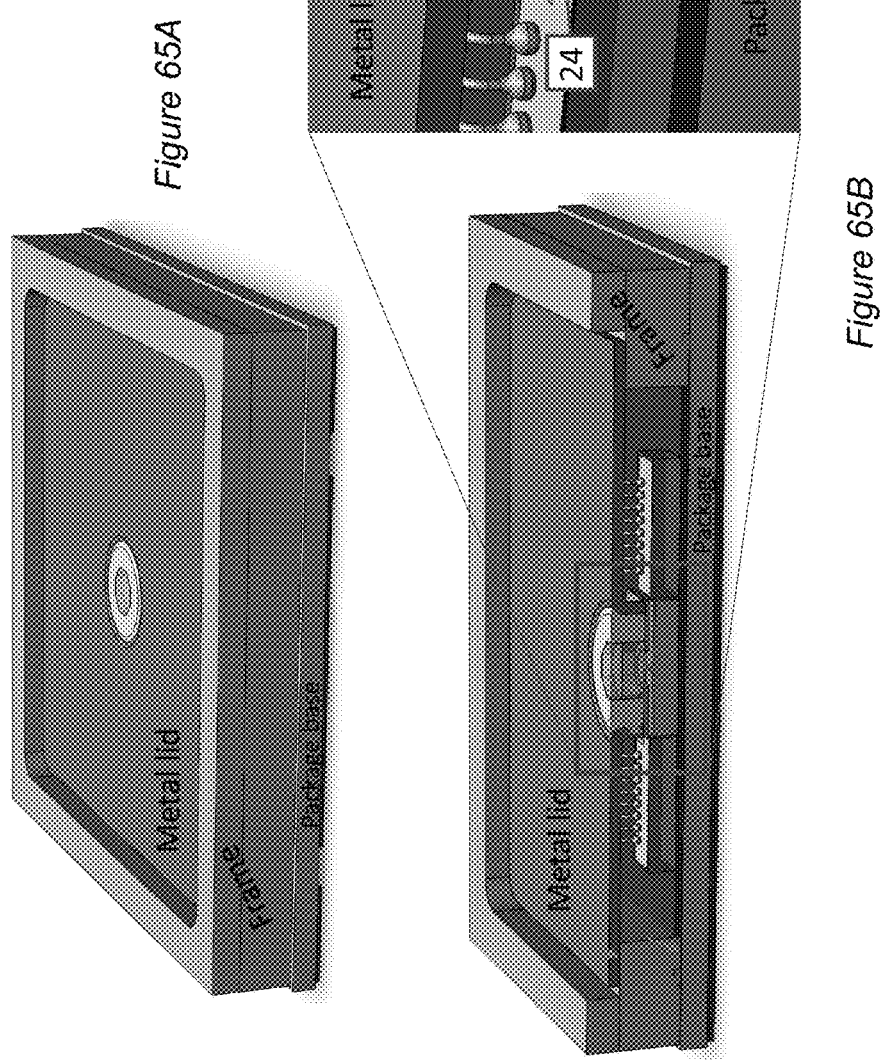
FIGS. 65A-65B are simplified perspective and cutaway views of a laser-based light source according to some embodiments of the present invention.

FIGS. 65A-65B are simplified perspective and cutaway views of a laser-based light source according to some embodiments of the present invention. In the illustrated embodiment, a packaging configuration is illustrated. The package structure houses a laser-based light source according to some embodiments of the present invention, and the package structure includes a lid with an opening. Accordingly, in this embodiment, a top surface of the optical element 4 may be exposed through the opening. A portion of the reflective material 5 may also be exposed through the opening. The lid may be metal, ceramic, plastic, or another material. Seals between the lid and the element 24, between the element 24 and the optical element 4, between the lid and the frame, and between the frame and the package base may, for example, be formed with glass frit, brazing material, solder, epoxy, or another material. In some embodiments, the lid may include the frame in a single piece.

In the example of FIG. 65A, a perspective view is illustrated showing a relative spatial arrangement of the various elements of the embodiment, and in the example of FIG. 65B, a cutaway view is illustrated showing a relative spatial arrangement of the various elements of the embodiment including an exemplary laser-based light source as described herein. An enlarged view of a portion of the laser-based light source is included showing the material 2, the element 24, the optical element 4, and the reflective material 5. Other laser-based light sources may be used with the package.

Figure 66B:
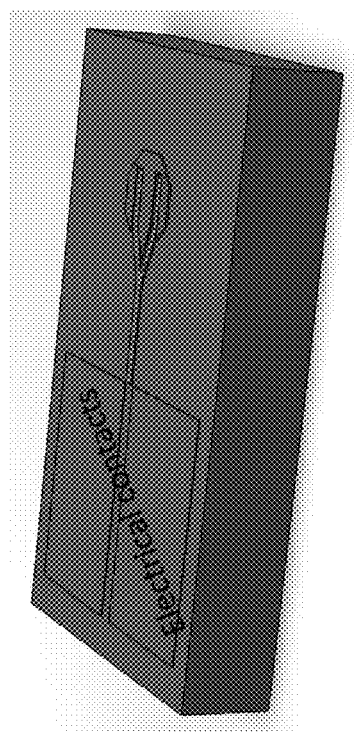
FIGS. 66A-66C are simplified perspective views of a laser-based light source and various component structures according to some embodiments of the present invention.
Figure 66C:
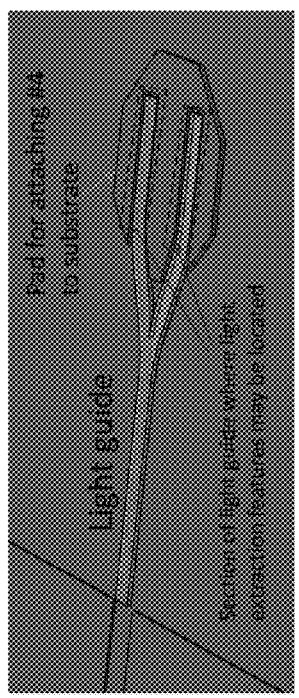
Figure 66A:
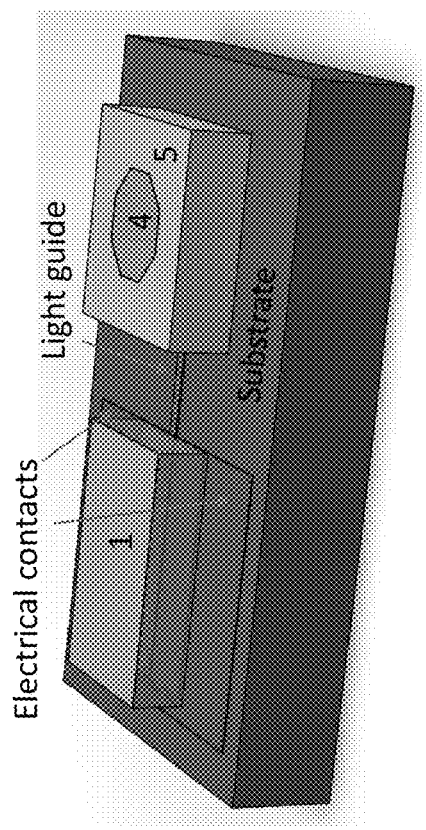

FIGS. 66A-66C are simplified perspective views of a laser-based light source and various component structures according to some embodiments of the present invention. In the illustrated embodiments, a light guide is formed in or on a substrate or package base. The light source 1 is mounted on the substrate with an emission aperture, for example, at or near the substrate, and the light source 1 injects light into the light guide. The light guide may be routed underneath the optical element 4 and the reflective material 5, and the light guide may have features in this area that extract light upward and inject the light through the bottom surface of optical element 4. In some embodiments, the light guide may be formed, for example, by thin film deposition techniques or by sol gel processes.

In the example of FIG. 66A, a perspective view is illustrated showing a relative spatial arrangement of the various elements of the embodiment. In the examples of FIGS. 66B-66C, perspective views are illustrated showing a relative spatial arrangement of the various elements of the substrate and the light guide without the laser diode 1, the optical element 4, and the reflective material 5. In the example of FIG. 66C, a close up perspective view is illustrated showing pads that may be included on the substrate for attaching the optical element 4. The light guide may be split into multiple portions to increase and/or improve uniformity of light extraction into the optical element 4.

Figure 67B:
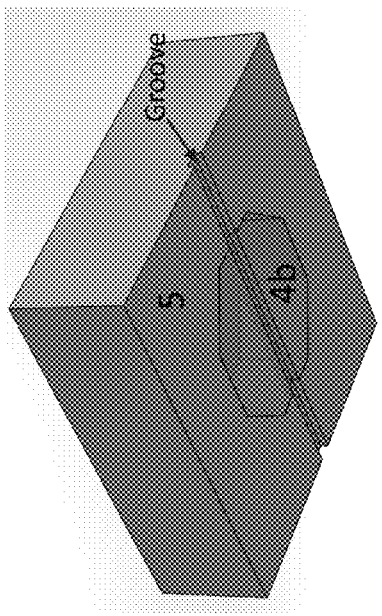
FIGS. 67A-67C are simplified perspective views of a laser-based light source and various component structures according to some embodiments of the present invention.
Figure 67C:
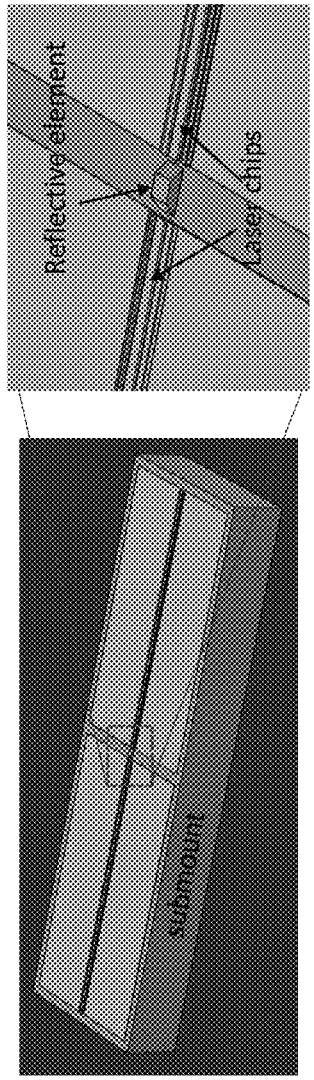
Figure 67A:
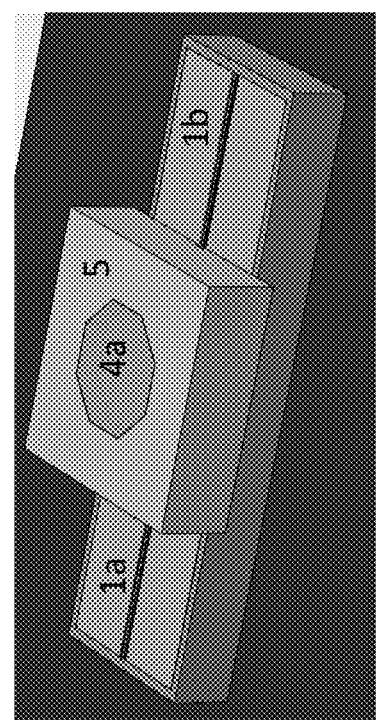

FIGS. 67A-67C are simplified perspective views of a laser-based light source and various component structures according to some embodiments of the present invention. In the illustrated embodiment, the optical element 4 is positioned above the light source in the arrangement of the figures. The light source may, for example, have two laser diodes or chips 1*a* and 1*b* mounted on a single submount. A groove in a bottom side of an optical element 4 or an optically transparent heat conductor 4*b* and reflective material 5 aligns with the laser chips 1*a* and 1*b* and a reflective element providing clearance when assembled. A top surface of the submount corresponding to the bottom surface of optically transparent heat conductor 4b may have a reflective coating to direct light upward towards the optical element 4. In some embodiments, only one laser chip or more than two laser chips are mounted on the submount and the reflective element redirects the emitted light of all chips towards the optical element 4.

In the example of FIG. 67A, a perspective view is illustrated showing a relative spatial arrangement of the various elements of the embodiment. In the example of FIG. 67B, a perspective view of a bottom portion of the optically transparent heat conductor 4b and the reflective material 5 is illustrated showing a relative spatial arrangement of the various elements of the embodiment including the groove. In the example of FIG. 67C, a perspective view of the submount is illustrated with the optical element 4 and the reflective material 5 removed to show a relative spatial arrangement of the various elements of the embodiment including the reflective element.

As discussed elsewhere herein, material 2 may be configured to redirect a portion of incident light from a light source 1 to an optical element 4. There are other elements that can also redirect the light. For example, in some embodiments, a light guide 1L present in the structure can direct at least a portion of the light from the laser diode 1 to the optical element 4. In some embodiments, a cavity is present in the structure between the material 2 and the optical element 4, and the shape of the cavity and the interface between the cavity and optical element 4 can additionally or alternative direct a portion of the light from light source 1 in an upward direction to optical element 4. In some embodiments, the optical element 4 has an interface between a wavelength conversion material 4a and an optically transparent heat conductor 4b, and the interface can be configured to redirect light within the optical element 4.

FIGS. 68-74 are simplified perspective views of examples of the material 2 for laser-based light sources according to some embodiments of the present invention. The illustrated embodiments show examples that accomplish the redirection of light and may be used to generate a more uniform irradiation of the bottom portion of optical element 4. In some embodiments, by redirecting a portion of light from the light source 1 into the optical element 4 at high angles from normal, the irradiance of non-wavelength converted light will be more uniform across the lateral cross section of the optical element 4. This can result in an increased spatial color uniformity of light exiting the top surface of the optical element 4.

Figure 68B:
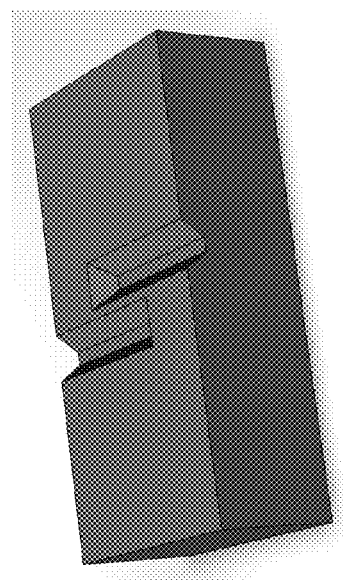
FIGS. 68A-68C are simplified perspective views of components for laser-based light sources according to some embodiments of the present invention.
Figure 68C:
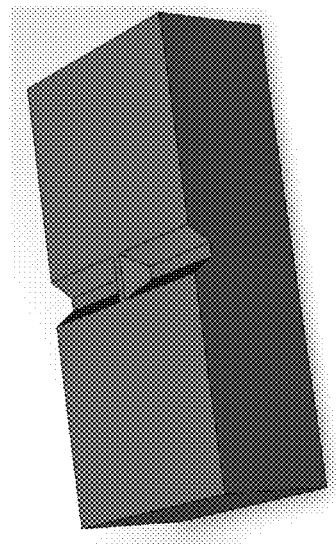
Figure 68A:
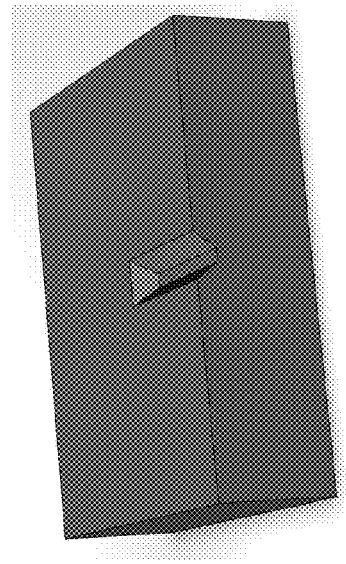

FIGS. 68A-68C are simplified perspective views of examples of material 2 for laser-based light sources according to some embodiments of the present invention. The illustrated embodiments have grooves which advantageously redirect light from light source 1 to optical element 4 with high uniformity. The grooves of the illustrated embodiments have rectangular pattern layouts, which are formed by standard crystallographic etching techniques, for example, used for etching silicon substrates. The illustrated embodiments provide non-limiting examples. Other groove arrangements are contemplated. In some embodiments, the surfaces of the grooves are smooth. In some embodiments, the surfaces of the grooves have scattering and/or diffractive features. In some embodiments, the surfaces of the grooves have or incorporate photonic crystal structures. In some embodiments, the scattering and/or diffractive features are formed in the underlying material with a reflective thin film coating on top. In some embodiments, the scattering and/or diffractive features are formed on top of smooth surfaces coated with a reflective coating, where further coating is formed on top with desired features. For example, in some embodiments, a coating of high refractive index particles in a low refractive index binder is used. In some embodiments, a dielectric layer with features etched into its surface is used.

In the example of FIG. 68A, the material 2 includes a single groove to facilitate directing the light into the optical element 4. The example of FIG. 68B is similar except the material 2 includes multiple grooves that are offset. A separate laser diode 1 may be aligned with each groove. The example of FIG. 68C is similar except the grooves are aligned. The grooves in these examples may be rectangular shaped which may, for example, lend itself well to formation by crystallographic etching of silicon.

Figure 69B:
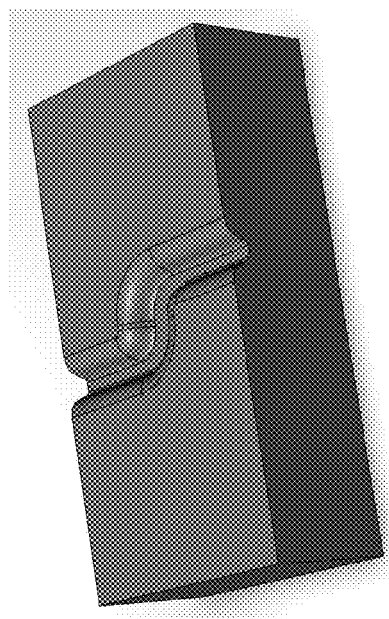
FIGS. 69A-69C are simplified perspective views of components for laser-based light sources according to some embodiments of the present invention.
Figure 69C:
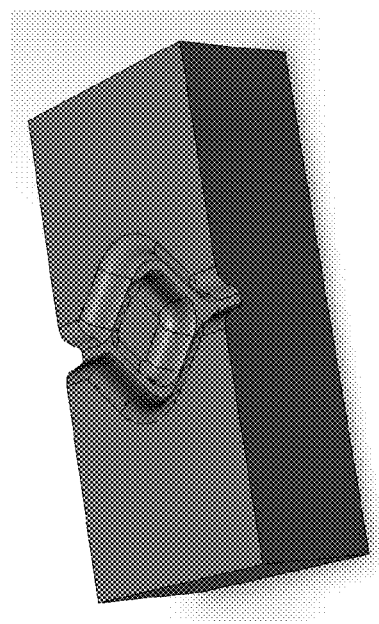
Figure 69A:
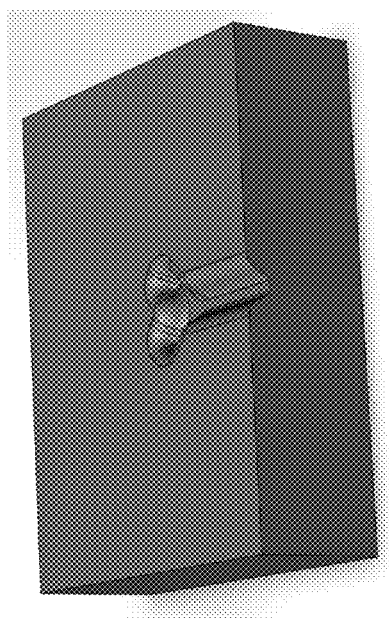

FIGS. 69A-69C are simplified perspective views of examples of the material 2 for laser-based light sources according to some embodiments of the present invention. The illustrated embodiments have grooves which advantageously redirect light from one or more light sources 1 to the optical element 4 with high uniformity. The grooves of the illustrated embodiments have layouts with curved sections. The curved sections can spread reflected light in a broader range of angles compared to sidewalls consisting of flat planes. The illustrated embodiments provide non-limiting examples. Other groove arrangements are contemplated. In some embodiments, the surfaces of the grooves are smooth. In other embodiments, the surfaces of the grooves have scattering and/or diffractive features. In some embodiments, the surfaces of the grooves have or incorporate photonic crystal structures. In some embodiments, the scattering and/or diffractive features are formed in the underlying material with a reflective thin film coating on top. In some embodiments, the scattering and/or diffractive features are formed on smooth surfaces and may be coated with a reflective coating and/or a coating with other desired features. For example, in some embodiments, a coating of high refractive index particles in a low refractive index binder may be used. In some embodiments, a dielectric layer with features etched into its surface may be used. The grooves may include cavities as shown in the example of FIG. 69A.

Figure 70:
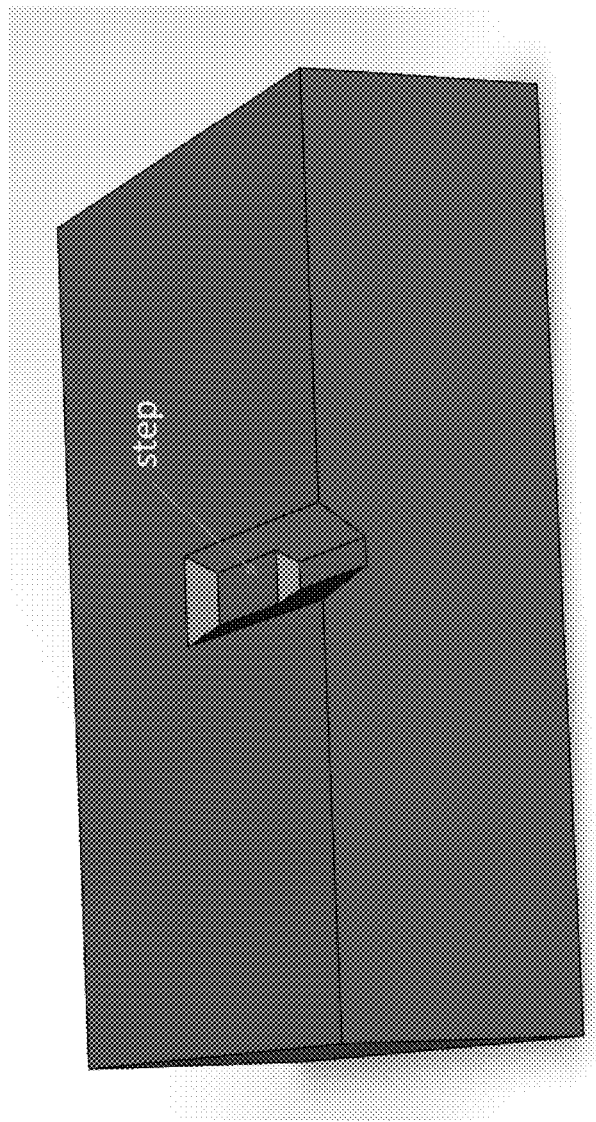
FIG. 70 is a simplified perspective views of a component for a laser-based light source according to an embodiment of the present invention.

FIG. 70 is a simplified perspective view of an example of the material 2 for laser-based light sources according to some embodiments of the present invention. The illustrated embodiment has a groove which advantageously redirects light from light source 1 to optical element 4 with high uniformity. The illustrated groove has a step. The step may be formed, for example, by performing two or more etch processes with different mask layouts. The illustrated embodiment provides a non-limiting example. Other groove arrangements are contemplated. For example, in some embodiments, one or more grooves may have more than one step. Additional grooves may be included for use with multiple light source embodiments.

Figure 71A:
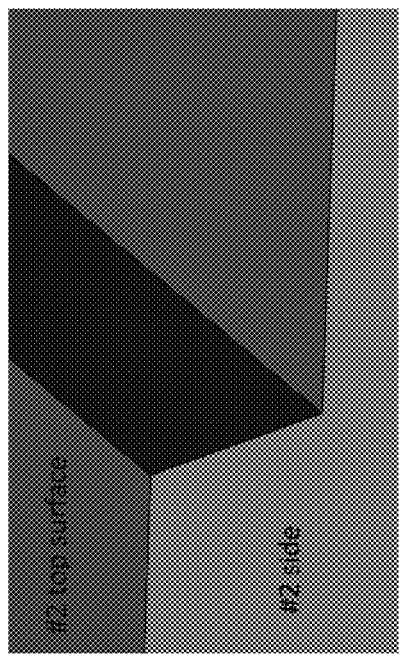
FIGS. 71A-71B are simplified perspective views of parts of components for laser-based light sources according to some embodiments of the present invention.
Figure 71B:
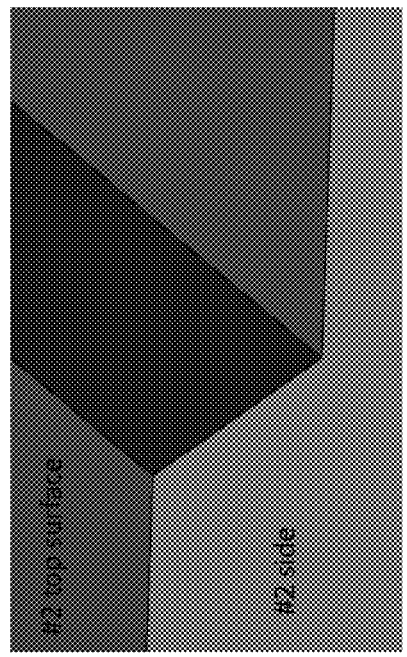

FIGS. 71A-71B are simplified perspective views of groove sidewall profiles in the material 2 according to some embodiments of the present invention. As illustrated, in some embodiments, the groove sidewall profile is straight with a slope. The slope can be any slope that allows for the desired improved uniformity of light injected into optical element 4, which can result in improved color uniformity of light exiting the top surface of optical element 4.

Figure 72A:
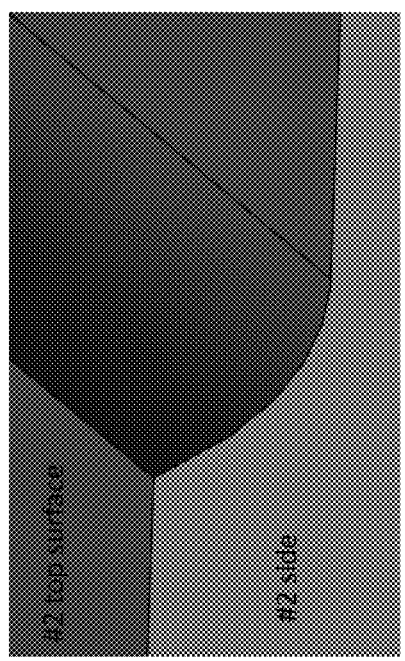
FIGS. 72A-72B are simplified perspective views of parts of components for laser-based light sources according to some embodiments of the present invention.
Figure 72B:
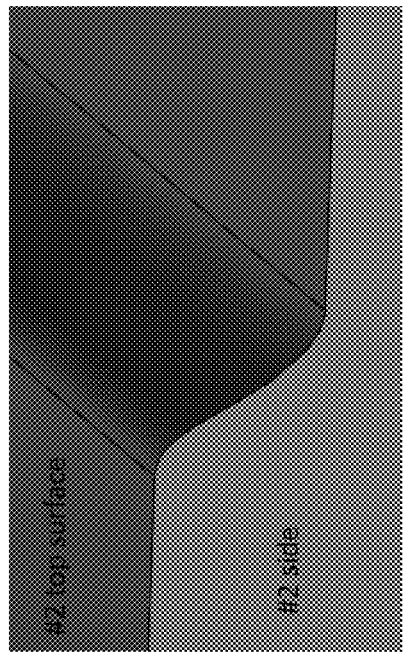

FIGS. 72A-72B are simplified perspective views of groove sidewall profiles in the material 2 according to some embodiments of the present invention. As illustrated, in some embodiments, the groove sidewall profile is curved. The curvature can be a variety of profiled sufficient to spread reflected light in a broader range of angles compared to straight sidewalls. Accordingly, the curved sections may contribute to improved uniformity of light injected into optical element 4, which can result in improved color uniformity of light exiting the top surface of optical element 4. While these examples show the grooves formed in a top surface of the material 2, alternative embodiments may include similar grooves formed in a bottom surface of the optical element 4.

Figure 73:
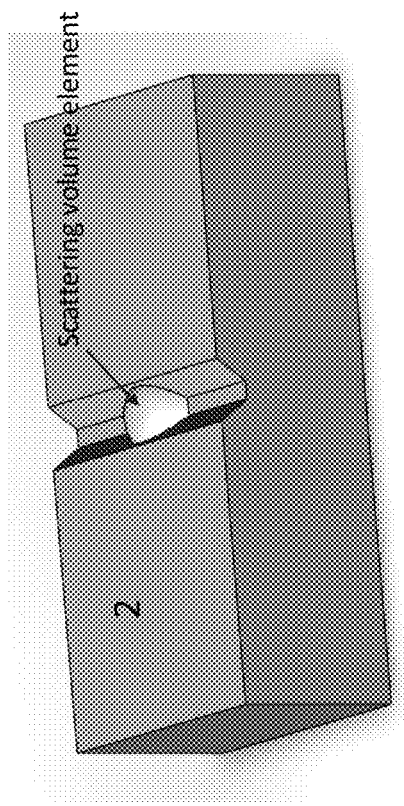
FIG. 73 is a simplified perspective views of a component for a laser-based light source according to an embodiment of the present invention.

FIG. 73 is a simplified perspective view of an example of the material 2 for laser-based light sources according to some embodiments of the present invention. The illustrated embodiment has a groove which may advantageously redirect light from light source 1 to optical element 4 with high uniformity. The groove of the illustrated embodiment has a scattering volume element. The scattering volume element is configured to scatter incident light from the laser diode 1 into the optical element 4. In some embodiments, the scattering volume element comprises high refractive index particles in a low refractive index binder. In some embodiments, the low refractive index binder may have the high refractive index particles. The scattering volume element may be formed by applying (e.g. dispensing) a substance in liquid or paste form that may be subsequently cured to form a solid. In some embodiments, the scattering volume element is additionally or alternatively formed in a groove on a bottom surface of optical element 4.

Figure 74B:
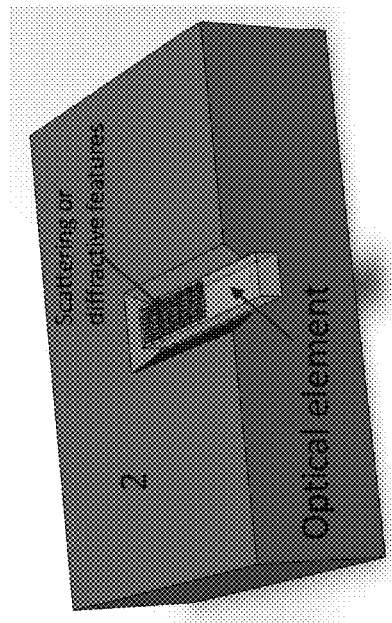
FIGS. 74A-74B are simplified perspective views of parts of components for laser-based light sources according to some embodiments of the present invention.
Figure 74A:
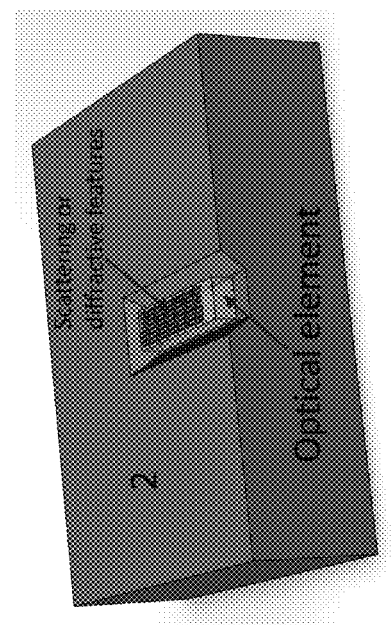

FIGS. 74A-74B are simplified perspective views of an example of the material 2 for laser-based light sources according to some embodiments of the present invention. The illustrated embodiments have grooves which may advantageously redirect light from the light source 1 to the optical element 4 with high uniformity. The grooves of the illustrated embodiments have a transparent or translucent optical element in the grooves. One or more surfaces of the transparent or translucent optical element may have scattering features, diffractive features, or photonic crystal structures. In some embodiments, the transparent or translucent optical element is attached to the groove as shown. In some embodiments, a transparent or translucent optical element is additionally or alternatively attached to the bottom surface of optical element 4 or inside a groove formed on the bottom surface of optical element 4. In some embodiments, the optical element can also act as a light guide 1L for light injected from light source 1 into the cavity between material 2 and optical element 4.

In the example of FIG. 74A, the optical element does not extend outside the groove. In the example of FIG. 74B, the optical element extends outside the groove. Extending outside the groove may, for example, be advantageous if the optical element is used as a light guide 1L.

Figure 75:
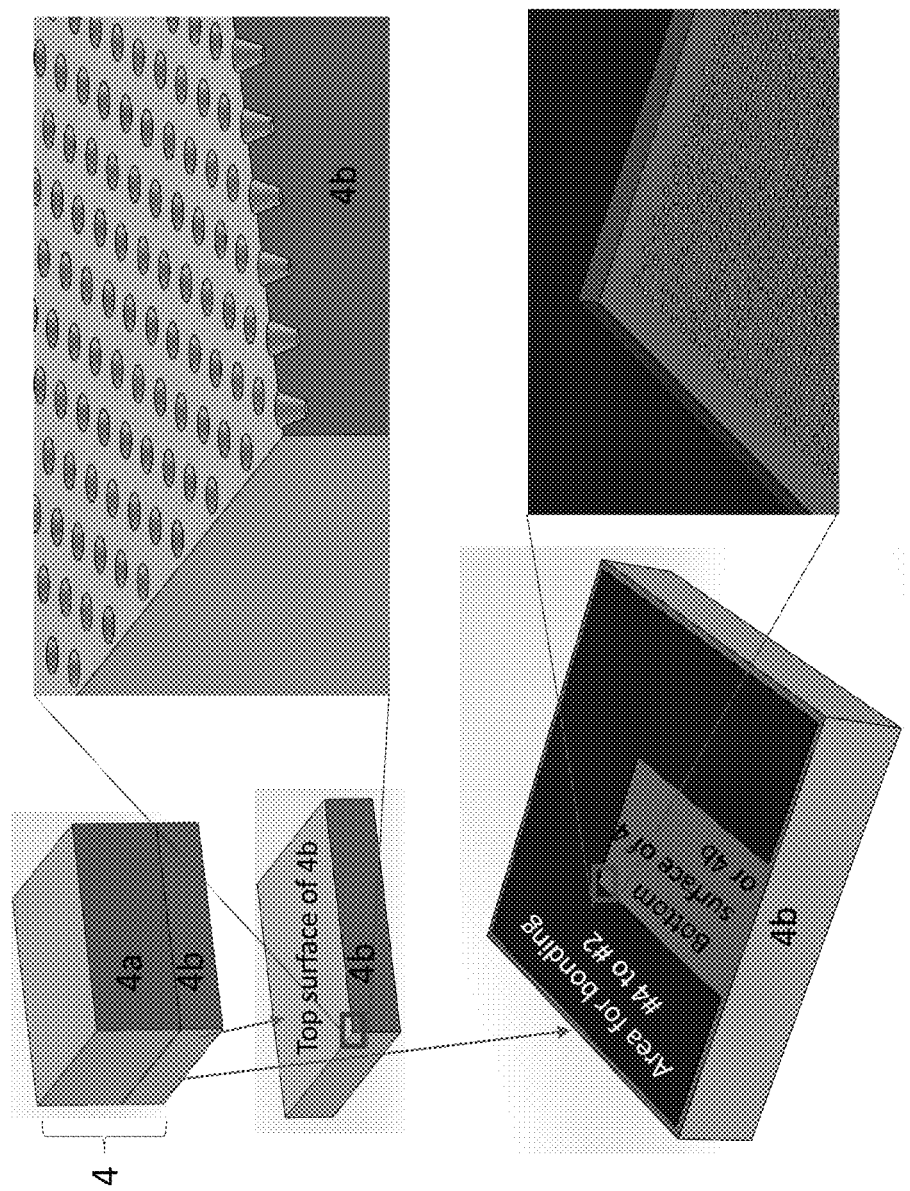
FIG. 75 includes simplified perspective and exploded views of components for a laser-based light source according to an embodiment of the present invention.

FIG. 75 includes simplified perspective and exploded views of components for a laser-based light source according to an embodiment of the present invention. In the illustrated embodiments, example diffractive or scattering features are illustrated. These features may be used to increase color uniformity of light exiting a top surface of the optical element 4. In some embodiments, the top surface of optically transparent heat conductor 4b may include scattering features, diffractive features, or photonic crystal structures, for example, as illustrated. The features may include air voids or may be fully or partially filled with a material with a different refractive index from that of one or more of the optically transparent heat conductor 4b and the wavelength conversion material 4a.

In some embodiments, the scattering features, diffractive features, or photonic crystal structures may be formed at an interface between the wavelength conversion material 4a and the optically transparent heat conductor 4b. In some embodiments, scattering features, diffractive features, or photonic crystal structures are additionally or alternatively formed in a bottom surface of the wavelength conversion material 4a and/or in the bottom surface of the optically transparent heat conductor 4b. In some embodiments, scattering features, diffractive features, or photonic crystal structures are additionally or alternatively formed in the bottom surface of the optical element 4. The scattering features, diffractive features, or photonic crystal structures formed in the bottom surface of said elements may cover the entire bottom surface or parts of the bottom surface. For example, the features may cover parts of the bottom surface where light from the one or more laser diodes 1 enters the optical element 4. In some embodiments, scattering features, diffractive features, or photonic crystal structures are additionally or alternatively formed in a top surface of the optical element 4, the wavelength conversion material 4a, the optically transparent heat conductor 4b, and/or the optical homogenizer 4c. Scattering features may also be formed inside the optical element 4 (including the wavelength conversion material 4a, the transparent heat conductor 4b, and/or the optical homogenizer 4c when present). The features may be dispersed throughout the optical element 4, or they can be concentrated in specific layers within the optical element 4. For example, scattering features can be formed in volumes close to the top and/or bottom of the optical element 4 or the top and/or bottom of various regions of the optical element 4.

Many shapes, sizes, geometric features, and spacing distances may be used for the scattering features, diffractive features, or photonic crystal structures, and the shapes and sizes and geometric features are not limited. In some embodiments, size and spacing of the scattering features, diffractive features, or photonic crystal structures are near visible light wavelengths, e.g. 50-1000 nm.

In some embodiments, the pattern of the scattering features, diffractive features, or photonic crystal structures is regular as shown in the example of FIG. 75. In some embodiments, the scattering features, diffractive features, or photonic crystal structures are defined by holography, traditional photolithography, nanoimprint lithography, or similar processes. In some embodiments, the pattern of the scattering features, diffractive features, or photonic crystal structures is irregular or is random. In some embodiments, the features are defined, for example, by nanosphere lithography. In some embodiments, the distribution pattern of the scattering features, diffractive features, or photonic crystal structures is a result of roughness caused, for example, by a mechanical process or a chemical etching process. In some embodiments, a lithographically defined mask is not used.

Is should be appreciated that the number of laser diodes or chips used with each of the embodiments described herein is not limited. For example, any of the embodiments may be used with single or multiple laser diode 1 configurations as shown in the examples of FIG. 39A-39B or 63A-64D. Further, in some embodiments, the one or more laser diodes 1 may emit in the blue wavelength range, in the violet wavelength range, in the infrared (IR) wavelength range, or in combinations thereof including different IR wavelengths. For example, some embodiments may include one or more laser diodes emitting in a blue wavelength range, one or more laser diodes emitting in a first IR wavelength range (e.g., 850 nm), and one or more laser diodes emitting in a first IR wavelength range (e.g., 905 nm). Other embodiments may include other various combinations of laser diodes in blue, violet, and IR wavelengths (e.g., the IR wavelengths may be 850 nm, 905 nm, 940 nm, 1300 nm, 1550 nm or others).

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

What is claimed is:

1. A laser-based light source, comprising:
    a package base;
    a laser diode chip coupled to the package base, the laser diode chip configured to output a laser beam of electromagnetic radiation from an output facet; the laser diode chip configured to emit the electromagnetic radiation at a first wavelength;
    a material element coupled to the package base and arranged on the package base adjacent to the laser diode chip, the material element having a reflective surface;
    an optical element coupled directly to a top surface of the material element, wherein;
    a groove extends between a portion of the material element and a portion of the optical element from a side of the material element, a side of the optical element, or both,
    the groove is aligned with the laser diode chip to receive the electromagnetic radiation from the laser diode chip, and
    the reflective surface of the material element is arranged to reflect light from the laser diode chip upward;
    and the material element configured to direct at least a portion of the electromagnetic radiation in the groove into the optical element, the optical element including a wavelength conversion material configured to convert at least a fraction of the electromagnetic radiation in the laser beam with the first wavelength to a second wavelength that is longer than the first wavelength; and
    a reflective material layer surrounding sides of the optical element, the reflective material layer configured to reflect portions of the electromagnetic radiation incident on the sides of the optical element, wherein the optical element is configured to emit a light from a top surface, the light including a first portion having the first wavelength and a second portion having the second wavelength.

2. The laser-based light source of claim 1, further comprising one or more additional laser diode chips and one or more additional grooves, each of the one or more additional laser diode chips aligned with one of the additional grooves, wherein the one or more additional laser diode chips are configured to emit electromagnetic radiation at the first wavelength.

3. The laser-based light source of claim 1, further comprising one or more additional laser diode chips and one or more additional grooves, each of the one or more additional laser diode chips aligned with one of the additional grooves, wherein at least one of the one or more additional laser diode chips is configured to emit electromagnetic radiation at a wavelength different from the first wavelength.

4. The laser-based light source of claim 1, wherein the groove is formed in a top of the material element and extends from a side surface of the material element, the groove reflecting a least a portion of the electromagnetic radiation in an upward direction toward the optical element.

5. The laser-based light source of claim 1, wherein the material element is thermally conductive and includes silicon (Si), silicon carbide (SiC), germanium (Ge), gallium arsenide (GaAs), sapphire, ceramic aluminum nitride (AlN), ceramic aluminum oxide ($Al_2O_3$, ceramic boron nitride (BN), aluminum (Al), or copper (Cu), and the reflective surface includes a reflective coating on the material element.

6. The laser-based light source of claim 1, wherein the wavelength conversion material is dispersed throughout the optical element.

7. The laser-based light source of claim 1, wherein an upper portion of the optical element includes an optical homogenizer configured to improve color uniformity of the light emitted from the top surface of the optical element.

8. The laser-based light source of claim 1, wherein at least one of sides, a top, or a bottom of the groove are covered with a reflective coating.

9. The laser-based light source of claim 1, wherein a gap extends between at least some sides of the optical element and the reflective material layer.

10. The laser-based light source of claim 1, further comprising a scattering material in the groove, the scattering material in the groove configured to scatter at least a portion of the electromagnetic radiation from the laser diode chip into the optical element.

11. The laser-based light source of claim 1, wherein the groove includes sidewalls having flat planes or sidewalls having curved sections.

12. The laser-based light source of claim 1, wherein the reflective material layer includes a reflective coating on inside walls of the reflective material layer.

13. The laser-based light source of claim 1, wherein the optical element includes at least one of scattering features, diffractive features, or photonic crystal structures configured to provide color uniformity of the light emitted from the top surface of the optical element.

14. A surface mount device (SMD) comprising the laser-based light source of claim 1.

15. A laser-based light source, comprising:
    a package base;
    a laser diode chip coupled to the package base, the laser diode chip configured to output a laser beam of electromagnetic radiation from an output facet; the laser diode chip configured to emit the electromagnetic radiation at a first wavelength;
    a material element coupled to the package base and arranged on the package base adjacent to the laser diode chip, the material element having a reflective surface;
    an optical element coupled directly to a top surface of the material element, wherein a groove extends along a bottom of the optical element;
    a light guide aligned with the output facet of the laser diode chip on one end and aligned with the groove on another end, the light guide configured and arranged to guide at least a portion of the electromagnetic radiation from the laser diode chip to the groove in the optical element, wherein the optical element includes a wavelength conversion material and is configured to receive at least a portion of the electromagnetic radiation emitted into the optical element, the wavelength conversion material being configured to convert at least a fraction of the electromagnetic radiation in the laser beam with the first wavelength to a second wavelength that is longer than the first wavelength; and a reflective material layer surrounding sides of the optical element, the reflective material layer configured to reflect portions of the electromagnetic radiation incident on the sides of the optical element, wherein the optical element is configured to emit a light from a top surface, the light including a first portion having the first wavelength and a second portion having the second wavelength.

16. The laser-based light source of claim 15, the groove extending between a portion of the material element and a portion of the optical element, a second laser diode chip and a second light guide, wherein the light guide is aligned with a first end of the groove, and the second light guide is aligned with a second end of the groove, the second light guide configured and arranged to guide second electromagnetic radiation from the second laser diode chip to the groove in an optically transparent material.

17. The laser-based light source of claim 15, wherein the material element is thermally conductive and includes silicon (Si), silicon carbide (SiC), germanium (Ge), gallium arsenide (GaAs), sapphire, ceramic aluminum nitride (AlN), ceramic aluminum oxide ($Al_2O_3$, ceramic boron nitride (BN), aluminum (Al), or copper (Cu)), and the reflective surface includes a reflective coating on the material element.

18. The laser-based light source of claim 15, wherein the wavelength conversion material is dispersed throughout the optical element.

19. The laser-based light source of claim 15, wherein an upper portion of the optical element includes on optical homogenizer configured to improve color uniformity of the light emitted from the top surface of the optical element.

20. The laser-based light source of claim 15, wherein a gap extends between at least some sides of the optical element and the reflective material layer.

21. The laser-based light source of claim 15, further comprising a scattering material in the groove, the scattering material in the groove configured to scatter the electromagnetic radiation from the laser diode chip into the optical element.

22. A surface mount device (SMD) comprising the laser-based light source of claim 15.

23. The laser-based light source of claim 15, wherein the reflective material layer includes a reflective coating on inside walls of the reflective material layer.

24. The laser-based light source of claim 15, wherein the optical element includes at least one of scattering features, diffractive features, or photonic crystal structures configured to provide color uniformity of the light emitted from the top surface of the optical element.

* * * * *